US012796017B2

(12) United States Patent
Ohkawa

(10) Patent No.: US 12,796,017 B2
(45) Date of Patent: Nov. 10, 2026

(54) MANUFACTURING METHOD OF SEMICONDUCTOR DEVICE

(71) Applicant: United Semiconductor Japan Co., Ltd., Kuwana (JP)

(72) Inventor: Narumi Ohkawa, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 835 days.

(21) Appl. No.: 18/115,775

(22) Filed: Mar. 1, 2023

(65) Prior Publication Data

US 2023/0215913 A1 Jul. 6, 2023

Related U.S. Application Data

(63) Continuation of application No. 17/111,525, filed on Dec. 4, 2020, now Pat. No. 11,670,675.

(51) Int. Cl.
*H10D 62/10* (2025.01)
*H10D 30/01* (2025.01)
(Continued)

(52) U.S. Cl.
CPC ......... *H10D 62/112* (2025.01); *H10D 30/024* (2025.01); *H10D 30/62* (2025.01);
(Continued)

(58) Field of Classification Search
CPC ...................................................... H10D 30/62
See application file for complete search history.

(56) References Cited

U.S. PATENT DOCUMENTS

2002/0011612 A1 1/2002 Hieda
2002/0036290 A1 3/2002 Inaba
(Continued)

FOREIGN PATENT DOCUMENTS

CN 105938833 9/2016
CN 106653846 5/2017
(Continued)

OTHER PUBLICATIONS

European office action issued on Jun. 5, 2024 for the EP application No. 21209279.5, filing date Nov. 19, 2021, pp. 1-5.
(Continued)

*Primary Examiner* — Ali Naraghi
(74) *Attorney, Agent, or Firm* — Winston Hsu

(57) ABSTRACT

A semiconductor device includes a semiconductor substrate, a fin-shaped structure, a gate structure, a first doped region, a second doped region, and an intermediate region. The fin-shaped structure is disposed on and extends upwards from a top surface of the semiconductor substrate in a vertical direction. The gate structure is disposed straddling a part of the fin-shaped structure. At least a part of the first doped region is disposed in the fin-shaped structure. The second doped region is disposed in the fin-shaped structure and disposed above the first doped region in the vertical direction. The intermediate region is disposed in the fin-shaped structure. The second doped region is separated from the first doped region by the intermediate region, and a bottom surface of the gate structure is lower than or coplanar with a top surface of the first doped region in the vertical direction.

20 Claims, 25 Drawing Sheets

(51) Int. Cl.
*H10D 30/62* (2025.01)
*H10D 62/13* (2025.01)
*H10D 64/27* (2025.01)
*H10D 30/60* (2025.01)

(52) U.S. Cl.
CPC ......... *H10D 62/151* (2025.01); *H10D 64/518* (2025.01); *H10D 30/601* (2025.01)

(56) References Cited

U.S. PATENT DOCUMENTS

| | | | | |
|---|---|---|---|---|
| 2004/0195610 | A1 | 10/2004 | Morikado | |
| 2005/0029603 | A1 | 2/2005 | Yu | |
| 2005/0095793 | A1 | 5/2005 | Lee | |
| 2005/0161739 | A1 | 7/2005 | Anderson | |
| 2006/0063319 | A1 | 3/2006 | Ono | |
| 2006/0244106 | A1 | 11/2006 | Morikado | |
| 2007/0029624 | A1 | 2/2007 | Nowak | |
| 2007/0241399 | A1 | 10/2007 | Irisawa | |
| 2008/0296667 | A1 | 12/2008 | Mikasa | |
| 2009/0061610 | A1 | 3/2009 | Ono | |
| 2009/0134454 | A1 | 5/2009 | Takeuchi | |
| 2011/0059584 | A1 | 3/2011 | Takeuchi | |
| 2011/0079829 | A1 | 4/2011 | Lai | |
| 2012/0292715 | A1* | 11/2012 | Hong | H10D 30/024 257/E27.061 |
| 2014/0001564 | A1 | 1/2014 | Song | |
| 2014/0183599 | A1 | 7/2014 | Hong | |
| 2016/0260715 | A1 | 9/2016 | Chung | |
| 2017/0005005 | A1 | 1/2017 | Chen | |
| 2017/0047419 | A1* | 2/2017 | Glass | H10D 30/024 |
| 2017/0125413 | A1* | 5/2017 | Wu | H10D 30/024 |
| 2018/0166576 | A1 | 6/2018 | Wang | |
| 2018/0190654 | A1 | 7/2018 | Wu | |
| 2018/0308758 | A1 | 10/2018 | Willemann | |
| 2019/0043981 | A1* | 2/2019 | Yoon | H10D 30/62 |
| 2019/0148556 | A1 | 5/2019 | Wang | |
| 2019/0165136 | A1 | 5/2019 | Joshi | |
| 2019/0386118 | A1 | 12/2019 | Chan | |
| 2020/0006492 | A1 | 1/2020 | Chouksey | |

FOREIGN PATENT DOCUMENTS

| | | | |
|---|---|---|---|
| CN | 109390406 | | 2/2019 |
| CN | 111129143 | A | 5/2020 |
| JP | 2002-110963 | A | 4/2002 |
| JP | 2004-281782 | | 10/2004 |
| JP | 2005-136376 | | 5/2005 |
| JP | 2005-217418 | | 8/2005 |
| JP | 2006-093216 | | 4/2006 |
| JP | 2006-294995 | | 10/2006 |
| JP | 2007-501524 | | 1/2007 |
| JP | 2007-220809 | | 8/2007 |
| JP | WO2005/020325 | | 11/2007 |
| JP | 2008-10790 | | 1/2008 |
| JP | 2008-060590 | | 3/2008 |
| JP | 2009-021456 | | 1/2009 |
| JP | 2009-503893 | | 1/2009 |
| JP | WO2006/132172 | | 1/2009 |
| JP | 2009-295820 | | 12/2009 |
| JP | 2011-014753 | | 1/2011 |
| JP | 2011-091324 | | 5/2011 |
| JP | 2011-103450 | | 5/2011 |
| JP | 2014-010839 | | 1/2014 |
| JP | 2019-102797 | | 6/2019 |
| WO | 2005/034207 | | 4/2005 |
| WO | 2007/019023 | | 2/2007 |

OTHER PUBLICATIONS

Search Report mailed/issued on Apr. 20, 2022 for EP application No. 21209279.5, pp. 1-8.
Office action mailed on Mar. 9, 2022 for the U.S. Appl. No. 17/111,525, filed Dec. 4, 2020, pp. 1-5.
Office action mailed on May 26, 2022 for the U.S. Appl. No. 17/111,525, filed Dec. 4, 2020, pp. 1-24.
Office action mailed on Nov. 10, 2022 for the U.S. Appl. No. 17/111,525, filed Dec. 4, 2020, pp. 1-8.
Notice of allowance mailed on Feb. 1, 2023 for the U.S. Appl. No. 17/111,525, filed Dec. 4, 2020, pp. 1-9.
Response to Amendment under Rule 312 mailed/issued on Mar. 27, 2023 for U.S. Appl. No. 17/111,525, filing date: 2020/12/04, pp. 1-2.

* cited by examiner

MANUFACTURING METHOD OF SEMICONDUCTOR DEVICE

CROSS REFERENCE TO RELATED APPLICATIONS

This application is a continuation application of U.S. application Ser. No. 17/111,525, filed on Dec. 4, 2020. The content of the application is incorporated herein by reference.

BACKGROUND OF THE INVENTION

1. Field of the Invention

The present invention relates to a semiconductor device, and more particularly, to a semiconductor device including a fin-shaped structure.

2. Description of the Prior Art

As the size of the field effect transistors (FETs) becomes smaller continuously, the conventional planar field effect transistor has difficulty in development because of the manufacturing limitations. Therefore, for overcoming the manufacturing limitations, the non-planar transistor technology such as fin field effect transistor (FinFET) technology is developed to replace the planar FET and becomes a development trend in the related industries. Since the three-dimensional structure of a FinFET increases the overlapping area between the gate and the fin-shaped structure, the channel region can therefore be more effectively controlled by the gate. This way, the drain-induced barrier lowering (DIBL) effect and the short channel effect (SCE) of the device with smaller dimensions may be reduced. However, there are still some issues have to be solved in the FinFETs for further improving the electrical characteristics thereof.

SUMMARY OF THE INVENTION

A semiconductor device and a manufacturing method thereof are provided in the present invention. Leakage current and/or capacitance between different doped regions within a fin-shaped structure may be reduced by separating the doped regions, modifying an area of fin-shaped structure covered by a gate structure straddling the fin-shaped structure, and/or enlarging a bottom portion of the gate structure for improving electrical characteristics of the semiconductor device.

According to an embodiment of the present invention, a semiconductor device is provided. The semiconductor device includes a semiconductor substrate, a fin-shaped structure, a gate structure, a first doped region, a second doped region, and an intermediate region. The fin-shaped structure is disposed on and extends upwards from a top surface of the semiconductor substrate in a vertical direction. The gate structure is disposed straddling a part of the fin-shaped structure. At least a part of the first doped region is disposed in the fin-shaped structure. The second doped region is disposed in the fin-shaped structure and disposed above the first doped region in the vertical direction. The intermediate region is disposed in the fin-shaped structure. The second doped region is separated from the first doped region by the intermediate region, and a bottom surface of the gate structure is lower than or coplanar with a top surface of the first doped region in the vertical direction.

According to an embodiment of the present invention, a manufacturing method of a semiconductor device is provided. The manufacturing method includes the following steps. A fin-shaped structure is formed on a semiconductor substrate, and the fin-shaped structure extends upwards from a top surface of the semiconductor substrate in a vertical direction. At least a part of a first doped region is located in the fin-shaped structure. A second doped region is formed in the fin-shaped structure. The second doped region is located above the first doped region in the vertical direction, and the second doped region is separated from the first doped region by an intermediate region located in the fin-shaped structure. A gate structure is formed straddling a part of the fin-shaped structure. A bottom surface of the gate structure is lower than or coplanar with a top surface of the first doped region in the vertical direction.

According to an embodiment of the present invention, a semiconductor device is provided. The semiconductor device includes a semiconductor substrate, a fin-shaped structure, and a gate structure. The fin-shaped structure is disposed on and extends upwards from a top surface of the semiconductor substrate in a vertical direction. The gate structure is disposed straddling a part of the fin-shaped structure, and the gate structure includes a first portion and a second portion disposed on the first portion. A width of the first portion of the gate structure is greater than a width of the second portion of the gate structure.

According to an embodiment of the present invention, a manufacturing method of a semiconductor device is provided. The manufacturing method includes the following steps. A fin-shaped structure is formed on a semiconductor substrate, and the fin-shaped structure extends upwards from a top surface of the semiconductor substrate in a vertical direction. A gate structure is formed straddling a part of the fin-shaped structure, and the gate structure includes a first portion and a second portion disposed on the first portion. A width of the first portion is greater than a width of the second portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 5-9 are stereoscopic schematic drawings illustrating a manufacturing method of the semiconductor device according to the first embodiment of the present invention, wherein FIG. 6 is a stereoscopic schematic drawing in a step subsequent to FIG. 5, FIG. 7 is a stereoscopic schematic drawing in a step subsequent to FIG. 6, FIG. 8 is a stereoscopic schematic drawing in a step subsequent to FIG. 7, and FIG. 9 is a stereoscopic schematic drawing in a step subsequent to FIG. 8.

FIGS. 12-14 are stereoscopic schematic drawings illustrating a manufacturing method of the semiconductor device according to the second embodiment of the present invention, wherein FIG. 13 is a stereoscopic schematic drawing in a step subsequent to FIG. 12, and FIG. 14 is a stereoscopic schematic drawing in a step subsequent to FIG. 13.

FIGS. 17-19 are stereoscopic schematic drawings illustrating a manufacturing method of the semiconductor device according to the third embodiment of the present invention, wherein FIG. 18 is a stereoscopic schematic drawing in a step subsequent to FIG. 17, and FIG. 19 is a stereoscopic schematic drawing in a step subsequent to FIG. 18.

FIGS. 23-26 are stereoscopic schematic drawings illustrating a manufacturing method of the semiconductor device according to the fourth embodiment of the present invention, wherein FIG. 24 is a stereoscopic schematic drawing in a step subsequent to FIG. 23, FIG. 25 is a stereoscopic schematic drawing in a step subsequent to FIG. 24, and FIG. 26 is a stereoscopic schematic drawing in a step subsequent to FIG. 25.

FIGS. 28-32 are stereoscopic schematic drawings illustrating a manufacturing method of the semiconductor device according to the fifth embodiment of the present invention, wherein FIG. 29 is a stereoscopic schematic drawing in a step subsequent to FIG. 28, FIG. 30 is a stereoscopic schematic drawing in a step subsequent to FIG. 29, FIG. 31 is a stereoscopic schematic drawing in a step subsequent to FIG. 30, and FIG. 32 is a stereoscopic schematic drawing in a step subsequent to FIG. 31.

FIG. 34 and FIG. 35 are stereoscopic schematic drawings illustrating a manufacturing method of the semiconductor device according to the sixth embodiment of the present invention, wherein FIG. 35 is a stereoscopic schematic drawing in a step subsequent to FIG. 34.

FIG. 37 and FIG. 38 are stereoscopic schematic drawings illustrating a manufacturing method of the semiconductor device according to the seventh embodiment of the present invention, wherein FIG. 38 is a stereoscopic schematic drawing in a step subsequent to FIG. 37.

FIG. 40 and FIG. 41 are stereoscopic schematic drawings illustrating a manufacturing method of the semiconductor device according to the eighth embodiment of the present invention, wherein FIG. 41 is a stereoscopic schematic drawing in a step subsequent to FIG. 40.

FIG. 43 and FIG. 44 are stereoscopic schematic drawings illustrating a manufacturing method of the semiconductor device according to the ninth embodiment of the present invention, wherein FIG. 44 is a stereoscopic schematic drawing in a step subsequent to FIG. 43.

FIG. 45 and FIG. 46 are stereoscopic schematic drawings illustrating a manufacturing method of a semiconductor device according to a tenth embodiment of the present invention, wherein FIG. 46 is a stereoscopic schematic drawing in a step subsequent to FIG. 45.

DETAILED DESCRIPTION

Figure 1:
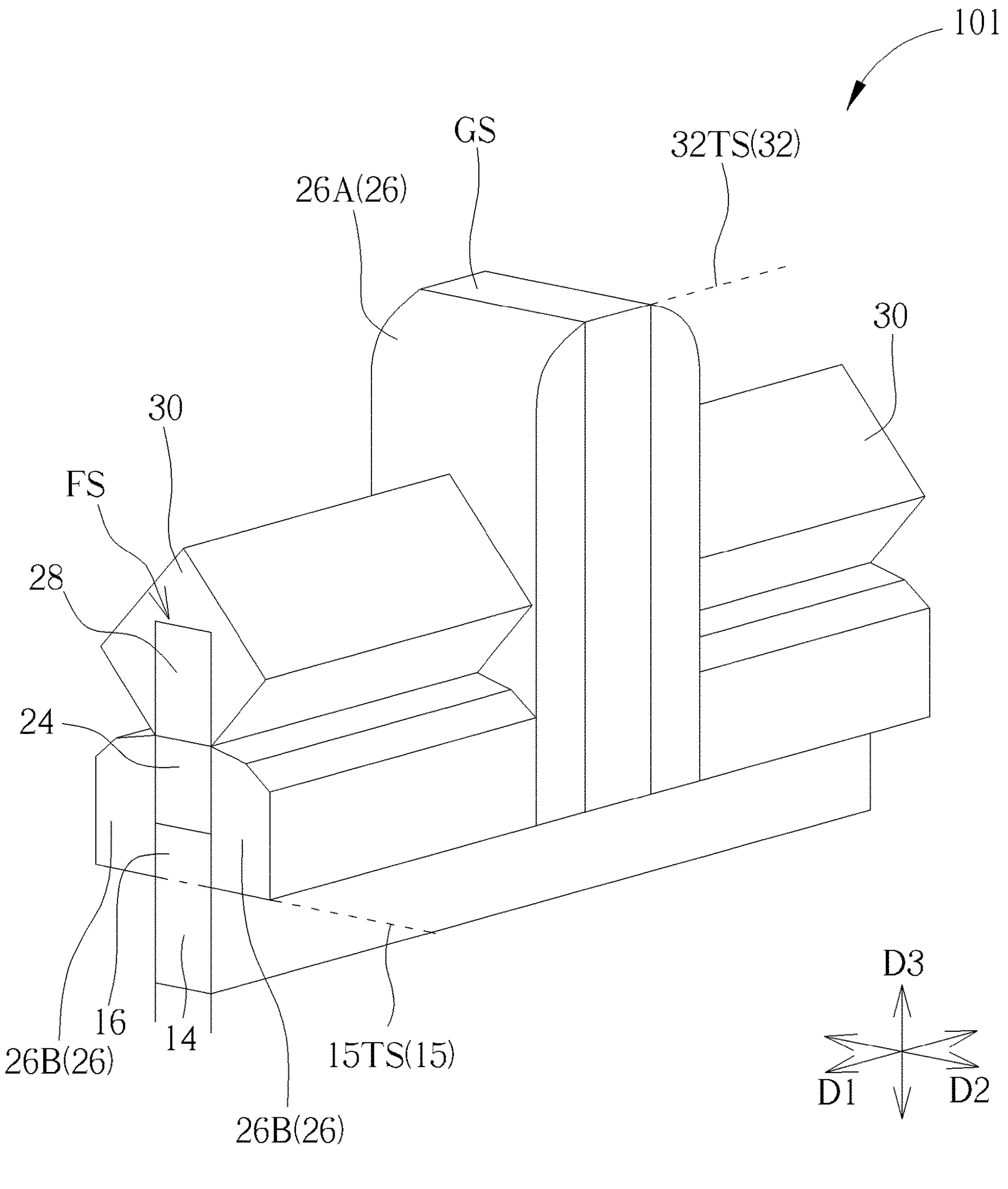
FIG. 1 is a stereoscopic schematic drawing illustrating a semiconductor device according to a first embodiment of the present invention.

Although specific configurations and arrangements are discussed, it could be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

It could be understood that, although the terms first, second, etc. may be used herein to describe various elements, components, regions, layers and/or sections, these elements, components, regions, layers and/or sections are not limited by these terms. These terms are only used to distinguish one element, component, region, layer and/or section from another. Thus, a first element, component, region, layer or section discussed below could be termed a second element, component, region, layer or section without departing from the teachings of the disclosure.

It could be understood that the meaning of "on," "above," and "over" in the present disclosure may be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 2:
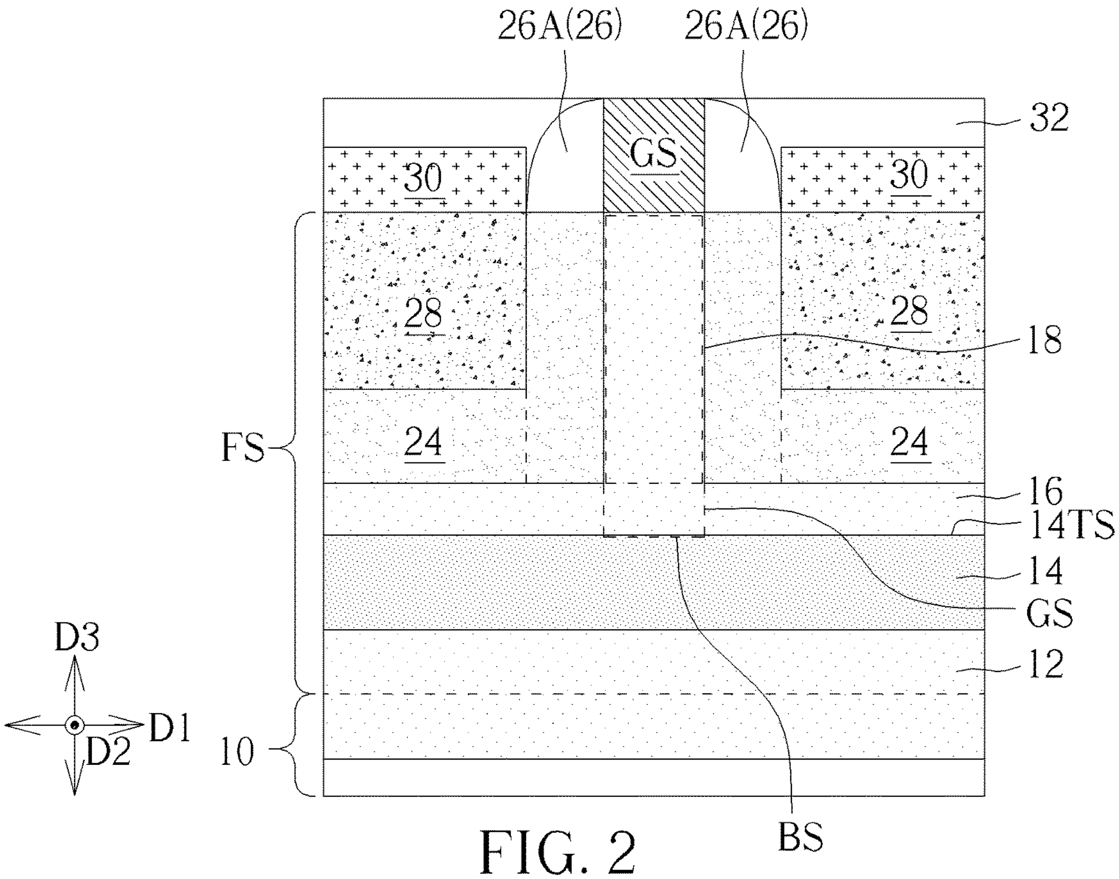
FIG. 2 is a cross-sectional schematic drawing illustrating the semiconductor device according to the first embodiment of the present invention.
Figure 3:
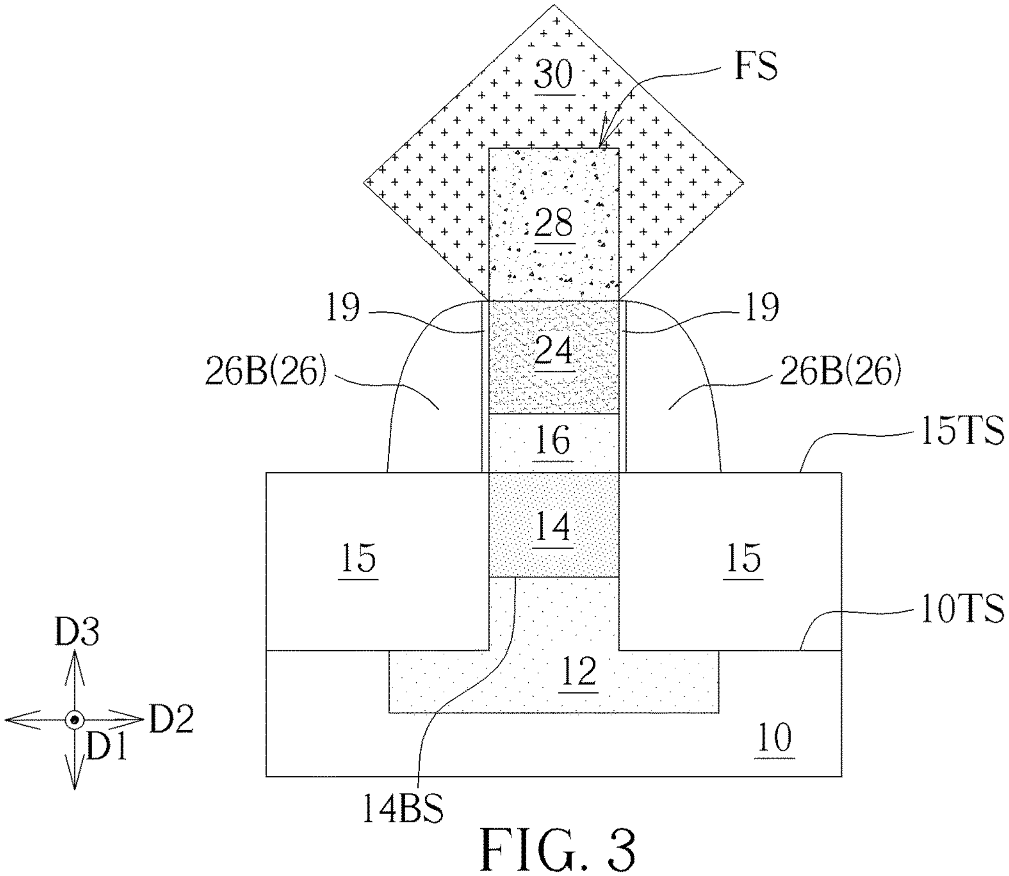
FIG. 3 is a cross-sectional schematic drawing illustrating a source/drain structure in the semiconductor device according to the first embodiment of the present invention.
Figure 4:
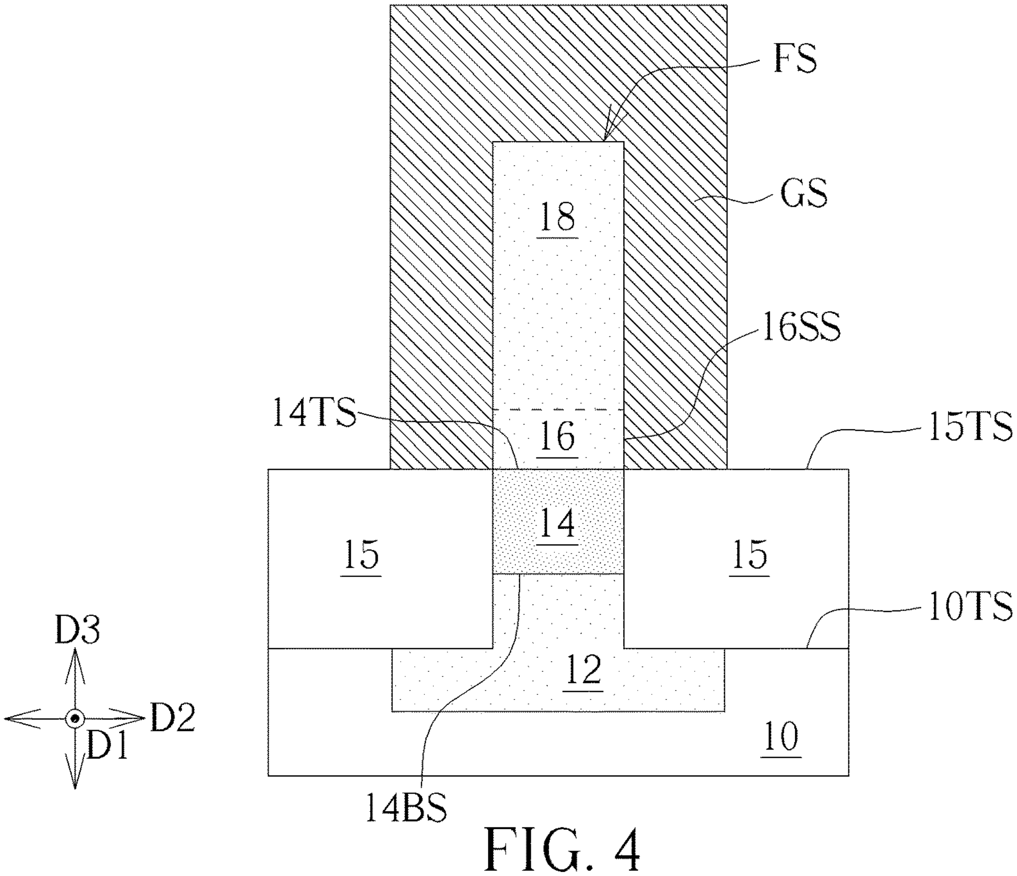
FIG. 4 is a cross-sectional schematic drawing illustrating a gate structure in the semiconductor device according to the first embodiment of the present invention.

FIG. 1 is a stereoscopic schematic drawing illustrating a semiconductor device 101 according to a first embodiment of the present invention, FIG. 2 is a cross-sectional schematic drawing illustrating the semiconductor device 101 in this embodiment, FIG. 3 is a cross-sectional schematic drawing illustrating a source/drain structure 30 in the semiconductor device 101 according to this embodiment, and FIG. 4 is a cross-sectional schematic drawing illustrating a gate structure GS in the semiconductor device 101 according to this embodiment. FIG. 2 may be regarded as a cross-sectional diagram taken alone an elongation direction of a fin-shaped structure FS in the semiconductor device 101 (such as a first direction D1 represented in FIGS. 1-4), and FIG. 3 and FIG. 4 may be regarded as cross-sectional diagrams taken alone a direction perpendicular to the elongation direction of the fin-shaped structure FS (such as a second direction D2 represented in FIGS. 1-4). As illustrated in FIGS. 1-4, the semiconductor device 101 includes a semiconductor substrate 10, a fin-shaped structure FS, a gate structure GS, a first doped region 14, a second doped region 24, and an intermediate region 16. The fin-shaped structure FS is disposed on the semiconductor substrate 10 and extends upwards from a top surface 10TS of the semiconductor substrate 10 in a vertical direction (such as a third direction D3 represented in FIGS. 1-4). The gate structure GS is disposed straddling a part of the fin-shaped structure FS. At least a part of the first doped region 14 is disposed in the fin-shaped structure FS. The second doped region 24 is disposed in the fin-shaped structure FS and disposed above the first doped region 14 in the third direction D3. The intermediate region 16 is disposed in the fin-shaped structure FS. The second doped region 24 is separated from the first doped region 14 by the intermediate region 16, and a bottom surface BS of the gate structure GS is lower than or coplanar with a top surface 14TS of the first doped region 14 in the third direction D3.

In some embodiments, the fin-shaped structure FS may be formed by etching a part of the semiconductor substrate 10, and a material composition of the fin-shaped structure FS and/or a material composition of the bottom of the fin-shaped structure FS may be the same as a material composition of the semiconductor substrate 10 and/or a material composition of the top of the semiconductor substrate 10 directly connected with the bottom of the fin-shaped structure FS. For example, the fin-shaped structure FS may be a silicon semiconductor fin-shaped structure FS when the semiconductor substrate 10 is a silicon semiconductor substrate, but not limited thereto. In other words, the fin-shaped structure FS in the present invention is not a fin-shaped structure directly formed on an insulator layer of a semiconductor-on-insulator (SOI) substrate. In some embodiments, the semiconductor substrate 10 may include a silicon semiconductor substrate, a silicon germanium semiconductor substrate, a silicon carbide semiconductor substrate, or a substrate made of other suitable semiconductor materials. In a top view of the semiconductor device 101, the fin-shaped structure FS may be elongated in the first direction D1, the gate structure GS may be elongated in the second direction D2 for straddling a part of the fin-shaped structure FS, and the second direction D2 may be substantially orthogonal to the first direction D1, but not limited thereto. Therefore, the gate structure GS may be partially disposed at two opposite sides of the fin-shaped structure FS in the second direction D2, and the fin-shaped structure FS may be partially disposed at two opposite sides of the gate structure GS in the first direction D1. It is worth noting that some of the components illustrated in the figures of the present invention may further extend in the first direction D1 and/or the second direction D2 and are not limited to the shape illustrated in the figures. For example, the gate structure GS disposed at two opposite sides of the fin-shaped structure FS in the second direction D2 may further extend in the second direction D2 for straddling another fin-shaped structure, but not limited thereto.

In some embodiments, the third direction D3 may be regarded as a thickness direction of the semiconductor substrate 10, and the semiconductor substrate 10 may have the top surface 10TS and a bottom surface opposite to the top surface 10TS in the third direction D3. In some embodiments, the first direction D1 and the second direction D2 may be regarded as horizontal directions located in a horizontal plane orthogonal to a vertical direction (e.g. the third direction D3) and parallel with the top surface 10TS and/or the bottom surface of the semiconductor substrate 10, but not limited thereto. Additionally, in this description, a distance between the bottom surface of the semiconductor substrate 10 and a relatively higher location and/or a relatively higher part in the third direction D3 is greater than a distance between the bottom surface of the semiconductor substrate 10 and a relatively lower location and/or a relatively lower part in the third direction D3. The bottom or a lower portion of each component may be closer to the bottom surface of the semiconductor substrate 10 in the third direction D3 than the top or upper portion of this component. Another component disposed above a specific component may be regarded as being relatively far from the bottom surface of the semiconductor substrate 10 in the third direction D3, and another component disposed under a specific component may be regarded as being relatively closer to the bottom surface of the semiconductor substrate 10 in the third direction D3. Additionally, in this description, a top surface of a specific component may include a topmost surface of this component in the third direction D3, and a bottom surface of a specific component may include a bottommost surface of this component in the third direction D3.

In some embodiments, a conductivity type of the second doped region 24 may be different from and complementary to a conductivity type of the first doped region 14. For example, the first doped region 14 may contain first conductive impurities, the second doped region 24 may contain second conductive impurities, and the first conductive impurities may be different from the second conductive impurities in conductivity type. In some embodiments, when the semiconductor device 101 is an n-type transistor, the first doped region 14 may be a p-type doped region containing p-type impurities, and the second doped region 24 may be an n-type doped region containing n-type impurities. When the semiconductor device 101 is a p-type transistor, the first doped region 14 may be an n-type doped region containing n-type impurities, and the second doped region 24 may be a p-type doped region containing p-type impurities. The p-type impurities described above may include boron (B) or other suitable p-type conductive impurities, and the n-type impurities described above may include phosphorus (P), arsenic (As), or other suitable n-type conductive impurities, but not limited thereto. In addition, a conductivity type of the intermediate region 16 may be identical to the conductivity type of the first doped region 14, and an impurity concentration in the first doped region 14 may be higher than an impurity concentration in the intermediate region 16. For example, the intermediate region 16 may include third conductive impurities, the conductivity type of the third conductive impurities may be the same as that of the first conductive impurities, but the concentration of the third conductive impurities in the intermediate region 16 is lower than the concentration of the first conductive impurities in the first doped region 14. In some embodiments, the third conductive impurities may be identical to or different from the first conductive impurities, but both the first conductive impurities and the third conductive impurities are n-type conductive impurities or p-type conductive impurities.

In some embodiments, the semiconductor device 101 may further include a well region 12, an isolation structure 15, a channel region 18, a spacer structure 26, a source/drain region 28, a source/drain structure 30, and a dielectric layer 32. The well region 12 may be partly disposed in the semiconductor substrate 10 and partly disposed in the fin-shaped structure FS, and the first doped region 14 may be disposed above the well region 12. Therefore, a bottom surface 14BS of the first doped region 14 may be higher than the top surface 10TS of the semiconductor substrate 10 in the third direction D3, but not limited thereto. In some embodiments, a conductivity type of the well region 12 may be identical to the conductivity type of the first doped region 14, and the impurity concentration in the first doped region 14 may be higher than an impurity concentration in the well region 12. For example, the well region 12 may include fourth conductive impurities, the conductivity type of the fourth conductive impurities may be the same as that of the first conductive impurities, but the concentration of the fourth conductive impurities in the well region 12 is lower than the concentration of the first conductive impurities in the first doped region 14. In some embodiments, the fourth conductive impurities may be identical to or different from the first conductive impurities, but both the first conductive impurities and the fourth conductive impurities are n-type conductive impurities or p-type conductive impurities.

The channel region 18 may be disposed in the fin-shaped structure FS and located above the intermediate region 16 in the third direction D3. In some embodiments, a conductivity type of the channel region 18 may be identical to the conductivity type of the intermediate region 16, the channel region 18 may contain conductive impurities identical to the third conductive impurities in the intermediate region 16, and an impurity concentration in the channel region 18 may be substantially equal to the impurity concentration in the intermediate region 16, but not limited thereto. In some embodiments, the channel region 18 may be directly connected with the intermediate region 16, and the gate structure GS may cover the channel region 18 in the second direction D2 and the third direction D3 and cover a part of the intermediate region 16 in the second direction D2.

In some embodiments, the gate structure GS may include a gate dielectric layer and a gate material layer disposed on the gate dielectric layer (not illustrated in the figures). The gate dielectric layer may include a high dielectric constant (high-k) dielectric material or other suitable dielectric materials. The high-k dielectric material described above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The gate material layer may include a non-metallic electrically conductive material (such as doped polysilicon) or a metallic electrically conductive material, such as a metal gate structure formed with a work function layer and a low electrical resistivity layer stacked with each other, but not limited thereto. The work function layer described above may include titanium nitride (TiN), titanium carbide (TiC), tantalum nitride (TaN), tantalum carbide (TaC), tungsten carbide (WC), titanium tri-aluminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials.

The isolation structure 15 may be disposed on the semiconductor substrate 10 and surrounding a part of the fin-shaped structure FS, such as a lower part of the fin-shaped structure FS. The isolation structure 15 may include a single layer or multiple layers of insulation materials, such as oxide insulation materials (silicon oxide, for example), or other suitable insulation materials. In some embodiments, a part of the gate structure GS may be disposed on the isolation structure 15 in the third direction D3, and a top surface 15TS of the isolation structure 15 may be lower than or coplanar with the top surface 14TS of the first doped region 14 in the third direction D3. In some embodiments, the bottom surface BS of the gate structure GS may directly contact the top surface 15TS of the isolation structure 15, and the gate structure GS may cover a part of a side surface 16SS of the intermediate region 16 in the second direction D2. The bottom surface BS of the gate structure GS is lower than or coplanar with the top surface 14TS of the first doped region 14 in the third direction D3 for ensuring that the intermediate region 16 located between the channel region 18 and the first doped region 14 is covered by the gate structure GS in the second direction D2.

The spacer structure 26 may include a single layer or multiple layers of dielectric materials, such as silicon oxide, silicon nitride, silicon oxynitride, or other suitable dielectric materials. The spacer structure 26 may be partly disposed on sidewalls of the gate structure GS and partly disposed on sidewalls of the fin-shaped structure FS. For example, the spacer structure 26 may include a first portion 26A disposed on the sidewalls of the gate structure GS and a second portion 26B disposed on the sidewalls of a lower portion of the fin-shaped structure FS, but not limited thereto. A part of the first portion 26A may be directly connected with a part of the second portion 26B, and a top surface of the second portion 26B may be lower than a top surface of the first portion 26A in the third direction D3. The source/drain region 28 is disposed in the fin-shaped structure FS and disposed above the second doped region 24 in the third direction D3. A conductivity type of the source/drain region 28 may be identical to the conductivity type of the second doped region 24, and an impurity concentration in the source/drain region 28 may be higher than an impurity concentration in the second doped region 24. For example, the source/drain region 28 may include fifth conductive impurities, the conductivity type of the fifth conductive impurities may be the same as that of the second conductive impurities in the second doped region 24, but the concentration of the fifth conductive impurities in the source/drain region 28 is higher than the concentration of the second conductive impurities in the second doped region 24. Therefore, the source/drain region 28 may be regarded as a heavily doped region, and the second doped region 24 may be regarded as a highly doped region or a relatively lightly doped region (such as a lightly doped drain, LDD), but not limited thereto. In some embodiments, the fifth conductive impurities may be identical to or different from the second conductive impurities, but both the second conductive impurities and the fifth conductive impurities are n-type conductive impurities or p-type conductive impurities. For example, the second conductive impurities in the second doped region 24 may be arsenic and the fifth conductive impurities in the source/drain region 28 may be phosphorus for an n-type transistor because arsenic is less likely to diffuse than phosphorus, but not limited thereto.

In some embodiments, the source/drain structure 30 may be disposed on the fin-shaped structure FS and encompass the source/drain region 28, but not limited thereto. The source/drain structure 30 may include an epitaxial material, such as epitaxial silicon, epitaxial silicon germanium (SiGe), epitaxial silicon phosphide (SiP), or other suitable epitaxial materials. In some embodiments, the source/drain structure 30 may contain conductive impurities identical to or similar to the fifth conductive impurities in the source/drain region 28. The source/drain structure 30 may include two separated portions disposed at two opposite sides of the gate structure GS in the first direction D1, respectively, and the two portions of the source/drain structure 30 may be regarded as a source electrode and a drain electrode of the semiconductor device, respectively. The source/drain region 28 may include two separated portions disposed at the two opposite sides of the gate structure GS in the first direction D1, respectively, and the two portions of the source/drain region 28 may be regarded as a source doped region and a drain doped region of the semiconductor device, respectively. The second doped region 24 may include two separated portions disposed at the two opposite sides of the gate structure GS in the first direction D1, respectively, and the two portions of the second doped region 24 may be regarded as a LDD region for the source electrode and a LDD region for the drain electrode in the semiconductor device, respectively, but not limited thereto. The dielectric layer 32 may include a single layer or multiple layers of dielectric materials, such as silicon oxide, silicon oxynitride, silicon nitride, or other suitable dielectric materials. The dielectric layer 32 may cover the source/drain structure 30 and the spacer structure 26, and a top surface 32TS of the dielectric layer 32 may be substantially coplanar with a top surface of the gate structure GS, but not limited thereto.

The first doped region 14 with relatively higher impurity concentration may be used to reduce leakage current between the source electrode and the drain electrode (such as the different portions of the source/drain structure 30 disposed at two opposite sides of the gate structure GS in the first direction D1, respectively) at the bottom of the fin-shaped structure FS, and the first doped region 14 may be regarded as a channel cut region, but not limited thereto. The intermediate region 16 with relatively lower impurity concentration disposed between the first doped region 14 and the second doped region 24 may be used to reduce leakage current between the first doped region 14 and the second doped region 24 and/or capacitance between the first doped region 14 and the second doped region 24. Additionally, the gate structure GS having the bottom surface BS lower than or coplanar with the top surface 14TS of the first doped region 14 in the third direction D3 may be used to reduce leakage current between different lightly doped regions (such as the different portions of the second doped region 24 disposed at two opposite sides of the gate structure GS in the first direction D1, respectively) by covering the intermediate region 16 located between the channel region 18 and the first doped region 14. Therefore, the electrical characteristics of the semiconductor device may be improved by the intermediate region 16 disposed between the first doped region 14 and the second doped region 24 and the gate structure GS having the bottom surface BS lower than or coplanar with the top surface 14TS of the first doped region 14 in the third direction D3.

Figure 5:
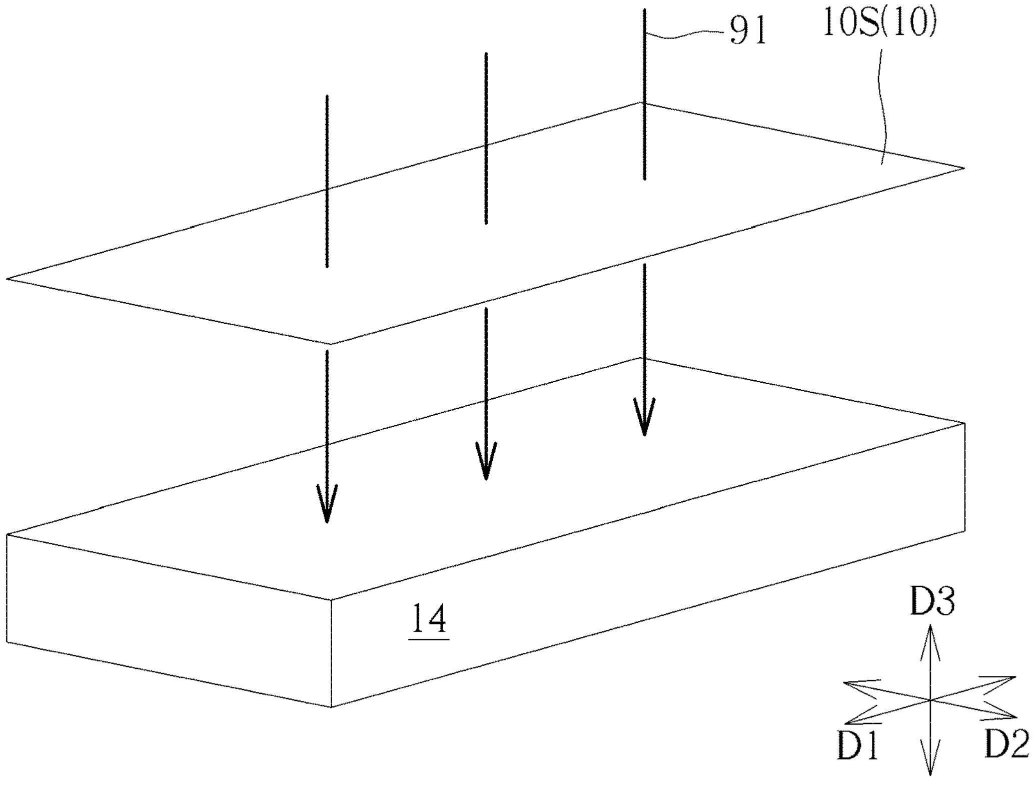
Figure 6:
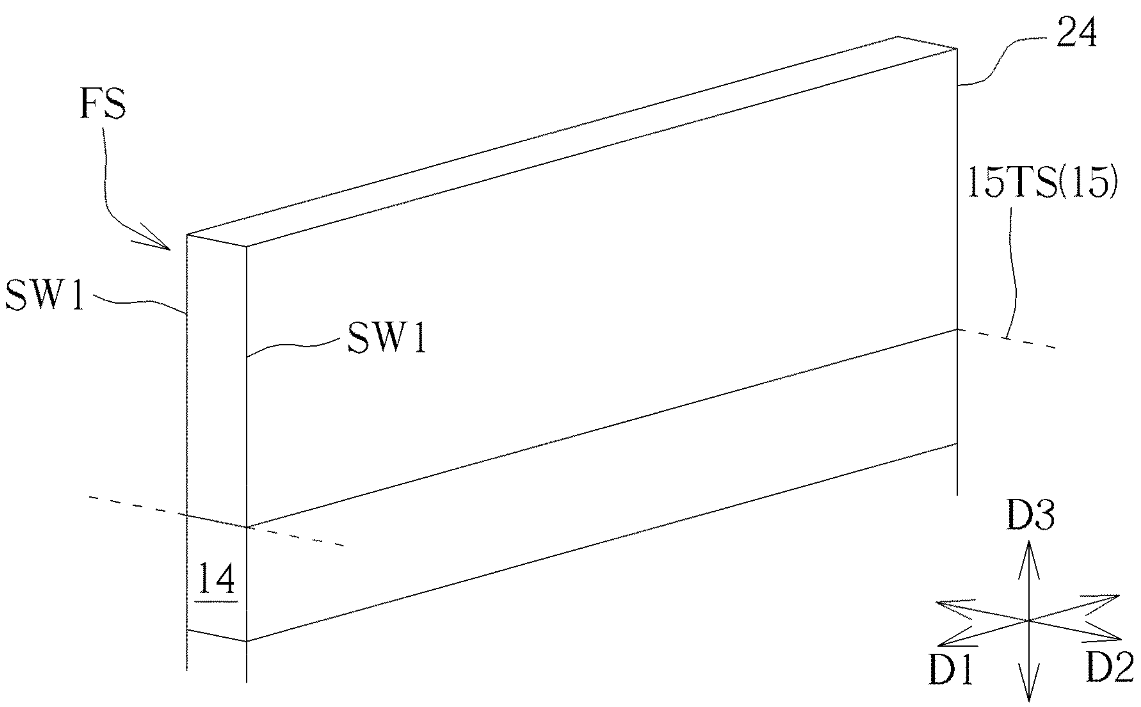
Figure 7:
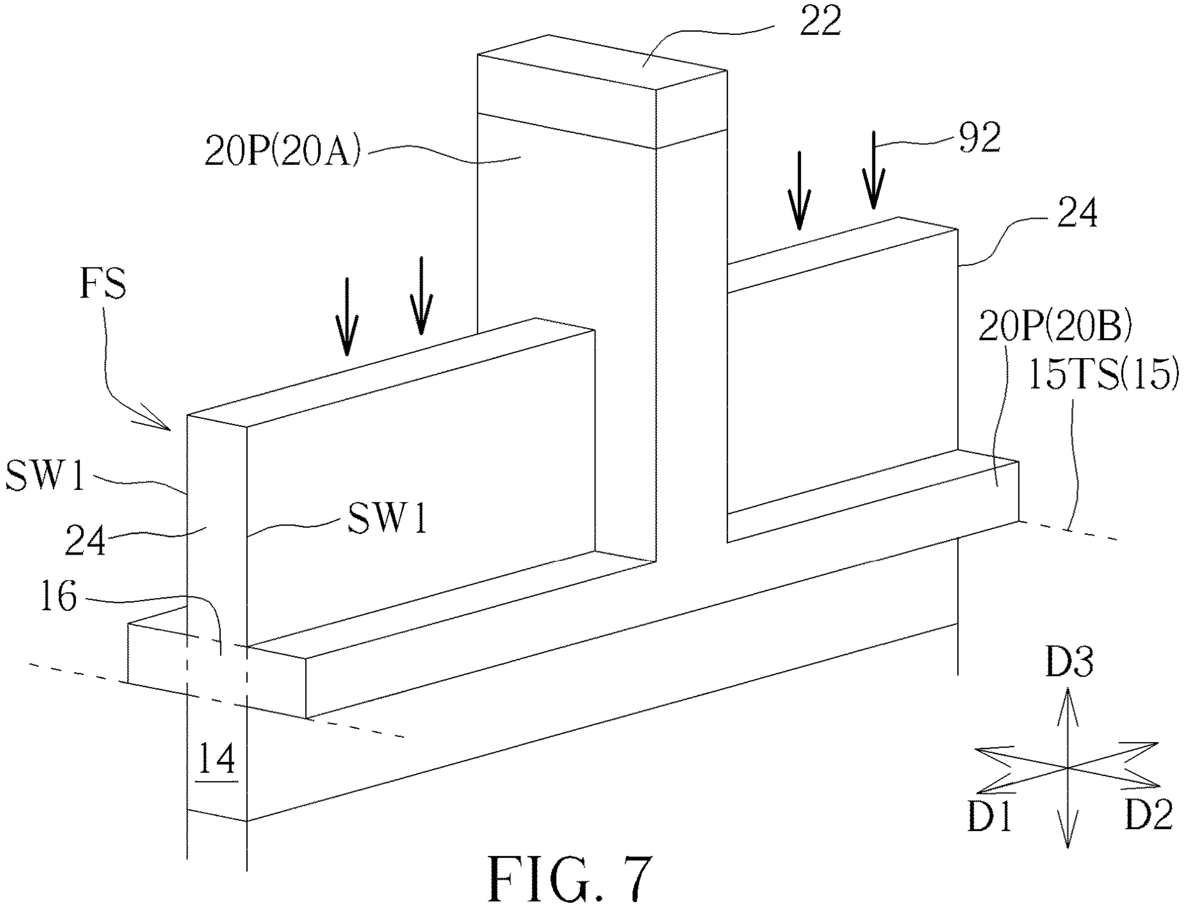
Figure 8:
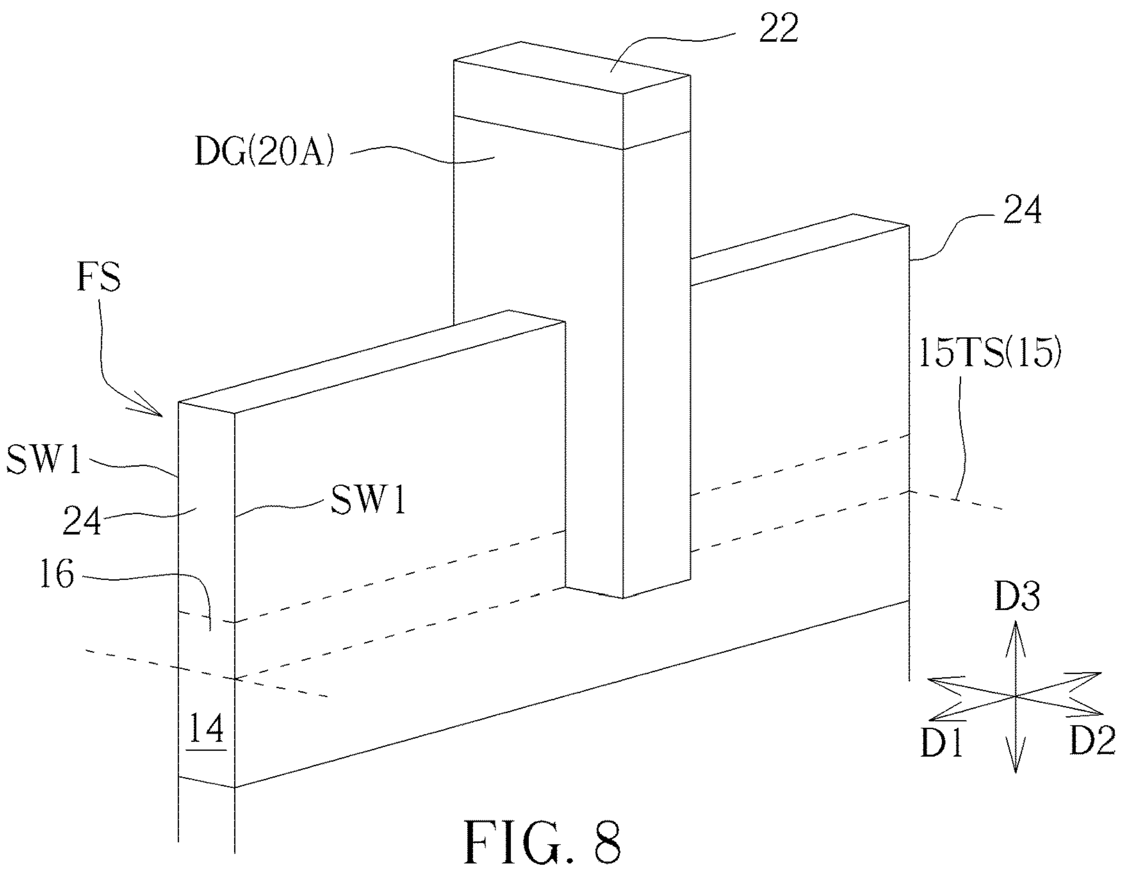
Figure 9:
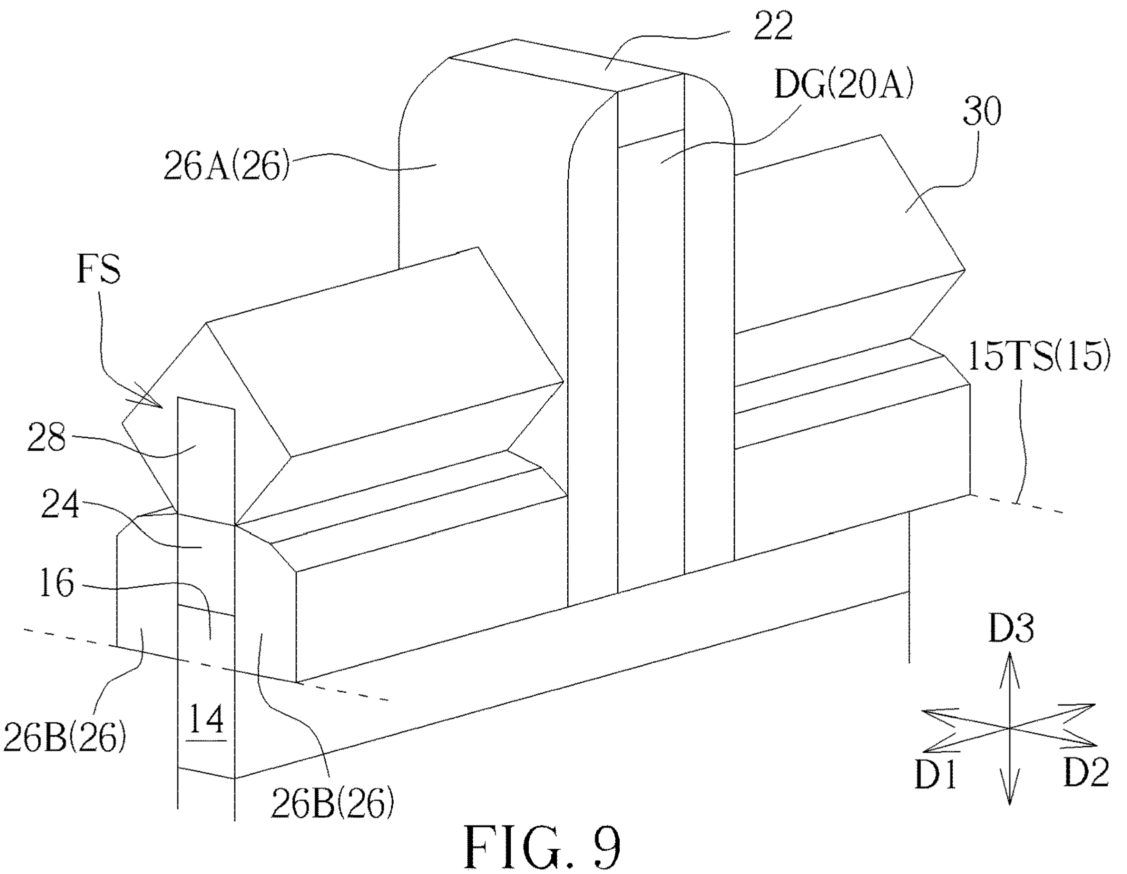

FIGS. 5-9 are stereoscopic schematic drawings illustrating a manufacturing method of the semiconductor device 101 according to the first embodiment of the present invention, wherein FIG. 6 is a stereoscopic schematic drawing in a step subsequent to FIG. 5, FIG. 7 is a stereoscopic schematic drawing in a step subsequent to FIG. 6, FIG. 8 is a stereoscopic schematic drawing in a step subsequent to FIG. 7, FIG. 9 is a stereoscopic schematic drawing in a step subsequent to FIG. 8, and FIG. 1 may be regarded as a stereoscopic schematic drawing in a step subsequent to FIG. 9. As illustrated in FIGS. 1-4, a manufacturing method of the semiconductor device 101 may include the following steps. The fin-shaped structure FS is formed on the semiconductor substrate 10, and the fin-shaped structure FS extends upwards from the top surface 10TS of the semiconductor substrate 10 in the vertical direction (such as the third direction D3). At least a part of the first doped region 14 is located in the fin-shaped structure FS. The second doped region 24 is formed in the fin-shaped structure FS. The second doped region 24 is located above the first doped region 14 in the third direction D3, and the second doped region 24 is separated from the first doped region 14 by the intermediate region 16 located in the fin-shaped structure FS. The gate structure GS is formed straddling a part of the fin-shaped structure FS. The bottom surface BS of the gate structure GS is lower than or coplanar with the top surface 14TS of the first doped region 14 in the third direction D3.

Specifically, the manufacturing method of the semiconductor device 101 in this embodiment may include but is not limited to the following steps. Firstly, as illustrated in FIG. 5, the semiconductor substrate 10 is provided, and the first doped region 14 may be formed in the semiconductor substrate 10 by a doping process 91. The doping process described in this description may include an ion implantation process or other suitable impurity doping approaches. The range, the depth, and the impurity concentration of the first doped region 14 in the semiconductor substrate 10 may be controlled by modifying the process parameters of the doping process 91. Subsequently, as illustrated in FIG. 5 and FIG. 6, the fin-shaped structure FS may be formed by performing a patterning process to the semiconductor substrate 10, and the isolation structure 15 may be formed surrounding the lower portion of the fin-shaped structure FS. In some embodiments, a part of an original surface 10S of the semiconductor substrate 10 may be recessed by the patterning process to be the top surface 10TS of the semiconductor substrate 10 represented in FIG. 3 and FIG. 4, and another part of the original surface 10S of the semiconductor substrate 10 may become a top surface of the fin-shaped structure FS, but not limited thereto. In some embodiments, the top surface 15TS of the isolation structure 15 may be controlled by an etching back process performed to the isolation structure 15 for recessing the isolation structure 15 and exposing the upper portion of the fin-shaped structure FS and a portion of a sidewall SW1 of the fin-shaped structure FS. The exposed portion of the fin-shaped structure FS may be doped with the third conductive impurities described above after the step of forming the isolation structure 15, and the top surface 15TS of the isolation structure 15 may be controlled to be substantially coplanar with the top surface of the first doped region 14 and/or be aligned with the top surface of the first doped region 14 in the third direction D3. Therefore, the first doped region 14 may be formed before the step of forming the fin-shaped structure FS, but not limited thereto. In some embodiments, the first doped region 14 may be formed after the step of forming the fin-shaped structure FS according to other design and/or process considerations.

As illustrated in FIG. 8, a dummy gate DG is formed straddling the fin-shaped structure FS. In some embodiments, a method of forming the dummy gate DG may include but is not limited to the following steps. As illustrated in FIG. 6 and FIG. 7, a material layer may be formed on the isolation structure and covering the fin-shaped structure FS, and a patterning process may be performed to the material layer with a mask layer 22 formed on the material layer as a mask for forming a patterned material layer 20P on the semiconductor substrate after the step of forming the fin-shaped structure FS. A planarization process of the material layer (e.g. a chemical mechanical polishing (CMP)) may be performed after forming the material layer and before forming the mask layer 22. The mask layer 22 may include oxide insulation materials (silicon oxide, for example), or other suitable insulation materials. In some embodiments, the patterned material layer 20P may include a first portion 20A and a second portion 20B connected with the first portion 20A. The first portion 20A may be disposed straddling a part of the fin-shaped structure FS, and the second portion 20B may be elongated in the first direction D1 and cover a part of the sidewall SW1 of the fin-shaped structure FS. For example, the second portion 20B of the patterned material layer 20P may cover the sidewall SW1 of the lower part of the exposed fin-shaped structure FS. After the step of forming the patterned material layer 20P, the second doped region 24 may be formed in the fin-shaped structure FS by performing another doping process 92. In some embodiments, the patterned material layer 20P may be used as a mask in the doping process 92, the second doped region 24 may be formed in the exposed portion of the fin-shaped structure FS, and a portion of the fin-shaped structure FS covered by the patterned material layer 20P may be the intermediate region 16 and the channel region described above. As illustrated in FIG. 7 and FIG. 8, after the step of forming the second doped region 24, an etching process may be performed to the patterned material layer 20P, and the patterned material layer 20P may be etched to be the dummy gate DG by the etching process. In some embodiments, the second portion 20B of the patterned material layer 20P may be removed by the etching process, and the first portion 20A of the patterned material layer 20P may be regarded as the dummy gate DG, but not limited thereto. In some embodiments, the second doped region 24 may be formed after the step of forming the patterned material layer 20P and before the second portion 20B of the patterned material layer 20P is removed by the etching process, but not limited thereto. In addition, the dummy gate DG may cover a part of the side surface of the intermediate region 16 in second direction D2, and the dummy gate DG may be replaced with the gate structure described above in subsequent processes. In some embodiments, the dummy gate DG may be formed from the patterned material layer 20P, and the dummy gate DG and the patterned material layer 20P may include a silicon-containing material, such as polysilicon, amorphous silicon, or other suitable materials.

As illustrated in FIG. 9, the spacer structure 26 may be formed after the step of forming the second doped region 24, the first portion 26A of the spacer structure 26 may be formed on sidewalls of the dummy gate DG, and the second portion 26B of the spacer structure 26 may be formed on the sidewalls of the fin-shaped structure FS. In some embodiments, a part of the second portion 26B of the spacer structure 26 may be etched back for exposing an upper portion of the fin-shaped structure FS, and the source/drain structure 30 may be formed on the exposed fin-shaped structure FS by an epitaxial growth process or other suitable approaches. In some embodiments, a dielectric layer (such as a dielectric layer 19 represented in FIG. 3) may be formed on the fin-shaped structure FS before the step of forming the material layer described above and the step of forming the spacer structure 26, a part of the dielectric layer has to be removed before the step of forming the source/drain structure 30, and a part of the dielectric layer may remain and be located between the spacer structure 26 and the fin-shaped structure FS, but not limited thereto. In some embodiments, the source/drain structure 30 may be doped in-situ during the process of forming the source/drain structure 30, and the source/drain region 28 may be formed concurrently by the process, but not limited thereto. Instead of in-situ doping process described above, the source/drain structure 30 and the source/drain region 28 may be doped by ion implantation process after forming the source/drain structure 30. Subsequently, as illustrated in FIG. 9 and FIG. 1, the dielectric layer 32 may be formed and the dummy gate DG may be replaced with the gate structure GS by a replacement metal gate (RMG) process, but not limited thereto. In some embodiments, the dummy gate DG and the mask layer 22 may be replaced with the gate structure GS. In some embodiments, the mask layer 22 may be removed by a planarization process performed to the dielectric layer 32, the spacer structure 26, and the mask layer 22, and the dummy gate DG may be replaced with the gate structure GS after the planarization process. The planarization process may include the CMP process, an etching back process, or other suitable planarization approaches.

It is worth noting that the manufacturing method of the semiconductor device is not limited to the approach described above and other suitable approaches may also be applied in the manufacturing method of the semiconductor device according to the present invention. Additionally, at least some steps of the manufacturing method described above may also be applied in other embodiments of the present invention.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
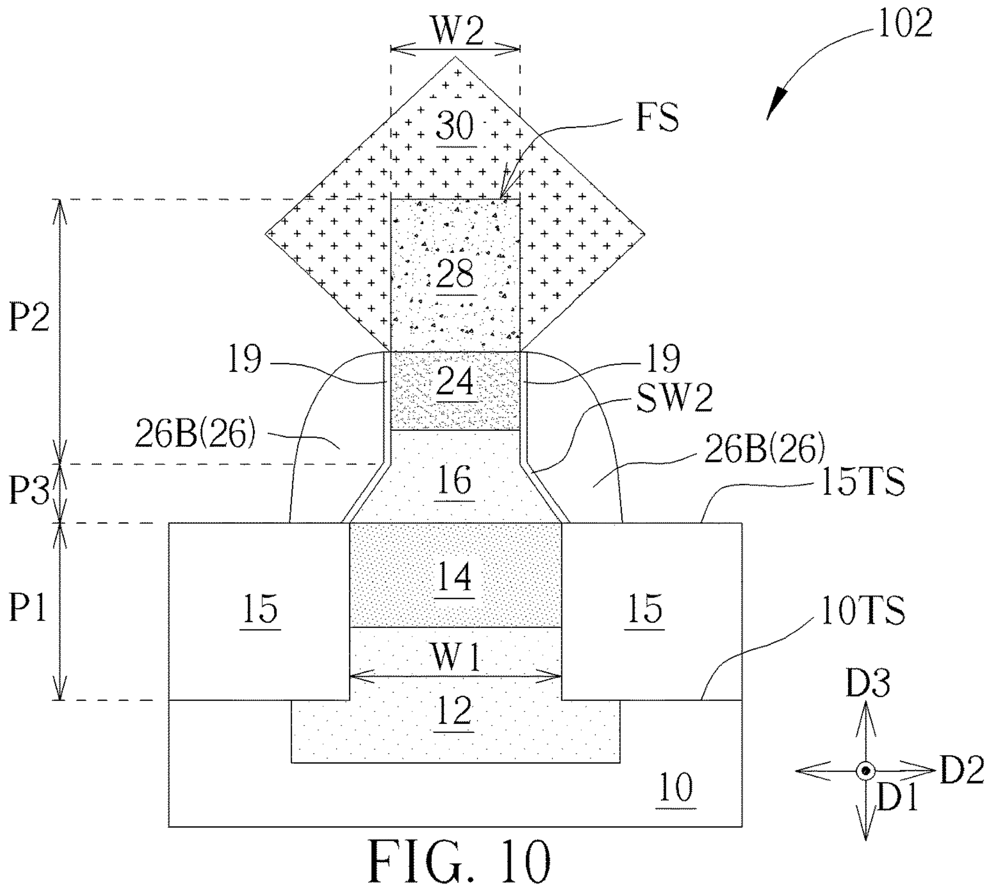
FIG. 10 is a cross-sectional schematic drawing illustrating a source/drain structure in a semiconductor device according to a second embodiment of the present invention.
Figure 11:
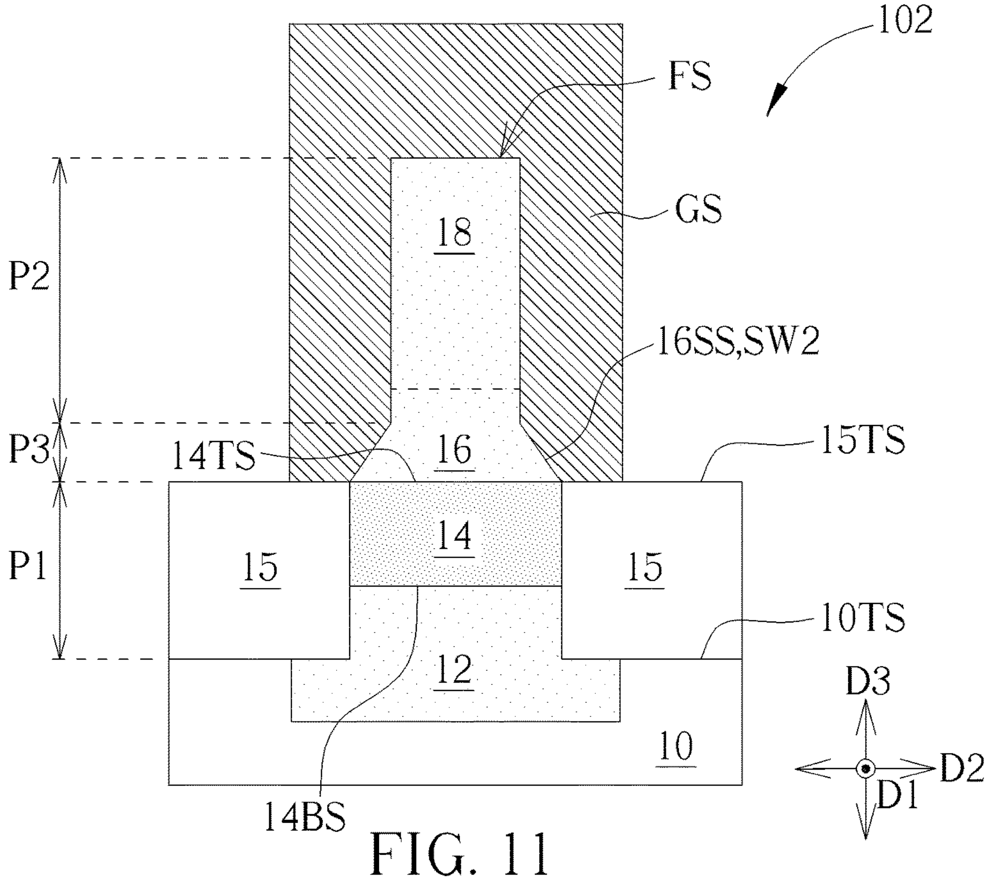
FIG. 11 is a cross-sectional schematic drawing illustrating a gate structure in the semiconductor device according to the second embodiment of the present invention.

FIG. 10 is a cross-sectional schematic drawing illustrating the source/drain structure 30 in a semiconductor device 102 according to a second embodiment of the present invention, and FIG. 11 is a cross-sectional schematic drawing illustrating the gate structure GS in the semiconductor device 102 according to this embodiment. FIG. 10 and FIG. 11 may be regarded as cross-sectional diagrams at different portions of the semiconductor device 102. As illustrated in FIG. 10 and FIG. 11, in the semiconductor device 102, the fin-shaped structure FS may include a first portion P1, a second portion P2, and a third portion P3. The second portion P2 is disposed on the first portion P1 in the third direction D3, and the third portion P3 is disposed between the first portion P1 and the second portion P2 in the third direction D3. A width W1 of the first portion P1 may be greater than a width W2 of the second portion P2, and a sidewall SW2 of the third portion P3 may be tapered for increasing the area of the fin-shaped structure FS covered by the gate structure GS. In some embodiments, the width W1 of the first portion P1 may be regarded as a length of the first portion P1 in the second direction D2, and the width W2 of the second portion P2 may be regarded as a length of the second portion P2 in the second direction D2. Additionally, at least a part of the intermediate region 16 may be disposed in the third portion P3, at least a part of the first doped region 14 may be disposed in the first portion P1, and the second doped region 24 and the source/drain region 28 may be disposed in the second portion P2, but not limited thereto. In some embodiments, the interface between the first portion P1 and the third portion P3 in the third direction D3 may be substantially coplanar with the top surface 15TS of the isolation structure 15 and/or the bottom surface BS of the gate structure GS, but not limited thereto. In addition, a length of the second portion P2 in the third direction D3 may be greater than a length of the third portion P3 in the third direction D3, a slope of the sidewall of the second portion P2 may be greater than a slope of the sidewall SW2 of the third portion P3, and the third portion P3 may be regarded as an enlarged portion for increasing the surface area of the fin-shaped structure FS covered by the gate structure GS, but not limited thereto.

Figure 12:
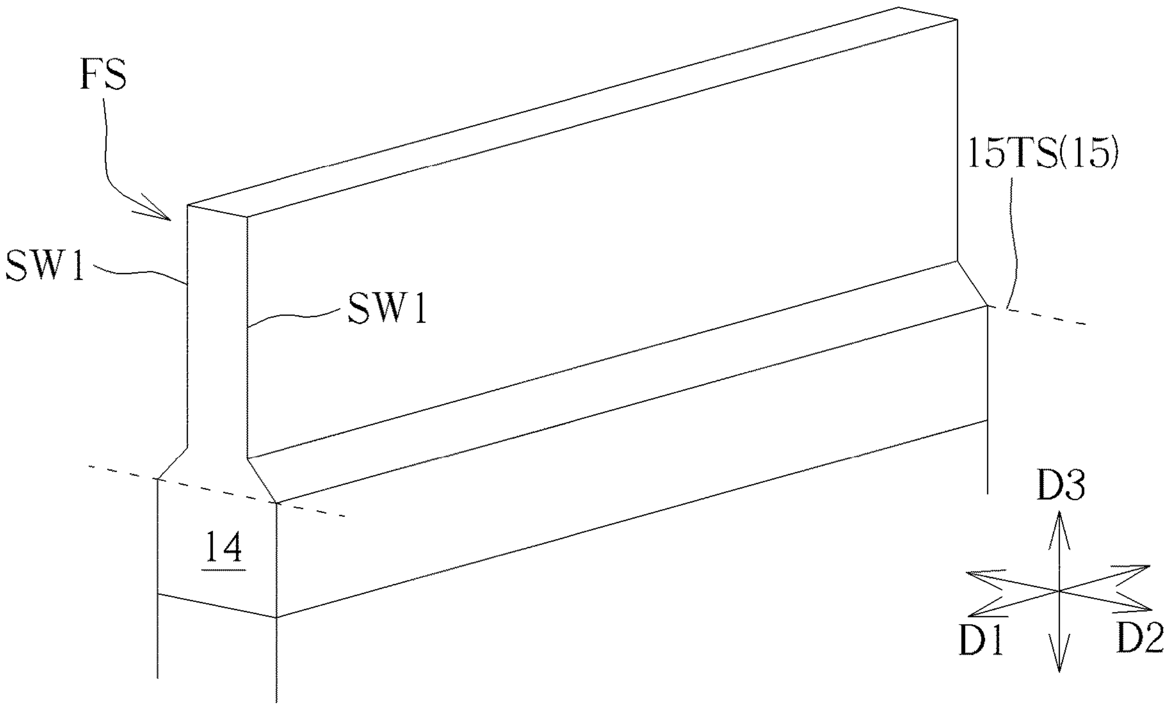
Figure 13:
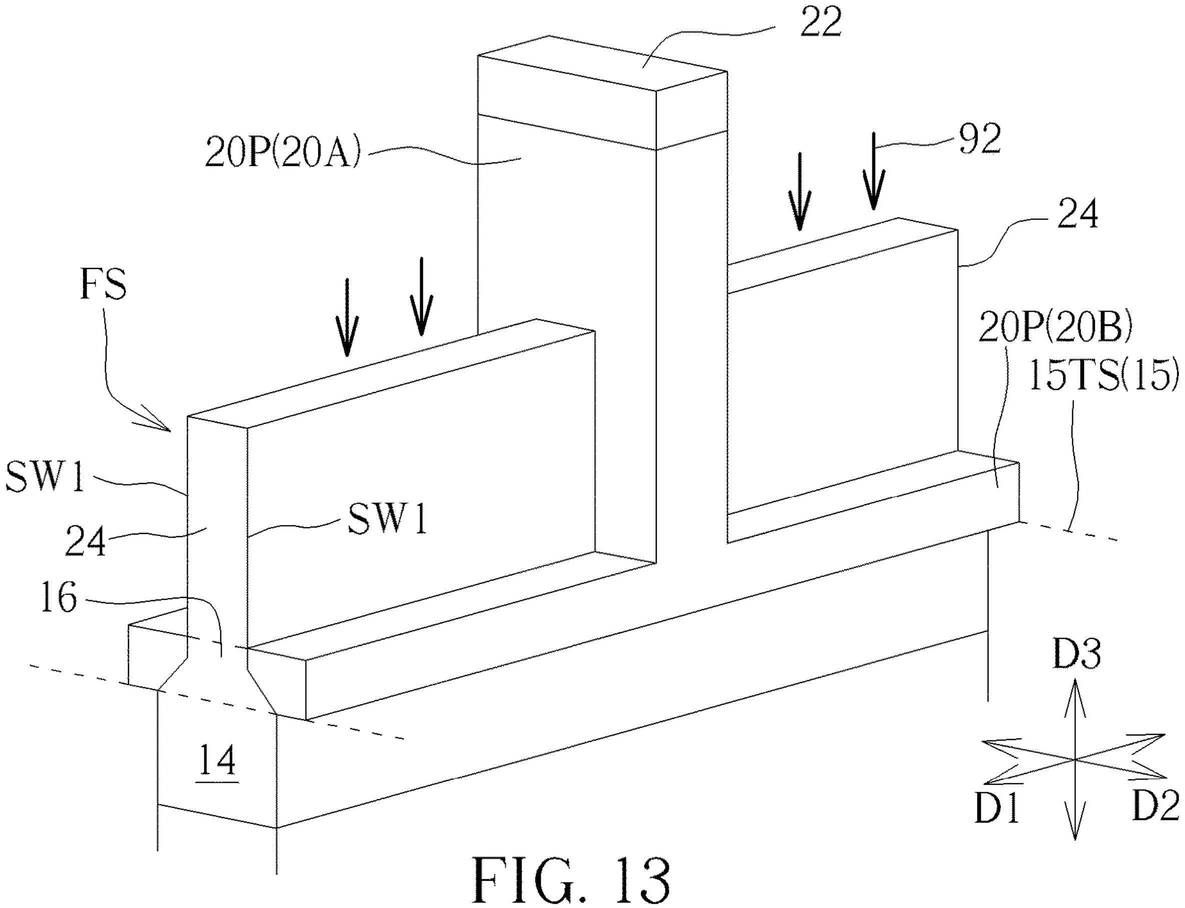
Figure 14:
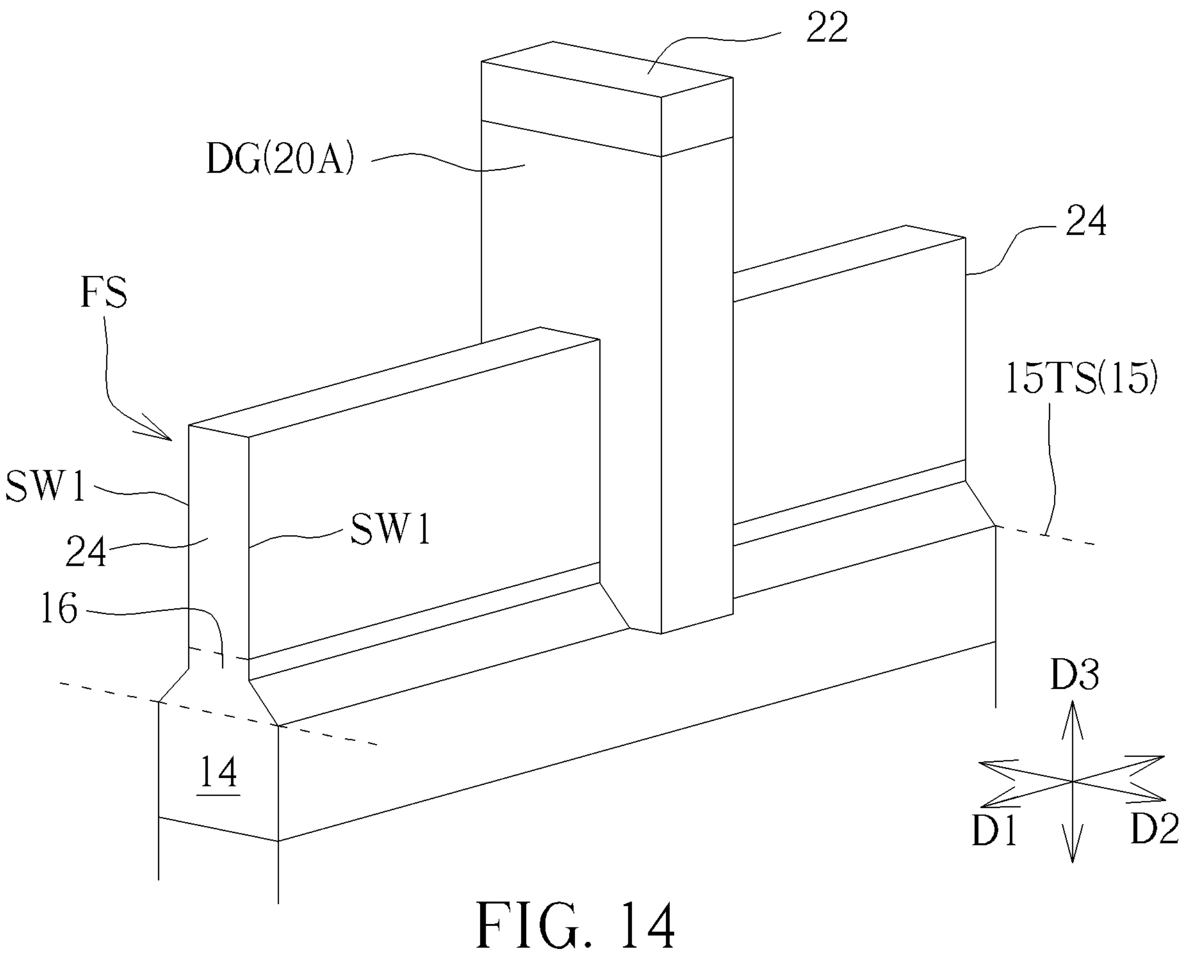

FIGS. 12-14 are stereoscopic schematic drawings illustrating a manufacturing method of the semiconductor device 102 according to the second embodiment of the present invention, wherein FIG. 13 is a stereoscopic schematic drawing in a step subsequent to FIG. 12, FIG. 14 is a stereoscopic schematic drawing in a step subsequent to FIG. 13, and FIG. 10 and FIG. 11 may be regarded as cross-sectional schematic drawings in a step subsequent to FIG. 14. As illustrated in FIGS. 10-12, the fin-shaped structure FS including the first portion P1, the second portion P2, and the third portion P3 described above may be formed by modifying the patterning process to the semiconductor substrate 10 described above. As illustrated in FIGS. 10, 11, and 13, in some embodiments, the second portion 20B of the patterned material layer 20P may cover the third portion P3 and a part of the second portion P2 of the fin-shaped structure FS in the second direction D2 during the doping process 92 for forming the second doped region 24. As illustrated in FIGS. 10, 11, 13, and 14, the second portion 20B of the patterned material layer 20P may be removed for forming the dummy gate DG, the dummy gate DG may cover a part of the sidewall SW2 of the third portion P3, and the intermediate region 16 may be partly formed in the third portion P3 and partly formed in the second portion P2, but not limited thereto. Subsequently, the dummy gate DG may be replaced with the gate structure GS for forming the semiconductor device 102.

It is worth noting that the manufacturing method of the semiconductor device 102 is not limited to the approach described above and other suitable approaches may also be applied in the manufacturing method of the semiconductor device 102. Additionally, the fin-shaped structure FS including the first portion P1, the second portion P2, and the third portion P3 in this embodiment may also be applied to other embodiments of the present invention.

Figure 15:
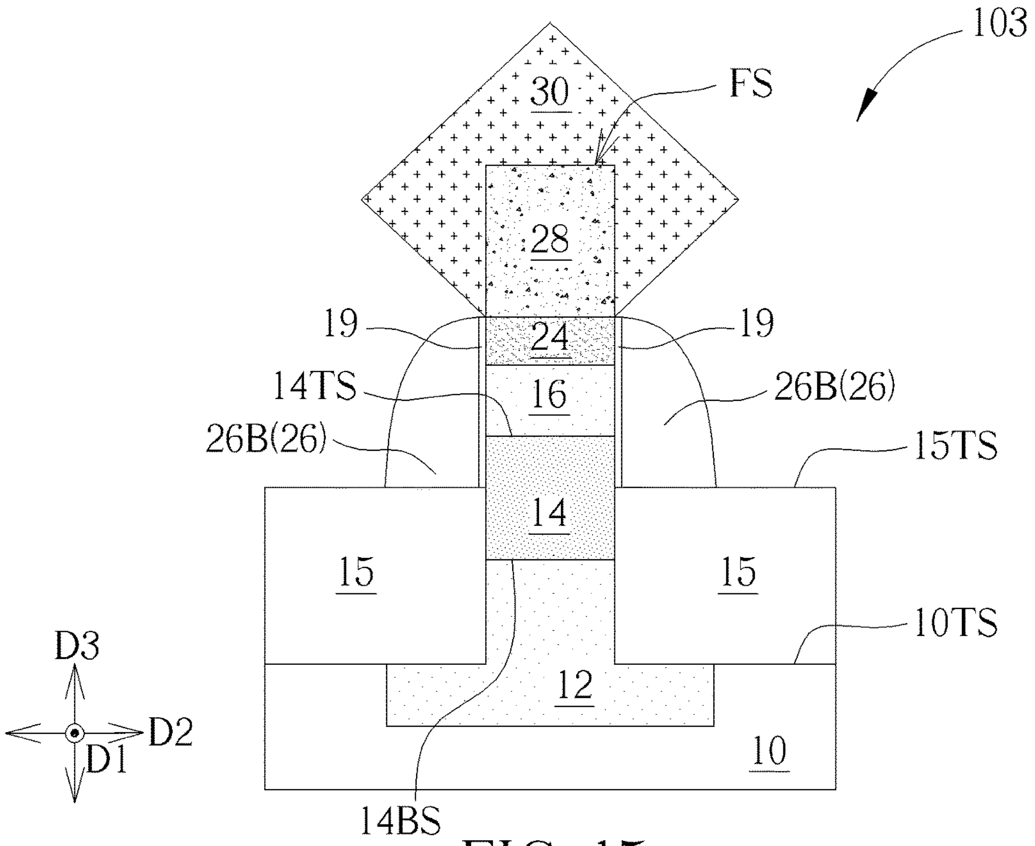
FIG. 15 is a cross-sectional schematic drawing illustrating a source/drain structure in a semiconductor device according to a third embodiment of the present invention.
Figure 16:
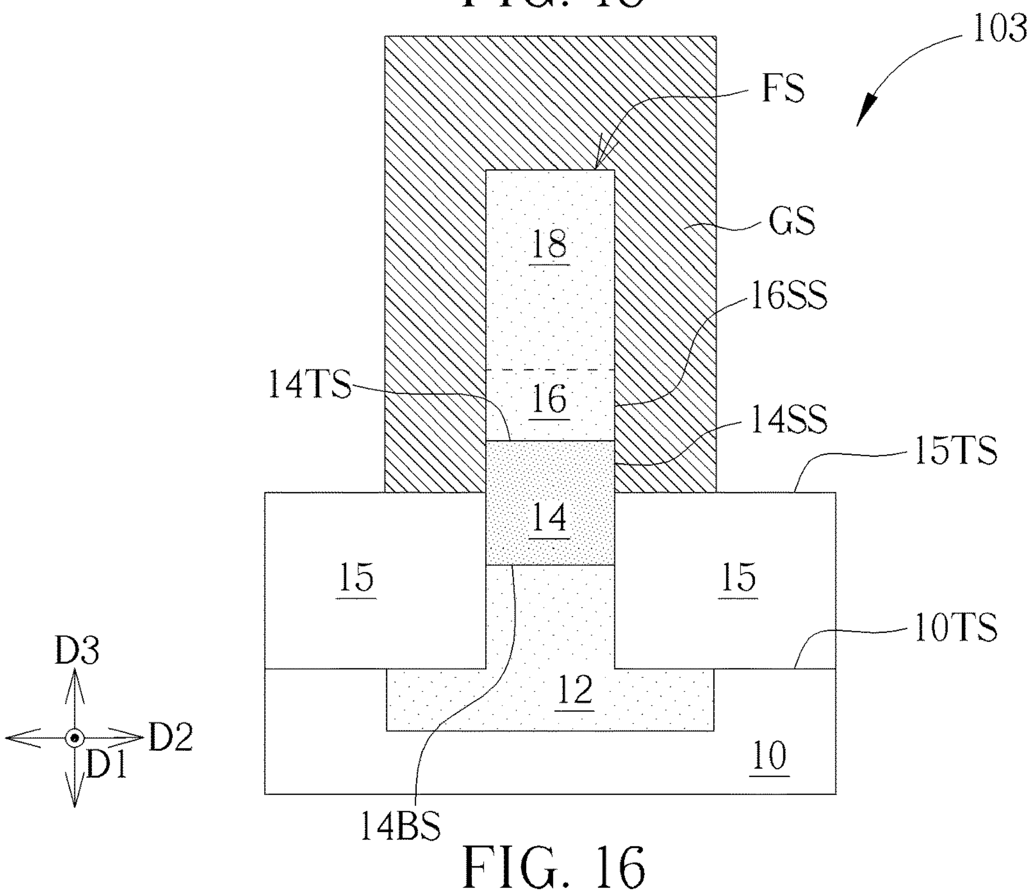
FIG. 16 is a cross-sectional schematic drawing illustrating a gate structure in the semiconductor device according to the third embodiment of the present invention.

FIG. 15 is a cross-sectional schematic drawing illustrating the source/drain structure 30 in a semiconductor device 103 according to a third embodiment of the present invention, and FIG. 16 is a cross-sectional schematic drawing illustrating the gate structure GS in the semiconductor device 103 according to this embodiment. FIG. 15 and FIG. 16 may be regarded as cross-sectional diagrams at different portions of the semiconductor device 103. As illustrated in FIG. 15 and FIG. 16, in the semiconductor device 103, the top surface 15TS of the isolation structure 15 and the bottom surface BS of the gate structure GS may be lower than the top surface 14TS of the first doped region 14 in the third direction D3 and higher than the bottom surface 14BS of the first doped region 14 in the third direction D3. Therefore, the gate structure GS may further cover a part of a side surface 14SS of the first doped region 14 in the second direction D2 for ensuring that the intermediate region 16 located between the channel region 18 and the first doped region 14 is covered by the gate structure GS in the second direction D2.

Figure 17:
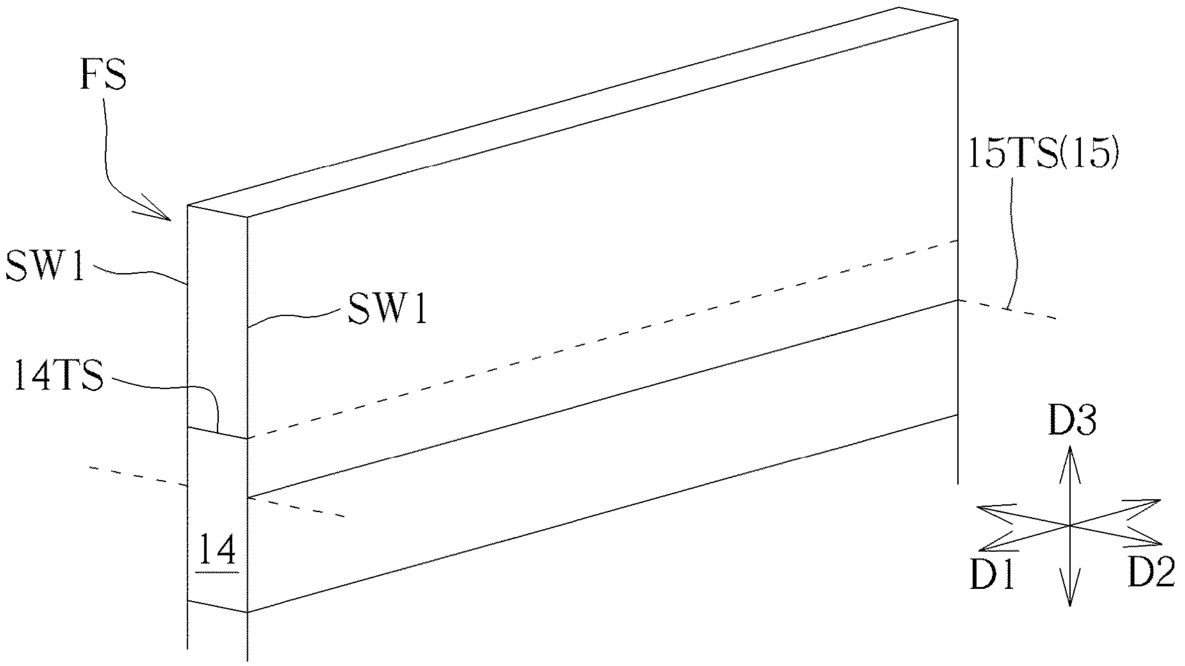
Figure 18:
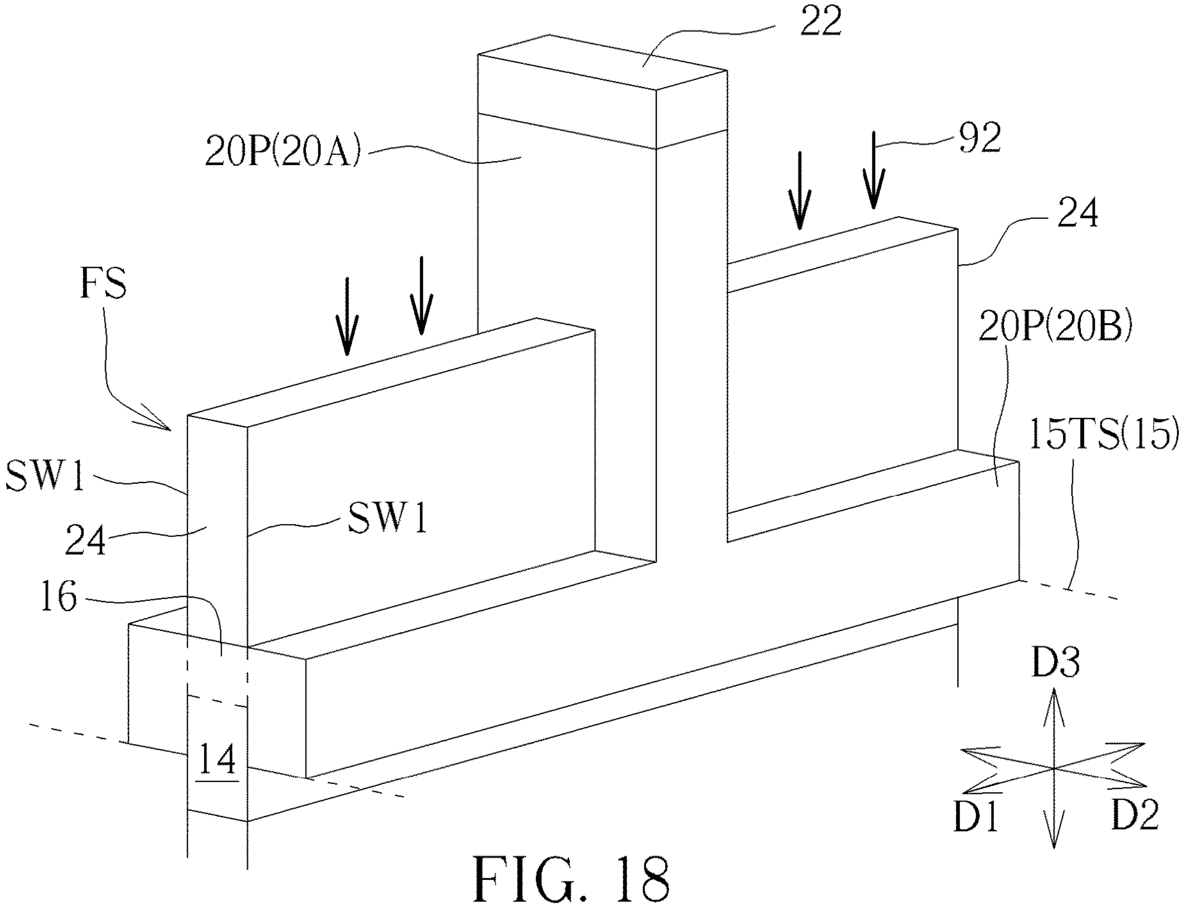
Figure 19:
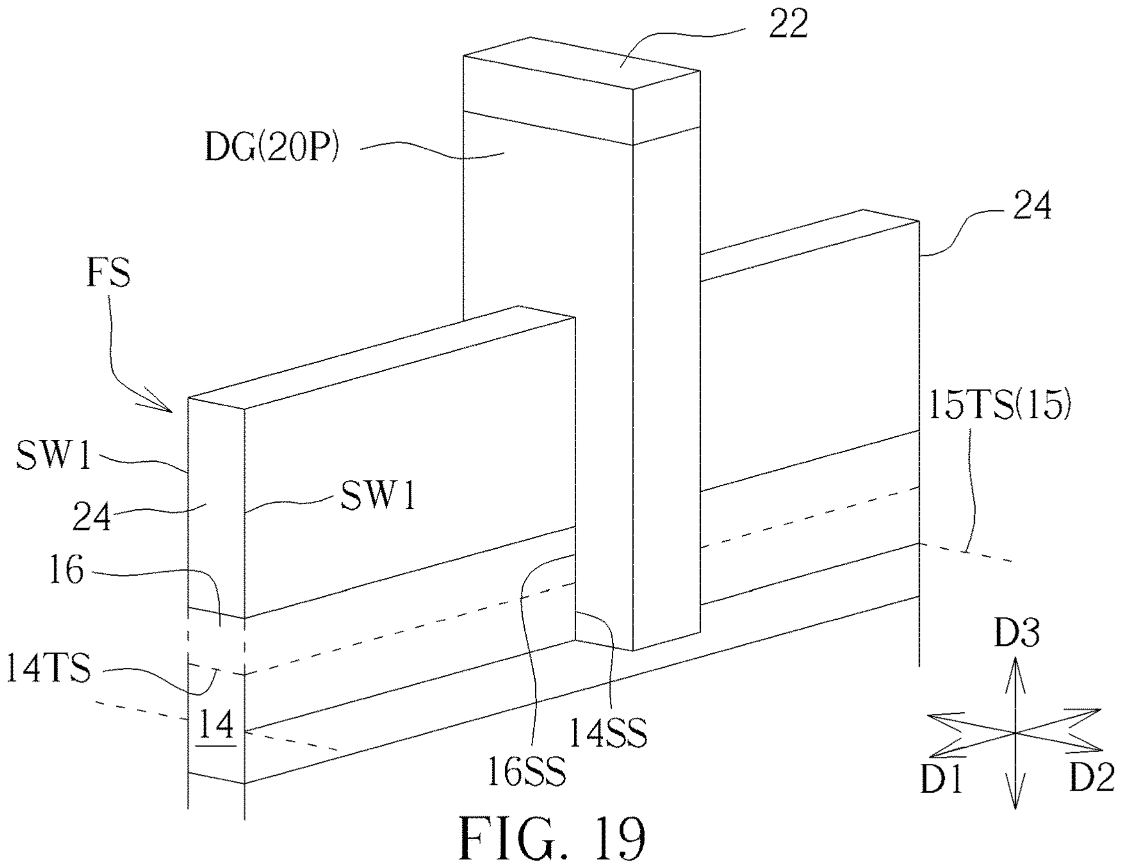

FIGS. 17-19 are stereoscopic schematic drawings illustrating a manufacturing method of the semiconductor device 103 according to the third embodiment of the present invention, wherein FIG. 18 is a stereoscopic schematic drawing in a step subsequent to FIG. 17, FIG. 19 is a stereoscopic schematic drawing in a step subsequent to FIG. 18, and FIG. 15 and FIG. 16 may be regarded as cross-sectional schematic drawings in a step subsequent to FIG. 19. As illustrated in FIG. 17, after the step of forming the isolation structure 15, the top surface 15TS of the isolation structure 15 may be lower than the top surface 14TS of the first doped region 14 in the fin-shaped structure FS. In some embodiments, the top surface 15TS of the isolation structure 15 may be controlled by an etching back process performed to the isolation structure 15 for recessing the isolation structure 15 and exposing the upper portion of the fin-shaped structure FS and a portion of the first doped region 14. As illustrated in FIG. 18, in some embodiments, the second portion 20B of the patterned material layer 20P may cover the side surface of the intermediate region 16 and a part of the side surface of the first doped region 14 in the second direction D2 during the doping process 92 for forming the second doped region 24. As illustrated in FIG. 18 and FIG. 19, the second portion 20B of the patterned material layer 20P may be removed for forming the dummy gate DG, the dummy gate DG may cover a part of the side surface 16SS of the intermediate region 16 and a part of the side surface 14SS of the first doped region 14 in the second direction D2, and a bottom surface of the dummy gate DG may be lower than the top surface 14TS of the first doped region 14 in the third direction D3. Subsequently, as illustrated in FIGS. 19, 15, and 16, the dummy gate DG may be replaced with the gate structure GS for forming the semiconductor device 103.

It is worth noting that the manufacturing method of the semiconductor device 103 is not limited to the approach described above and other suitable approaches may also be applied in the manufacturing method of the semiconductor device 103. Additionally, the gate structure GS covering a part of the side surface 16SS of the intermediate region 16 and a part of the side surface 14SS of the first doped region 14 in this embodiment may also be applied to other embodiments of the present invention.

Figure 20:
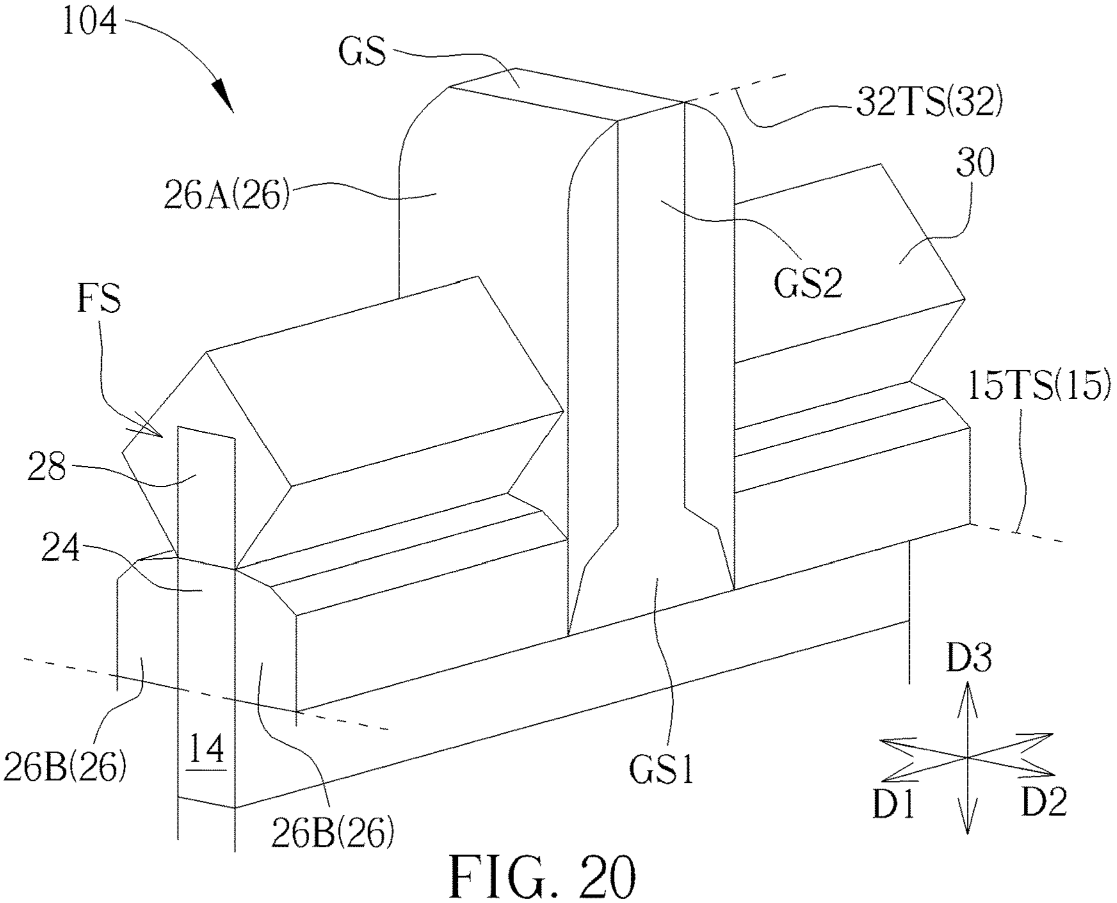
FIG. 20 is a stereoscopic schematic drawing illustrating a semiconductor device according to a fourth embodiment of the present invention.
Figure 21:
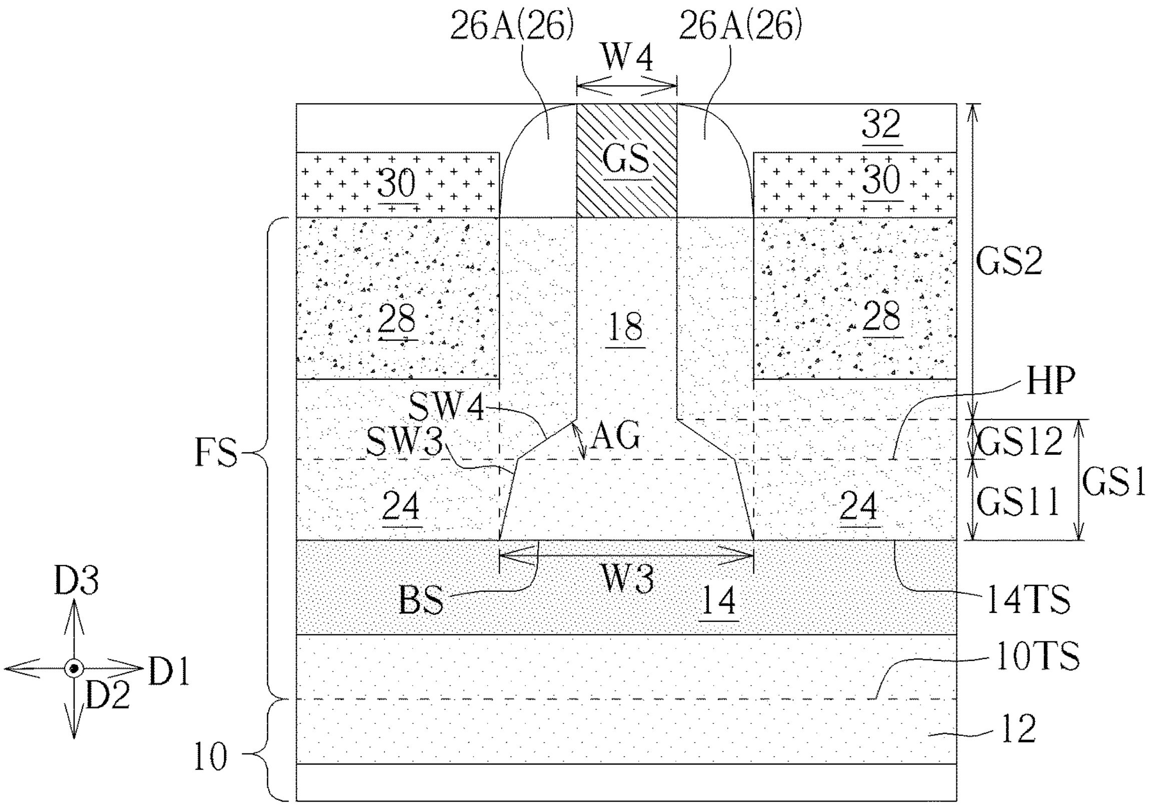
FIG. 21 is a cross-sectional schematic drawing illustrating the semiconductor device according to the fourth embodiment of the present invention.
Figure 22:
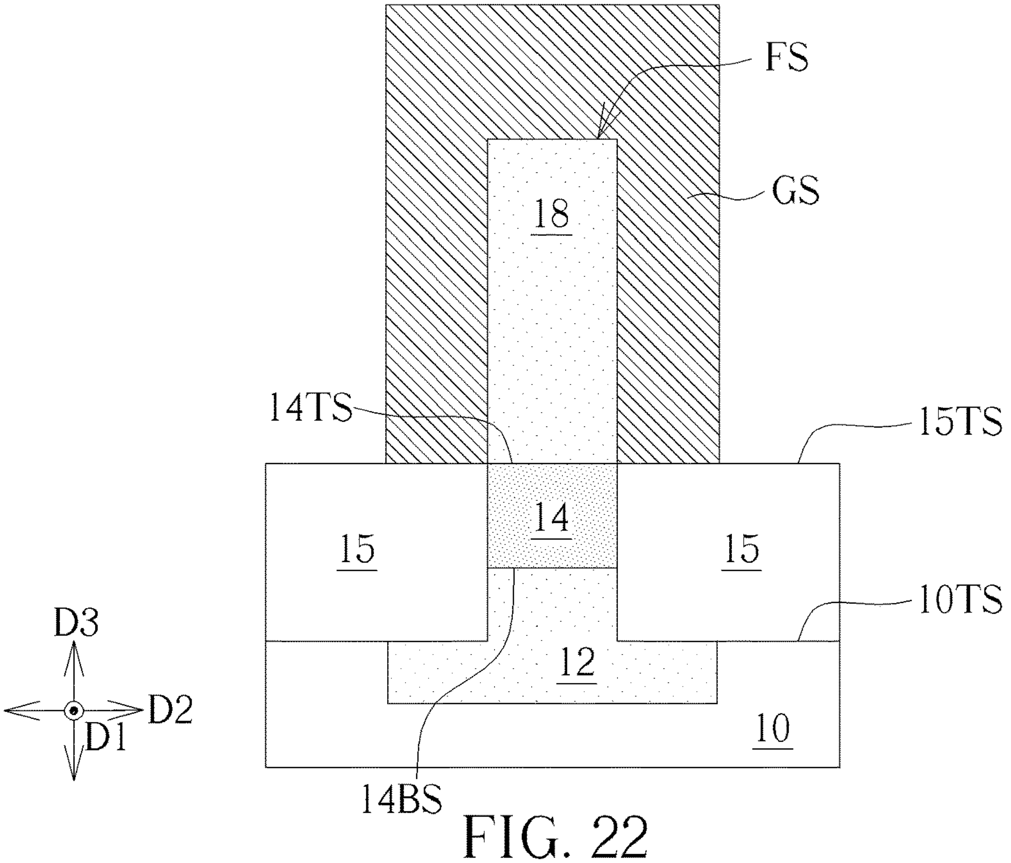
FIG. 22 is a cross-sectional schematic drawing illustrating a gate structure in the semiconductor device according to the fourth embodiment of the present invention.

FIG. 20 is a stereoscopic schematic drawing illustrating a semiconductor device 104 according to a fourth embodiment of the present invention, FIG. 21 is a cross-sectional schematic drawing illustrating the semiconductor device 104 in this embodiment, and FIG. 22 is a cross-sectional schematic drawing illustrating the gate structure GS in the semiconductor device 104 according to this embodiment. FIG. 21 may be regarded as a cross-sectional diagram taken alone the elongation direction of the fin-shaped structure FS in the semiconductor device 104 and FIG. 22 may be regarded as cross-sectional diagrams taken alone the direction perpendicular to the elongation direction of the fin-shaped structure FS. As illustrated in FIGS. 20-22, the semiconductor device 104 includes the semiconductor substrate 10, the fin-shaped structure FS, and the gate structure GS. The fin-shaped structure FS is disposed on and extends upwards from the top surface 10TS of the semiconductor substrate 10 in a vertical direction (such as the third direction D3). The gate structure GS is disposed straddling a part of the fin-shaped structure FS, and the gate structure GS includes a first portion GS1 and a second portion GS2 disposed on and directly connected with the first portion GS1 in the third direction D3. A width W3 of the first portion GS1 of the gate structure GS is greater than a width W4 of the second portion GS2 of the gate structure GS. The width W4 of the second portion GS2 may be regarded as a length of the second portion GS2 in the first direction D1, and the width W3 of the first portion GS1 may be regarded as a length of the first portion GS1 in the first direction D1, such as the maximum length of the first portion GS1 in the first direction D1, but not limited thereto.

In some embodiments, the first portion GS1 of the gate structure GS may include a lower part GS11 and an upper part GS12 directly connected with the lower part GS11, a slope of a sidewall SW3 of the lower part GS11 may be different from a slope of a sidewall SW4 of the upper part GS12, and the width of the first portion GS1 of the gate structure GS may be gradually changed in the first direction D3, but not limited thereto. For example, the slope of the sidewall SW3 of the lower part GS11 may be greater than the slope of the sidewall SW4 of the upper part GS12, and the width of the first portion GS1 of the gate structure GS may be gradually reduced from the bottom surface BS of the gate structure GS to the interface between the first portion GS1 and the second portion GS2. In some embodiments, an included angle between the sidewall SW3 of the lower part GS11 and the bottom surface BS of the gate structure GS may be greater than an included angle AG between the sidewall SW4 of the upper part GS12 and a horizontal plane HP parallel to the top surface 10TS of the semiconductor substrate 10 for increasing the area of the fin-shaped structure FS covered by the first portion GS1 of the gate structure GS. For example, the included angle AG between the sidewall SW4 of the upper part GS12 and the horizontal plane HP may be less than 45 degrees, and the included angle between the sidewall SW3 of the lower part GS11 and the bottom surface BS of the gate structure GS may be greater than 45 degrees and less than 90 degrees, but not limited thereto. In some embodiments, the sidewall of the first portion GS1 may be a curved surface and have a width gradually reduced from the bottom surface BS of the gate structure GS to the interface between the first portion GS1 and the second portion GS2. In addition, a length of the second portion GS2 in the third direction D3 may be greater than a length of the first portion GS1 in the third direction D3, and a slope of the sidewall of the second portion GS2 may be greater than the slope of the sidewall SW3 of the lower part GS11. Therefore, the change rate of the width of the second portion GS2 may be less than that of the first portion GS1 in the third direction D3. In addition, the first portion GS1 of the gate structure GS may include two separated portions disposed at two opposite sides of the fin-shaped structure FS in the second direction D2, respectively, and each of the two separated portions includes the lower part GS11 and the upper part GS12 described above.

Similarly, the semiconductor device 104 may further include the well region 12, the first doped region 14, the isolation structure 15, the channel region 18, the spacer structure 26, the source/drain region 28, the source/drain structure 30, and the dielectric layer 32 described above. At least a part of the first doped region 14 may be disposed in the fin-shaped structure FS. The second doped region 24 may be disposed in the fin-shaped structure FS and disposed above the first doped region 14 in the third direction D3, and the conductivity type of the second doped region 24 may be different from and complementary to the conductivity type of the first doped region 14. The bottom surface BS of the gate structure GS may be lower than or coplanar with the top surface 14TS of the first doped region 14 in the third direction D3. In some embodiments, the second doped region 24 may be directly connected with the first doped region 14, and the first portion GS1 of the gate structure GS may be regarded as an enlarged bottom portion of the gate structure GS for reducing the leakage current between the first doped region 14 and the second doped region 24 and the capacitance between the first doped region 14 and the second doped region 24 because the area of the interface between the second doped region 24 and the first doped region 14 is relatively reduced, a part of the second doped region 24 is separated from the first doped region 14 in the third direction D3 by a part of the channel region 18 covered by the first portion GS1 of the gate structure GS, and/or the impurity concentration in the first doped region 14 may be lowered relatively. In other words, the electrical characteristics of the semiconductor device 104 may be improved by the gate structure GS including the first portion GS1 described above without forming the intermediate region separating the first doped region 14 and the second doped region 24.

Figure 23:
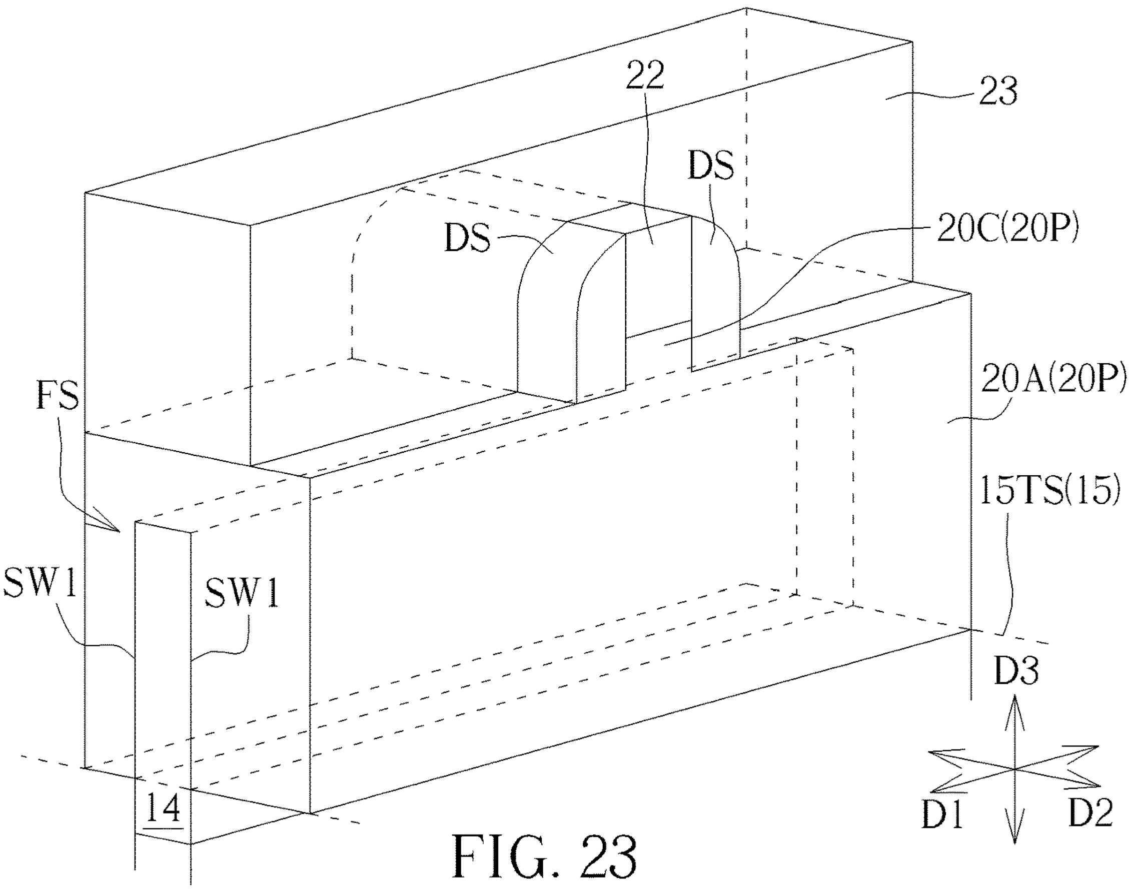
Figure 24:
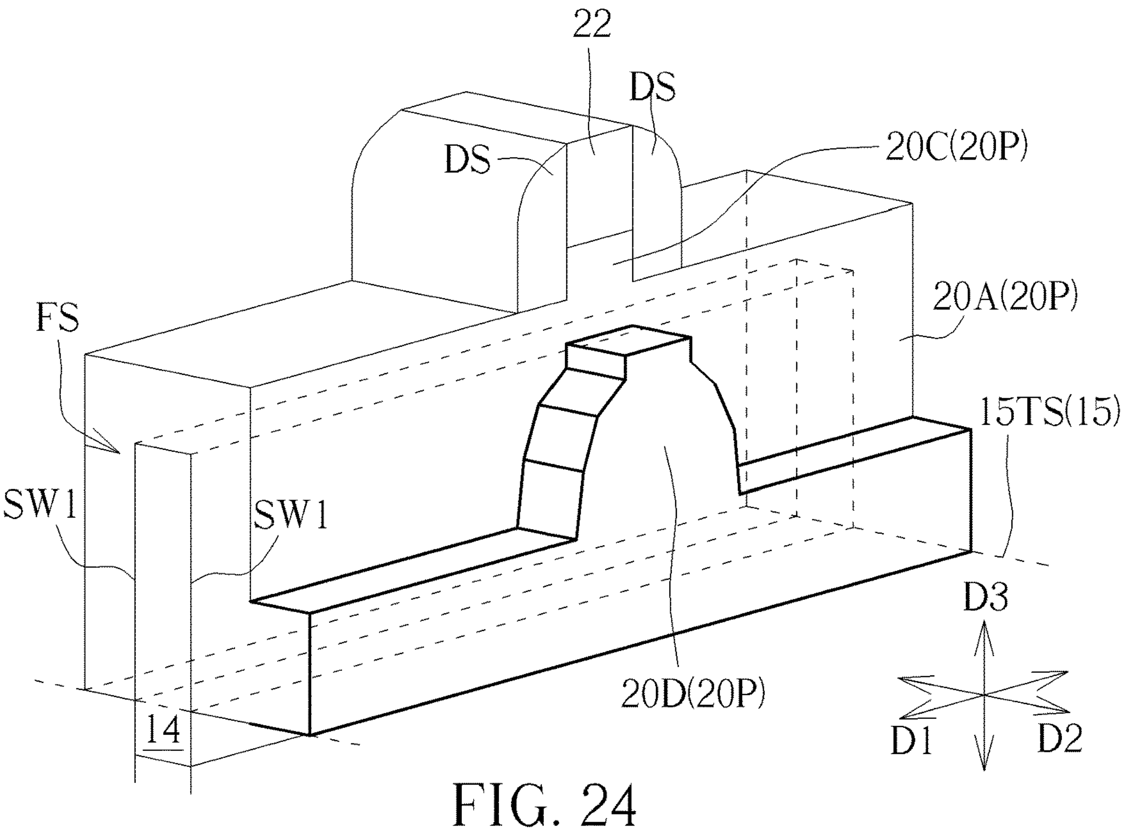
Figure 25:
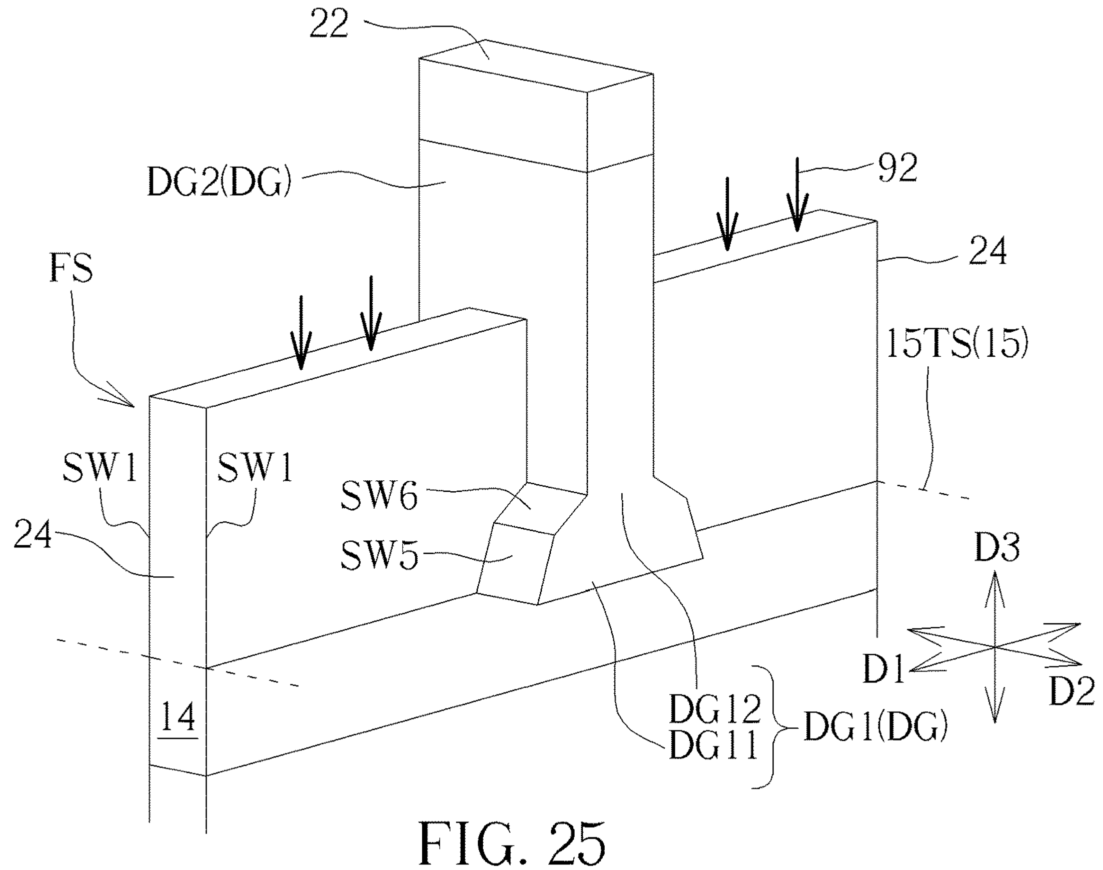
Figure 26:
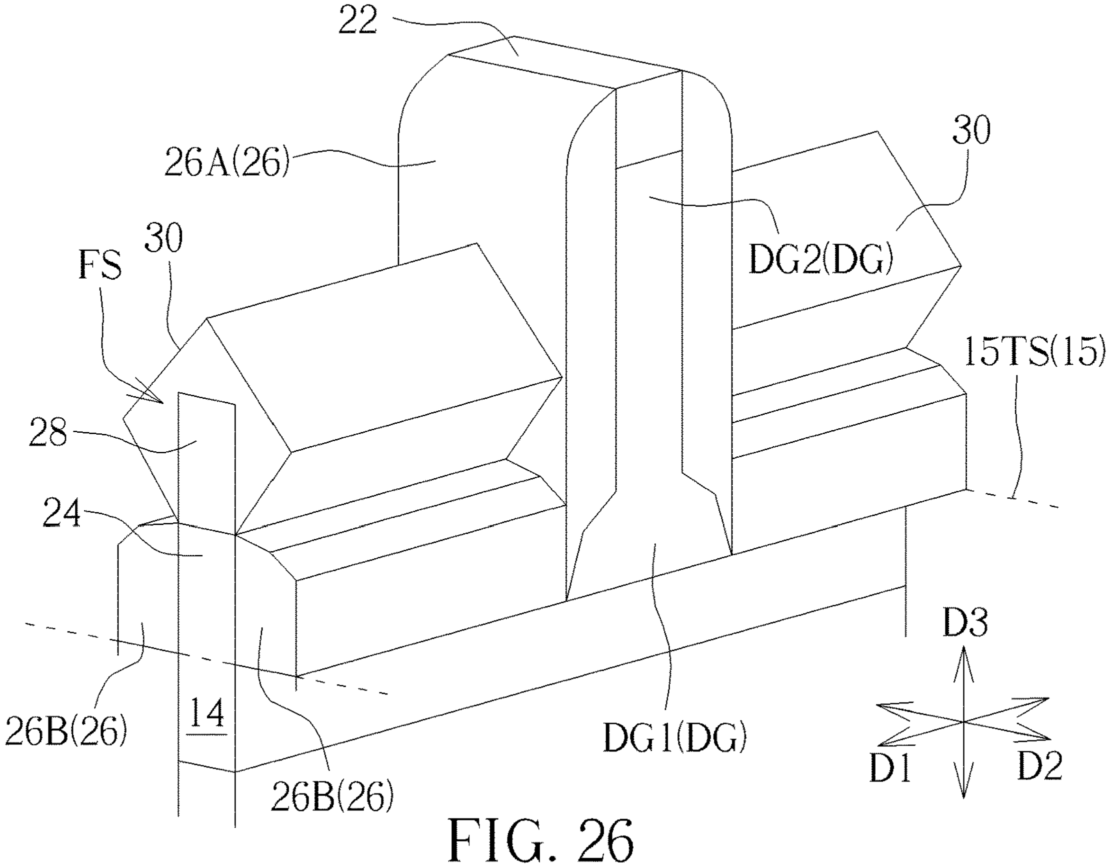

FIGS. 23-26 are stereoscopic schematic drawings illustrating a manufacturing method of the semiconductor device 104 according to the fourth embodiment of the present invention, wherein FIG. 24 is a stereoscopic schematic drawing in a step subsequent to FIG. 23, FIG. 25 is a stereoscopic schematic drawing in a step subsequent to FIG. 24, FIG. 26 is a stereoscopic schematic drawing in a step subsequent to FIG. 25, and FIG. 20 may be regarded as a stereoscopic schematic drawing in a step subsequent to FIG. 26. As illustrated in FIGS. 20-22, a manufacturing method of the semiconductor device 104 may include the following steps. The fin-shaped structure FS is formed on the semiconductor substrate 10, and the fin-shaped structure FS extends upwards from the top surface 10TS of the semiconductor substrate 10 in a vertical direction (such as the third direction D3). The gate structure GS is formed straddling a part of the fin-shaped structure FS, and the gate structure GS includes the first portion GS1 and the second portion GS2 disposed on the first portion GS1. The width W3 of the first portion GS1 is greater than the width W4 of the second portion GS2.

Specifically, the manufacturing method of the semiconductor device 104 in this embodiment may include but is not limited to the following steps. As illustrated in FIG. 25 the dummy gate DG is formed straddling a part of the fin-shaped structure FS. The dummy gate DG in this embodiment may include a first portion DG1 and a second portion DG2 disposed on the first portion DG1, and a width of the first portion DG1 of the dummy gate DG may be greater than a width of the second portion DG2 of the dummy gate DG. Additionally, the first portion DG1 of the dummy gate DG may include a lower part DG11 and an upper part DG12, and a slope of a sidewall SW5 of the lower part DG11 may be different from a slope of a sidewall SW6 of the upper part DG12. In some embodiments, the shape of the dummy gate DG may be substantially identical to that of the gate structure described above (such as the shape of the gate structure GS represented in FIGS. 20-22). In other words, as illustrated in FIG. 25 and FIGS. 20-22, the shape and the dimension of the first portion DG1 of the dummy gate DG may be identical to or similar to those of the first portion GS1 of the gate structure GS, and the shape and the dimension of the second portion DG2 of the dummy gate DG may be identical to or similar to those of the second portion GS2 of the gate structure GS. As illustrated in FIG. 25, at least a part of the first doped region 14 may be located in the fin-shaped structure FS, and the second doped region 24 may be formed in the fin-shaped structure FS by the doping process 92 after the step of forming the dummy gate DG. The second doped region 24 may be located above the first doped region 14 in the third direction D3, and the conductivity type of the second doped region 24 may be different from and complementary to the conductivity type of the first doped region 14.

In some embodiments, a method of forming the dummy gate DG including the first portion DG1 and the second portion DG2 described above may include but is not limited to the following steps. As illustrated in FIG. 23, the patterned material layer 20P may be formed on the semiconductor substrate after the step of forming the fin-shaped structure FS. In some embodiments, the patterned material layer 20P may include the first portion 20A disposed straddling the fin-shaped structure FS and a third portion 20C disposed on the first portion 20A, and the mask layer 22 may be disposed on the third portion 20C of the patterned material layer 20P. In addition, a dummy spacer DS may be formed on sidewalls of the third portion 20C and sidewalls of the mask layer 22, and a patterned mask layer 23 may be formed covering a part of the first portion 20A, a part of the dummy spacer DS, and a part of the mask layer 22. In some embodiments, the dummy spacer DS may include an insulation material, such as silicon nitride, or other suitable insulation materials, and the patterned mask layer 23 may include photoresist or other suitable mask materials. In some embodiments, the material composition of the dummy spacer DS may be identical to or similar to the material composition of the patterned material layer 20P for being etched in subsequent etching processes, but not limited thereto. Subsequently, as illustrated in FIG. 23 and FIG. 24, an etching process may be performed to the patterned material layer 20P, the dummy spacer DS, and the mask layer 22 with the patterned mask layer 23 as an etching mask for removing the exposed portion of the dummy spacer DS, the exposed portion of the mask layer 22, the third portion 20C of the patterned material layer 20P, and a part of the exposed portion of the first portion 20A of the patterned material layer 20P and forming a fourth portion 20D in the patterned material layer 20P. The patterned mask layer 23 may be removed after the etching process described above. The shape of the fourth portion 20D may be similar to the shape of the exposed portion of the dummy spacer DS and the exposed portion of the mask layer 22 before the etching process, and the etching process may be regarded as a process for transferring the shape of the exposed portion of the dummy spacer DS and the exposed portion of the mask layer 22 into the patterned material layer 20P, but not limited thereto.

Subsequently, as illustrated in FIG. 24 and FIG. 25, another etching process may be performed to the patterned material layer 20P including the first portion 20A, the third portion 20C, and the fourth portion 20D with the mask layer 22 as an etching mask, and the patterned material layer 20P may be etched to be the dummy gate DG including the first portion DG1 and the second portion DG2 described above by the etching process. After the step of forming the dummy gate DG, the second doped region 24 may be formed in the fin-shaped structure FS, and a portion of the fin-shaped structure FS covered by the dummy gate DG may be the channel region described above. As illustrated in FIG. 25 and FIG. 26, the spacer structure 26 may be formed after the step of forming the second doped region 24, a part of the second portion 26B of the spacer structure 26 may be etched back for exposing an upper portion of the fin-shaped structure FS, and the source/drain structure 30 may be formed on the exposed fin-shaped structure FS by an epitaxial growth process or other suitable approaches. In some embodiments, the source/drain structure 30 may be doped in-situ during the process of forming the source/drain structure 30, and the source/drain region 28 may be formed concurrently by the process, but not limited thereto. Instead of in-situ doping process described above, the source/drain structure 30 and the source/drain region 28 may be doped by ion implantation process after forming the source/drain structure 30. Subsequently, as illustrated in FIG. 26 and FIG. 20, the dielectric layer 32 may be formed and the dummy gate DG may be replaced with the gate structure GS by a RMG process, but not limited thereto.

It is worth noting that the manufacturing method of the semiconductor device 104 is not limited to the approach described above and other suitable approaches may also be applied in the manufacturing method of the semiconductor device 104 according to the present invention. Additionally, the gate structure GS including the first portion GS1 and the second portion GS2 in this embodiment may also be applied to other embodiments of the present invention.

Figure 27:
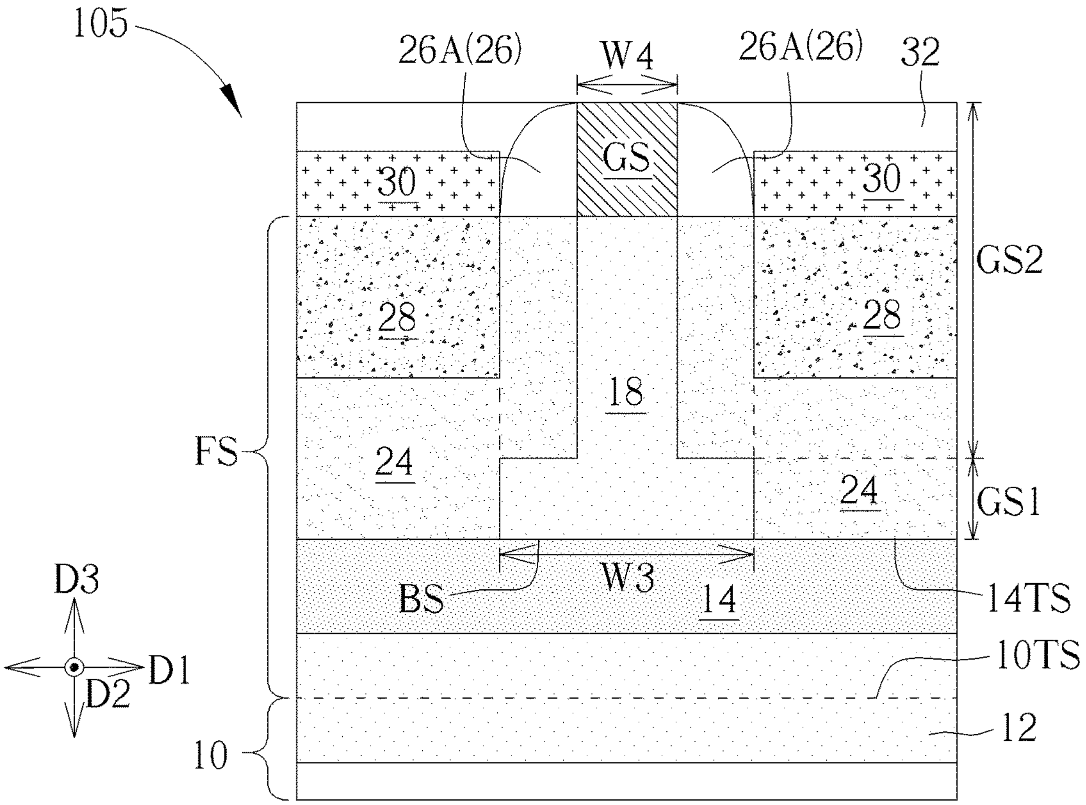
FIG. 27 is a cross-sectional schematic drawing illustrating a semiconductor device according to a fifth embodiment of the present invention.

FIG. 27 is a stereoscopic schematic drawing illustrating a semiconductor device 105 according to a fifth embodiment of the present invention. As illustrated in FIG. 27, in the semiconductor device 105, the gate structure GS includes the first portion GS1 and the second portion GS2 disposed on and directly connected with the first portion GS1 in the third direction D3. The width W3 of the first portion GS1 of the gate structure GS is greater than the width W4 of the second portion GS2 of the gate structure GS. In some embodiments, the included angle between the sidewall of the first portion GS1 and the bottom surface BS of the gate structure GS may be about 90 degrees, and the gate width may be sharply increased from the interface between the second portion GS2 and the first portion GS1 to the first portion GS1. In other words, the change rate of the gate width from first portion GS1 to the interface between the second portion GS2 and the first portion GS1 may be greater than that of the second portion GS2 in the third direction D3. The first portion GS1 of the gate structure GS may be regarded as an enlarged bottom portion of the gate structure GS for reducing the leakage current between the first doped region 14 and the second doped region 24 and the capacitance between the first doped region 14 and the second doped region 24 because the area of the interface between the second doped region 24 and the first doped region 14 is relatively reduced and/or the impurity concentration in the first doped region 14 may be lowered relatively.

Figure 28:
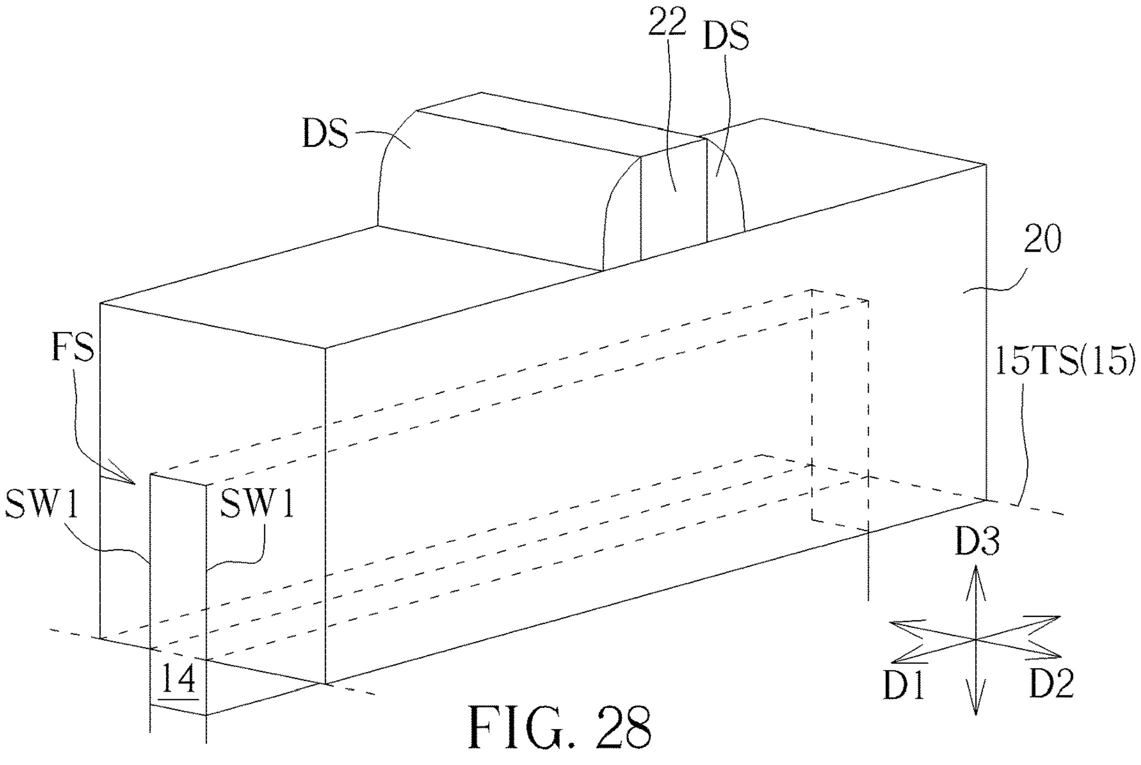
Figure 29:
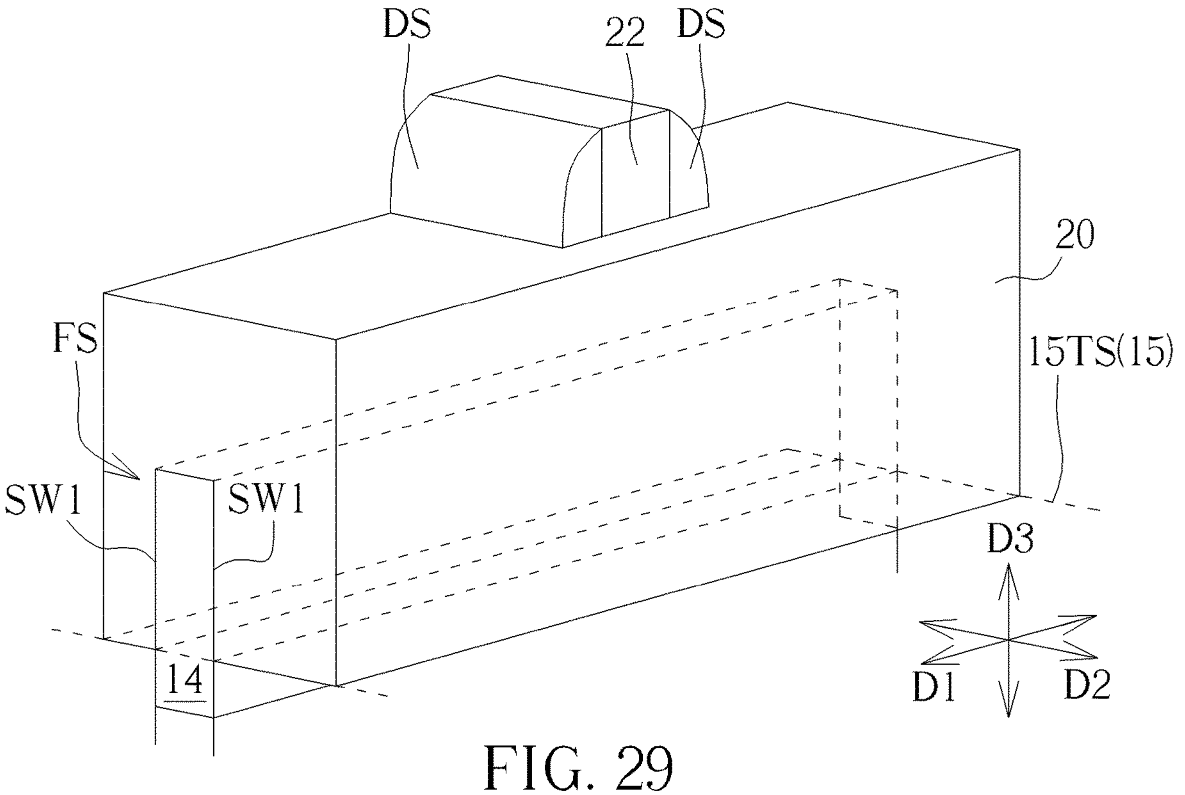
Figure 30:
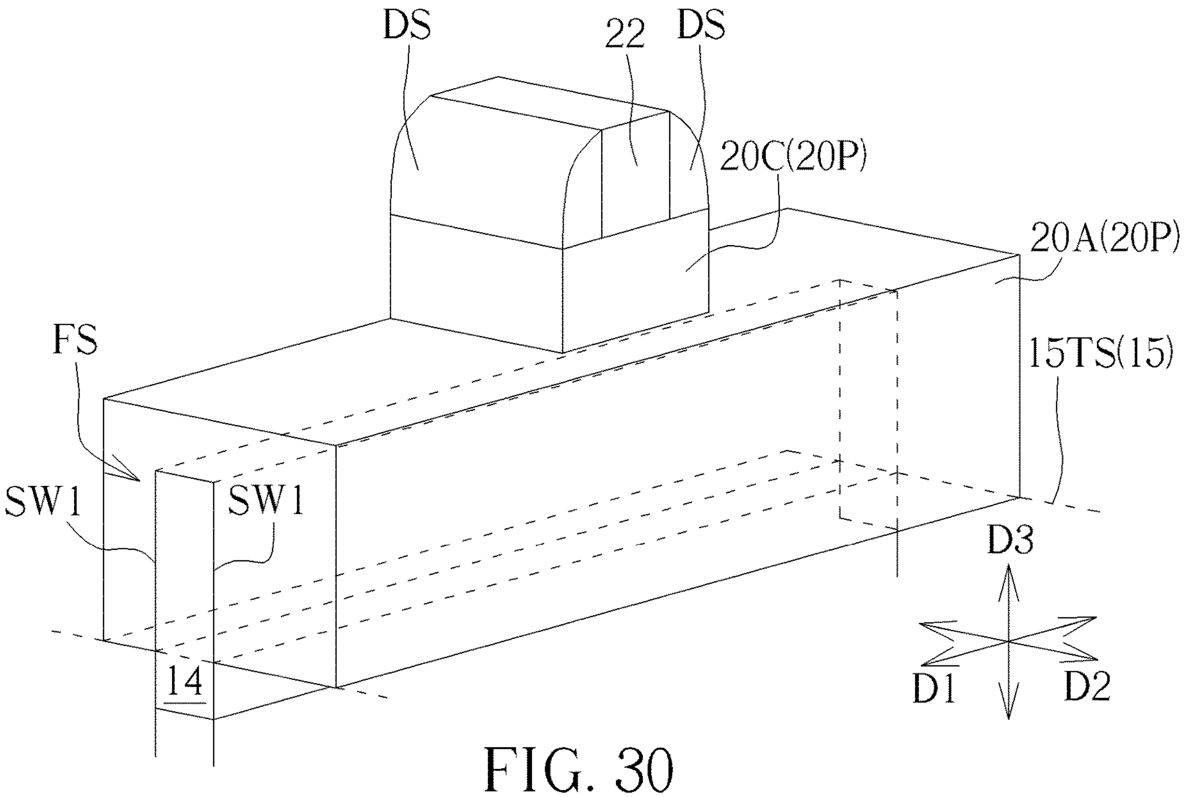
Figure 31:
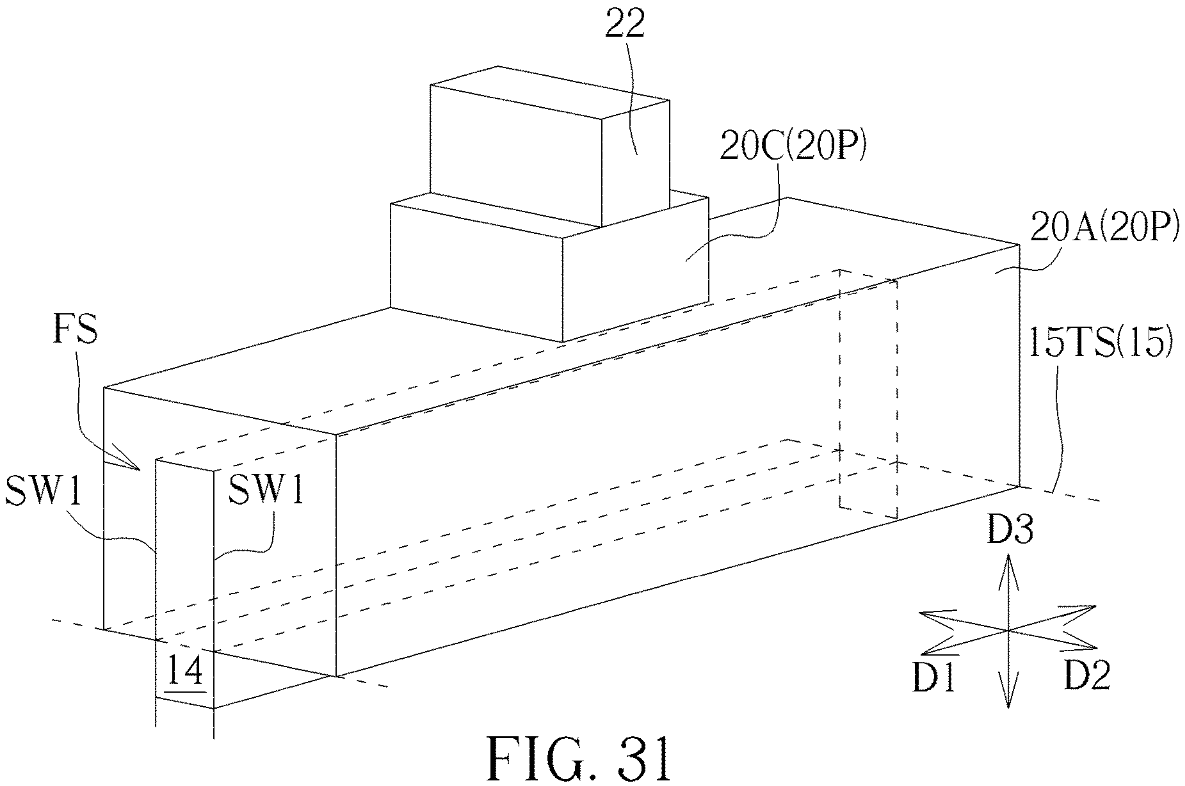
Figure 32:
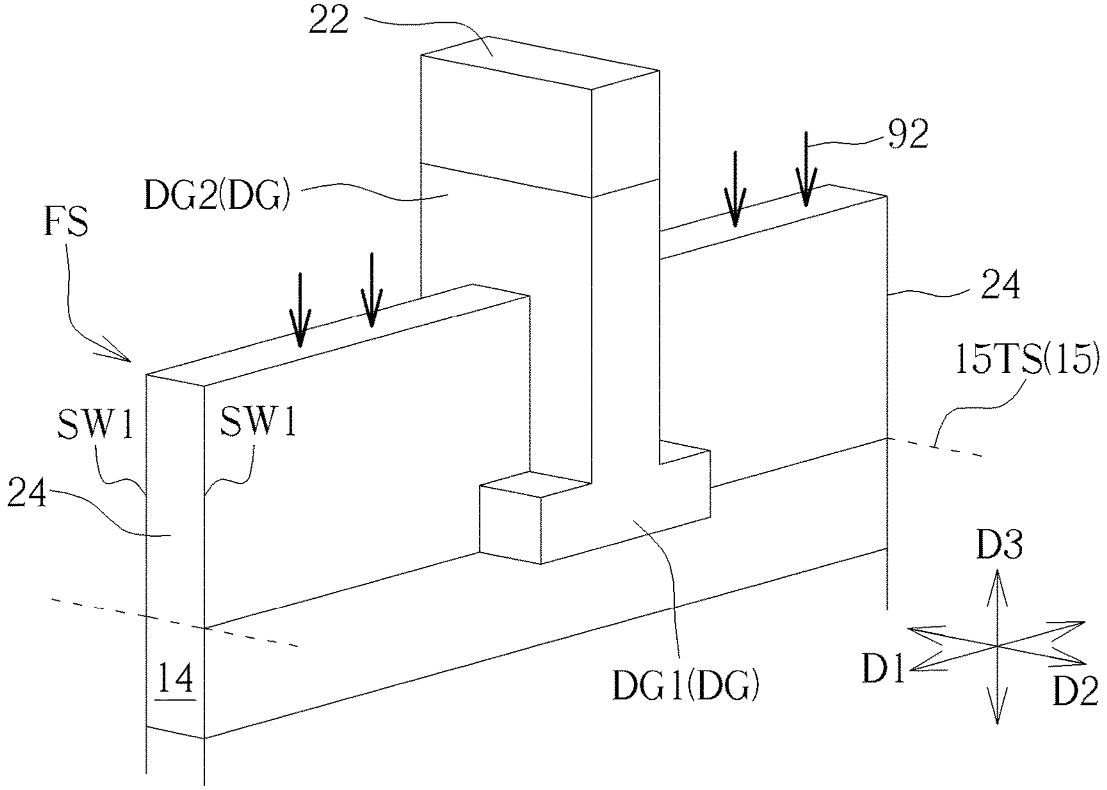

FIGS. 28-32 are stereoscopic schematic drawings illustrating a manufacturing method of the semiconductor device 105 according to the fifth embodiment of the present invention, wherein FIG. 29 is a stereoscopic schematic drawing in a step subsequent to FIG. 28, FIG. 30 is a stereoscopic schematic drawing in a step subsequent to FIG. 29, FIG. 31 is a stereoscopic schematic drawing in a step subsequent to FIG. 30, FIG. 32 is a stereoscopic schematic drawing in a step subsequent to FIG. 31, and FIG. 27 may be regarded as a cross-sectional schematic drawing in a step subsequent to FIG. 32. As illustrated in FIG. 32, the dummy gate DG is formed straddling a part of the fin-shaped structure FS. The dummy gate DG in this embodiment may include the first portion DG1 and the second portion DG2 disposed on the first portion DG1, and a width of the first portion DG1 of the dummy gate DG may be greater than a width of the second portion DG2 of the dummy gate DG. In some embodiments, the shape of the dummy gate DG may be substantially identical to that of the gate structure described above (such as the shape of the gate structure GS represented in FIG. 27). In other words, as illustrated in FIG. 32 and FIG. 27, the shape and the dimension of the first portion DG1 of the dummy gate DG may be identical to or similar to those of the first portion GS1 of the gate structure GS, and the shape and the dimension of the second portion DG2 of the dummy gate DG may be identical to or similar to those of the second portion GS2 of the gate structure GS. As illustrated in FIG. 32, at least a part of the first doped region 14 may be located in the fin-shaped structure FS, the second doped region 24 may be formed in the fin-shaped structure FS by the doping process 92 after the step of forming the dummy gate DG, and a portion of the fin-shaped structure FS covered by the dummy gate DG may be the channel region described above.

In some embodiments, a method of forming the dummy gate DG including the first portion DG1 and the second portion DG2 described above may include but is not limited to the following steps. As illustrated in FIG. 28, a material layer 20 may be formed on the semiconductor substrate and cover the fin-shaped structure FS after the step of forming the fin-shaped structure FS. The material layer 20 may include a silicon-containing material, such as polysilicon, amorphous silicon, or other suitable materials. Subsequently, the mask layer 22 may be formed on the material layer 20, and the dummy spacer DS may be formed on the material layer 20 and sidewalls of the mask layer 22. In some embodiments, the material composition of the dummy spacer DS may be different from the material composition of the mask layer 22 and the material composition of the material layer 20 for the etching selectivity concerned in subsequent etching steps. For example, in some embodiments, the material of the dummy spacer DS may be silicon nitride, the material of the mask layer 22 may be silicon oxide, and the material layer 20 may be a polysilicon layer, but not limited thereto. In some embodiments, as illustrated in FIG. 28 and FIG. 29, an etching process may be performed to the dummy spacer DS and the mask layer 22 for removing a part of the dummy spacer DS and a part of the mask layer 22 and adjusting the length of the dummy spacer DS and the mask layer 22 in the second direction D2 and/or the area of a portion of the material layer 20 overlapped by the dummy spacer DS and the mask layer 22 in the third direction D3.

Subsequently, as illustrated in FIG. 29 and FIG. 30, another etching process may be performed to the material layer 20 with the mask layer 22 and the dummy spacer DS as an etching mask for forming the patterned material layer 20P including the first portion 20A and the third portion 20C. In other words, the material layer 20 may be patterned to be the patterned material layer 20P by the etching process using the mask layer 22 and the dummy spacer DS as the etching mask. As illustrated in FIGS. 30-32, the dummy spacer DS may be removed after the step of forming the patterned material layer 20P, and an etching process may be performed to the patterned material layer 20P including the first portion 20A and the third portion 20C with the mask layer 22 as an etching mask for forming the dummy gate DG including the first portion DG1 and the second portion DG2 represented in FIG. 32. In some embodiments, the etching process may be regarded as a process for transferring the shape of the third portion 20C to the first portion DG1 of the dummy gate DG, but not limited thereto. After the step of forming the dummy gate DG, the second doped region 24 may be formed in the fin-shaped structure FS by performing the doping process 92. As illustrated in FIG. 32 and FIG. 27, the spacer structure 26, the source/drain structure 30, the source/drain region 28, and the dielectric layer 32 may be formed after the step of forming the second doped region 24, and the dummy gate DG may be replaced with the gate structure GS by a RMG process for forming the semiconductor device 105 represented in FIG. 27.

It is worth noting that the manufacturing method of the semiconductor device 105 is not limited to the approach described above and other suitable approaches may also be applied in the manufacturing method of the semiconductor device 105 according to the present invention. Additionally, the gate structure GS including the first portion GS1 and the second portion GS2 in this embodiment may also be applied to other embodiments of the present invention.

Figure 33:
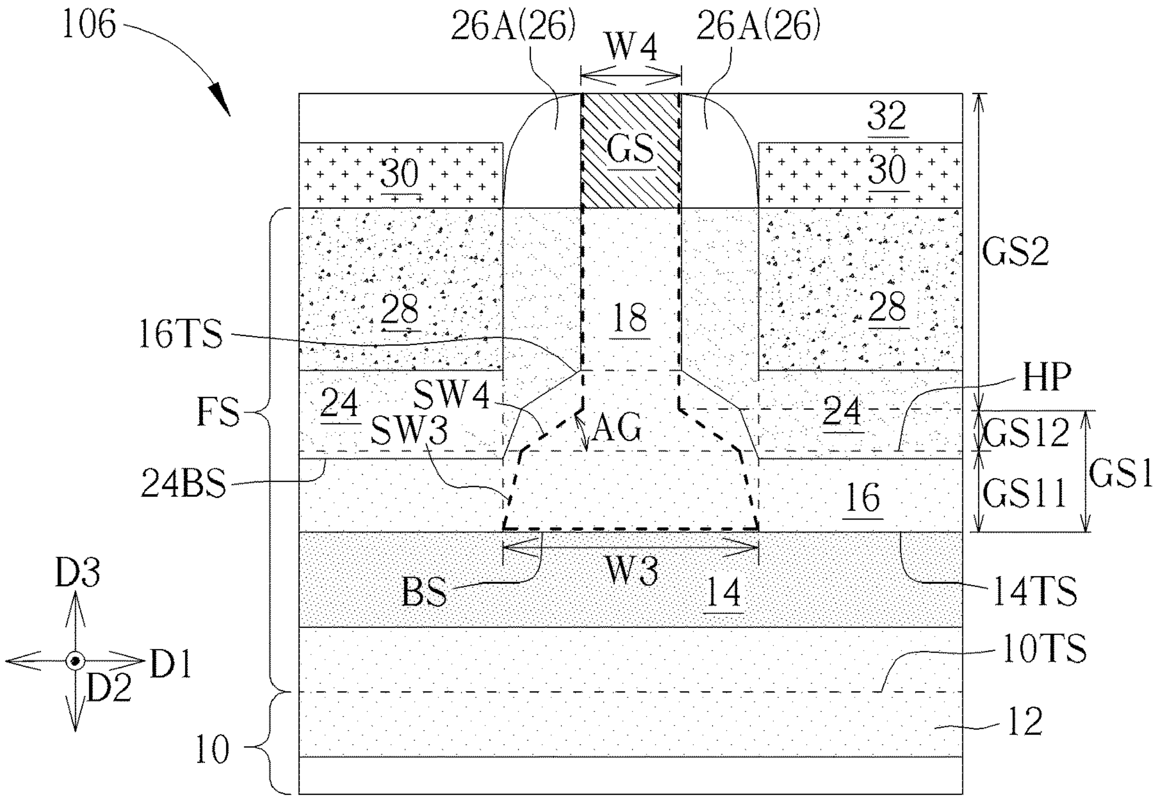
FIG. 33 is a cross-sectional schematic drawing illustrating a semiconductor device according to a sixth embodiment of the present invention.

FIG. 33 is a cross-sectional schematic drawing illustrating a semiconductor device 106 according to a sixth embodiment of the present invention. As illustrated in FIG. 33, in the semiconductor device 106, the gate structure GS may include the first portion GS1 and the second portion GS2, and the first portion GS1 may include the lower part GS11 and the upper part GS12 described above. In other words, the gate structure GS in this embodiment may be identical or at least similar to the gate structure GS represented in FIGS. 20-22 described above. In addition, the semiconductor device 106 may further include the intermediate region 16 disposed in the fin-shaped structure FS, and the second doped region 24 may be separated from the first doped region 14 by the intermediate region 16. The conductivity type of the intermediate region 16 may be identical to the conductivity type of the first doped region 14, and the impurity concentration in the first doped region 14 may be higher than the impurity concentration in the intermediate region 16. The bottom surface BS of the gate structure GS is lower than or coplanar with the top surface 14TS of the first doped region 14 in the third direction D3, and a part of the intermediate region 16 located between the channel region 18 and the first doped region 14 and a part of the intermediate region 16 located between the second doped region 24 and the first doped region 14 may be covered by the gate structure GS in the second direction D2. In some embodiments, the shape of the intermediate region 16 is influenced by the process of forming the gate structure GS, and the intermediate region 16 may include an upper portion having a shape similar to the shape of the first portion GS1 of the gate structure GS, but not limited thereto. Accordingly, the top surface 16TS of the intermediate region 16 (such as the topmost surface of the intermediate region 16)

may be higher than the bottom surface 24BS of the second doped region 24 (such as the bottommost surface of the second doped region 24) in the third direction D3.

In this embodiment, the intermediate region 16 with relatively lower impurity concentration disposed between the first doped region 14 and the second doped region 24 may be used to reduce leakage current between the first doped region 14 and the second doped region 24 and/or capacitance between the first doped region 14 and the second doped region 24. Additionally, the first portion GS1 of the gate structure GS may be regarded as an enlarged bottom portion of the gate structure GS for reducing the leakage current between the first doped region 14 and the second doped region 24 and the capacitance between the first doped region 14 and the second doped region 24 because the distance between a part of the second doped region 24 and the first doped region 14 in the third direction D3 is increased by the upper portion of the intermediate region 16, a part of the intermediate region 16 located between the channel region 18 and the first doped region 14 and a part of the intermediate region 16 located between the second doped region 24 and the first doped region 14 are covered by the gate structure GS in the second direction D2, and/or the impurity concentration in the first doped region 14 may be lowered relatively. In other words, the electrical characteristics of the semiconductor device 106 may be improved by the gate structure GS including the first portion GS1 and the second portion GS2 described above and the intermediate region 16 separating the first doped region 14 and the second doped region 24.

Figure 34:
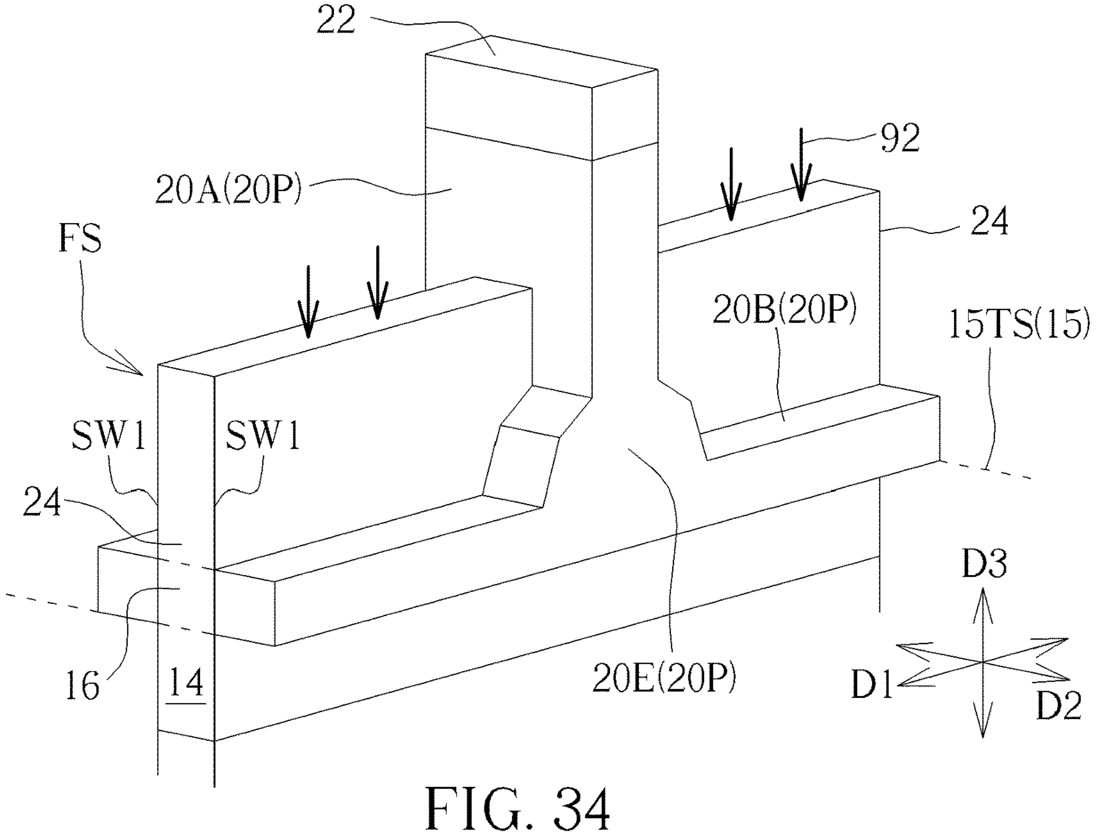
Figure 35:
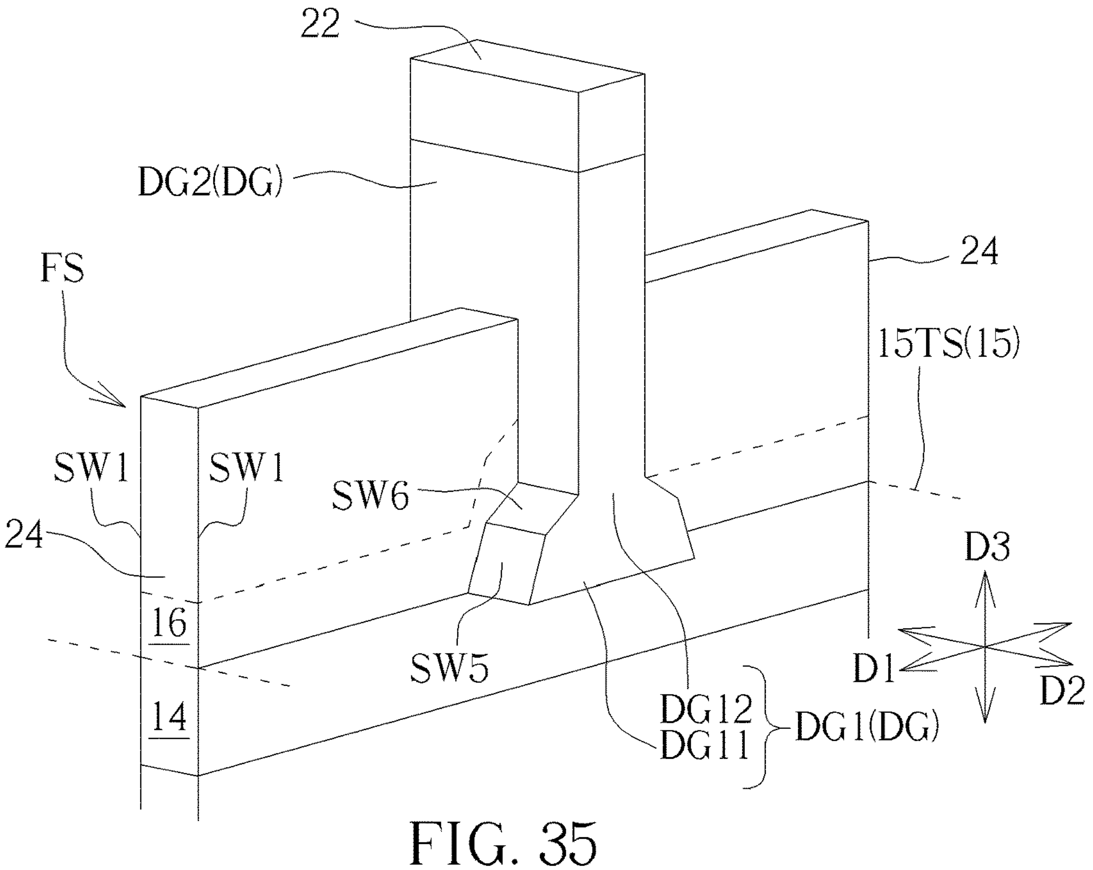

FIG. 34 and FIG. 35 are stereoscopic schematic drawings illustrating a manufacturing method of the semiconductor device 106 according to the sixth embodiment of the present invention, wherein FIG. 35 is a stereoscopic schematic drawing in a step subsequent to FIG. 34, and FIG. 33 may be regarded as a cross-sectional schematic drawing in a step subsequent to FIG. 35. As illustrated in FIG. 34, the patterned material layer 20P may include the first portion 20A, the second portion 20B, and a fifth portion 20E located between the first portion 20A and the second portion 20B in the third direction D3. The first portion 20A may be disposed straddling the fin-shaped structure FS, and the second portion 20B may cover a part of the sidewall SW1 of the fin-shaped structure FS. In some embodiments, the shape of the fifth portion 20E may be similar to the shape of the first portion DG1 represented in FIG. 25 described above, and the method of forming the patterned material layer 20P including the first portion 20A, the second portion 20B, and the fifth portion 20E may be similar to the method represented in FIGS. 23-25 described above, but not limited thereto. Subsequently, the second doped region 24 may be formed in the fin-shaped structure FS, and the intermediate region 16 in the fin-shaped structure FS may be covered by the patterned material layer 20P in the second direction D2. As illustrated in FIG. 34 and FIG. 35, after the step of forming the second doped region 24, an etching process may be performed to the patterned material layer 20P, the patterned material layer 20P may be etched to be the dummy gate DG including the first portion DG1 and the second portion DG2 by the etching process, and at least a part of the second portion 20B of the patterned material layer 20P may be removed by the etching process. The dummy gate DG may cover a part of the side surface of the first doped region 14 in the second direction D2, the dummy gate DG may include the first portion DG1 and the second portion DG2 disposed on the first portion DG1, and the width of the first portion DG1 of the dummy gate DG may be greater than the width of the second portion DG2 of the dummy gate DG. Additionally, the first portion DG1 of the dummy gate DG may include the lower part DG11 and the upper part DG12, and the slope of a sidewall SW5 of the lower part DG11 may be different from the slope of a sidewall SW6 of the upper part DG12. In some embodiments, the second doped region 24 in this embodiment may be formed after the step of forming the patterned material layer 20P and before the step of forming the dummy gate DG and the step of removing at least a part of the second portion 20B of the patterned material layer 20P. As illustrated in FIG. 35 and FIG. 33, the spacer structure 26, the source/drain structure 30, the source/drain region 28, and the dielectric layer 32 may be formed after the step of forming the dummy gate DG, and the dummy gate DG may then be replaced with the gate structure GS by a RMG process for forming the semiconductor device 106.

It is worth noting that the manufacturing method of the semiconductor device 106 is not limited to the approach described above and other suitable approaches may also be applied in the manufacturing method of the semiconductor device 106 according to the present invention.

Figure 36:
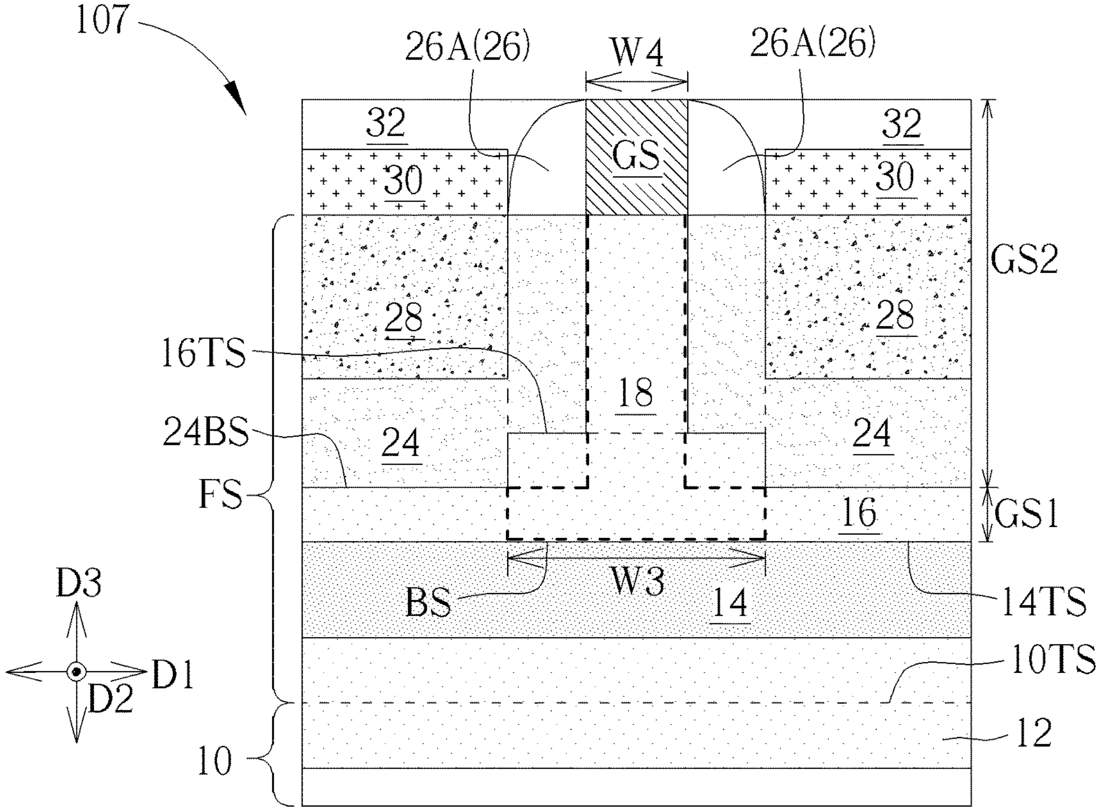
FIG. 36 is a cross-sectional schematic drawing illustrating a semiconductor device according to a seventh embodiment of the present invention.

FIG. 36 is a cross-sectional schematic drawing illustrating a semiconductor device 107 according to a seventh embodiment of the present invention. As illustrated in FIG. 36, in the semiconductor device 107, the gate structure GS may include the first portion GS1 and the second portion GS2, and the gate structure GS in this embodiment may be identical or at least similar to the gate structure GS represented in FIG. 27 described above. In addition, the semiconductor device 107 may further include the intermediate region 16 disposed in the fin-shaped structure FS, and the second doped region 24 may be separated from the first doped region 14 by the intermediate region 16. The conductivity type of the intermediate region 16 may be identical to the conductivity type of the first doped region 14, and the impurity concentration in the first doped region 14 may be higher than the impurity concentration in the intermediate region 16. The bottom surface BS of the gate structure GS is lower than or coplanar with the top surface 14TS of the first doped region 14 in the third direction D3, and a part of the intermediate region 16 located between the channel region 18 and the first doped region 14 and a part of the intermediate region 16 located between the second doped region 24 and the first doped region 14 may be covered by the gate structure GS in the second direction D2. In some embodiments, the shape of the intermediate region 16 is influenced by the process of forming the gate structure GS, and the intermediate region 16 may include an upper portion having a shape similar to the shape of the first portion GS1 of the gate structure GS, but not limited thereto. Accordingly, the top surface 16TS of the intermediate region 16 (such as the topmost surface of the intermediate region 16) may be higher than the bottom surface 24BS of the second doped region 24 (such as the bottommost surface of the second doped region 24) in the third direction D3. The width W3 of the first portion GS1 of the gate structure GS is greater than the width W4 of the second portion GS2 of the gate structure GS, and the gate width may be sharply increased from the interface between the second portion GS2 and the first portion GS1 to the first portion GS1. The electrical characteristics of the semiconductor device 107 may be improved by the gate structure GS including the first portion GS1 and the second portion GS2 described above and the intermediate region 16 separating the first doped region 14 and the second doped region 24.

Figure 37:
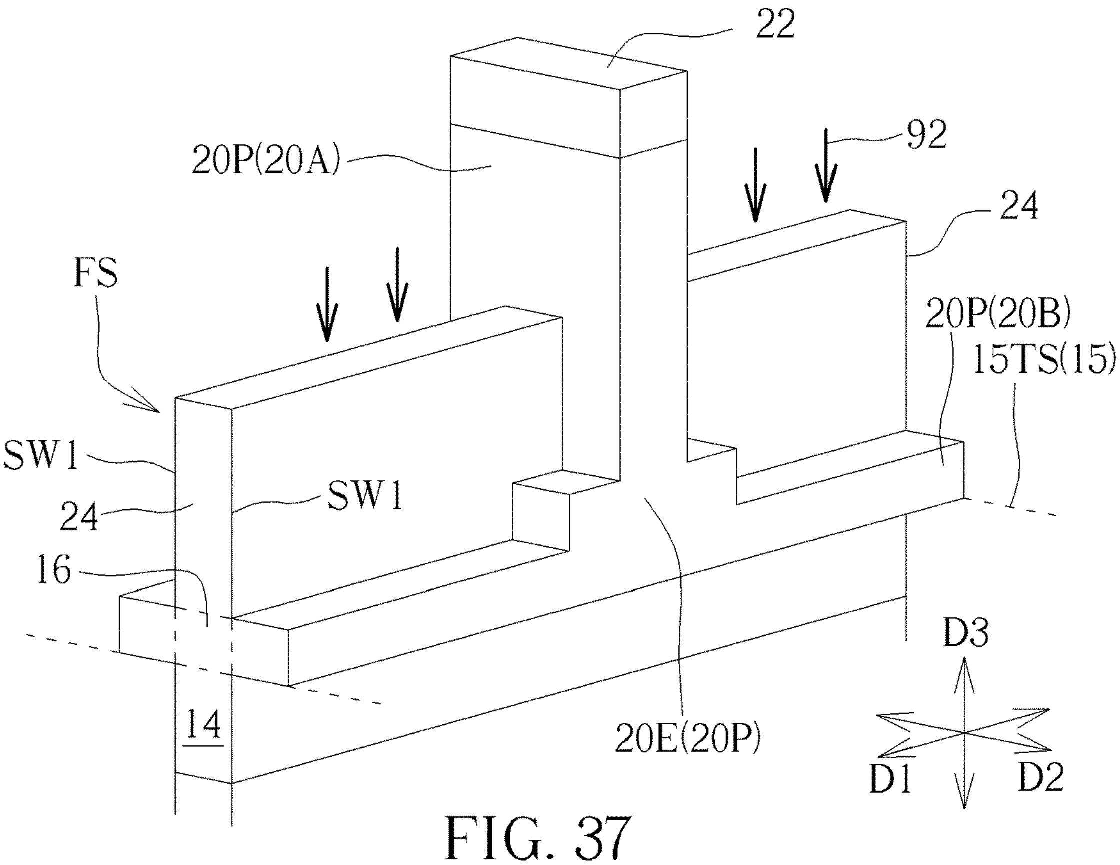
Figure 38:
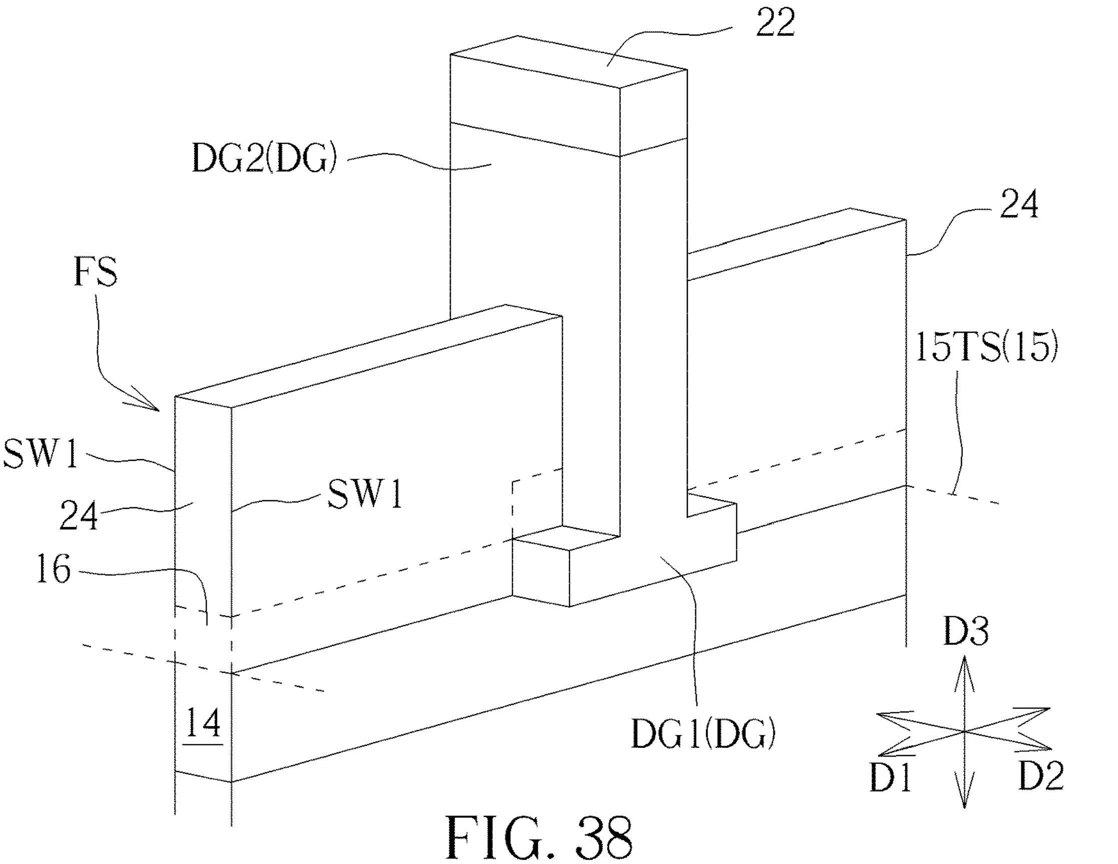

FIG. 37 and FIG. 38 are stereoscopic schematic drawings illustrating a manufacturing method of the semiconductor device 107 according to the seventh embodiment of the present invention, wherein FIG. 38 is a stereoscopic schematic drawing in a step subsequent to FIG. 37, and FIG. 36 may be regarded as a cross-sectional schematic drawing in a step subsequent to FIG. 38. As illustrated in FIG. 37, the patterned material layer 20P may include the first portion 20A, the second portion 20B, and the fifth portion 20E located between the first portion 20A and the second portion 20B in the third direction D3. In some embodiments, the shape of the fifth portion 20E may be similar to the shape of the first portion DG1 of the dummy gate DG represented in FIG. 27 described above, and the method of forming the patterned material layer 20P including the first portion 20A, the second portion 20B, and the fifth portion 20E may be similar to the method represented in FIGS. 28-32 described above, but not limited thereto. Subsequently, the second doped region 24 may be formed in the fin-shaped structure FS, and the intermediate region 16 in the fin-shaped structure FS may be covered by the patterned material layer 20P in the second direction D2. As illustrated in FIG. 37 and FIG. 38, after the step of forming the second doped region 24, an etching process may be performed to the patterned material layer 20P, and the patterned material layer 20P may be etched to be the dummy gate DG including the first portion DG1 and the second portion DG2 by the etching process. Therefore, the second doped region 24 in this embodiment may be formed after the step of forming the patterned material layer 20P and before the step of forming the dummy gate DG. As illustrated in FIG. 38 and FIG. 36, the spacer structure 26, the source/drain structure 30, the source/drain region 28, and the dielectric layer 32 may be formed after the step of forming the dummy gate DG, and the dummy gate DG may then be replaced with the gate structure GS by a RMG process for forming the semiconductor device 107.

It is worth noting that the manufacturing method of the semiconductor device 107 is not limited to the approach described above and other suitable approaches may also be applied in the manufacturing method of the semiconductor device 107 according to the present invention.

In addition, FIG. 33 may be regarded as a cross-sectional schematic drawing illustrating a semiconductor device according to another embodiment of the present invention, FIG. 10 may be regarded as a cross-sectional schematic drawing illustrating the source/drain structure 30 in this embodiment, and FIG. 11 may be regarded as a cross-sectional schematic drawing illustrating the gate structure GS in this semiconductor device. As illustrated in FIG. 33, FIG. 10, and FIG. 11, the fin-shaped structure FS may include the first portion P1, the second portion P2, and the third portion P3 described above. The width W1 of the first portion P1 may be greater than the width W2 of the second portion P2, and the sidewall SW2 of the third portion P3 may be tapered for increasing the area of the fin-shaped structure FS covered by the gate structure GS including the first portion GS1 and the second portion GS2 represented in FIG. 33 described above.

In addition, FIG. 36 may be regarded as a cross-sectional schematic drawing illustrating a semiconductor device according to another embodiment of the present invention, FIG. 10 may be regarded as a cross-sectional schematic drawing illustrating the source/drain structure 30 in this embodiment, and FIG. 11 may be regarded as a cross-sectional schematic drawing illustrating the gate structure GS in this semiconductor device. As illustrated in FIG. 36, FIG. 10, and FIG. 11, the fin-shaped structure FS may include the first portion P1, the second portion P2, and the third portion P3 described above. The width W1 of the first portion P1 may be greater than the width W2 of the second portion P2, and the sidewall SW2 of the third portion P3 may be tapered for increasing the area of the fin-shaped structure FS covered by the gate structure GS including the first portion GS1 and the second portion GS2 represented in FIG. 36 described above.

Figure 39:
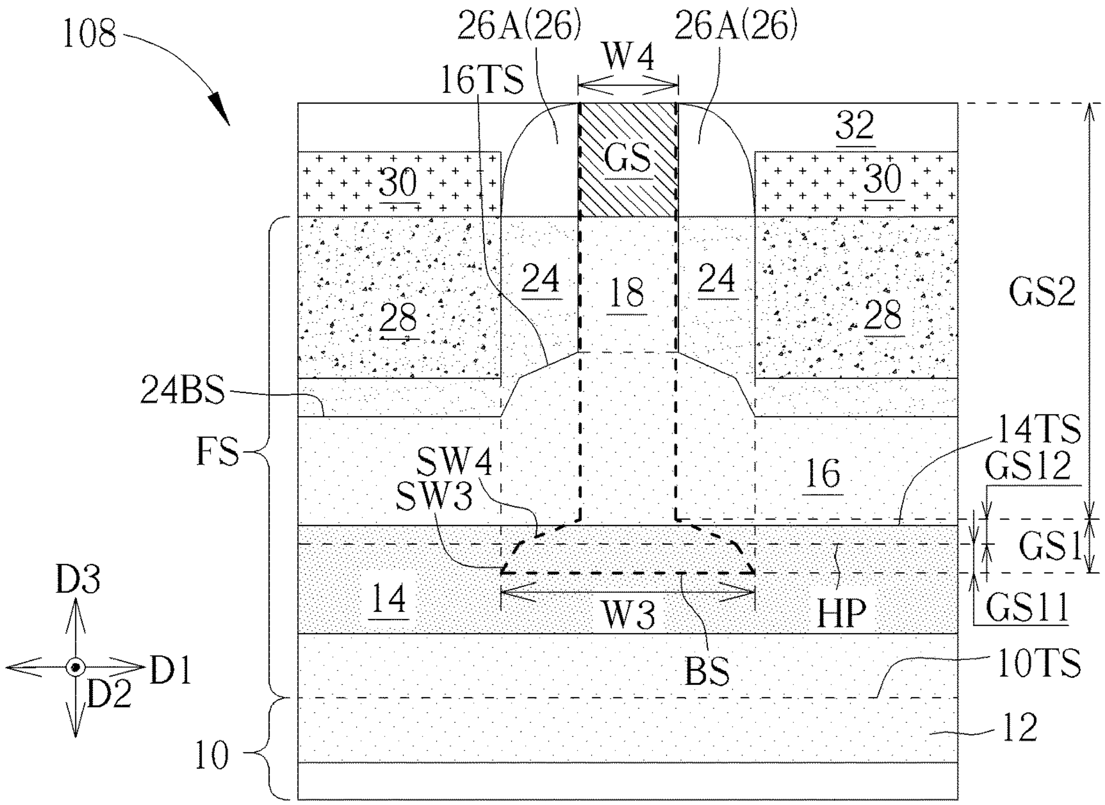
FIG. 39 is a cross-sectional schematic drawing illustrating a semiconductor device according to an eighth embodiment of the present invention.

FIG. 39 is a cross-sectional schematic drawing illustrating a semiconductor device 108 according to an eighth embodiment of the present invention. As illustrated in FIG. 39, in the semiconductor device 108, the bottom surface BS of the gate structure GS may be lower than the top surface 14TS of the first doped region 14 in the third direction D3, and the gate structure GS may cover a part of the side surface of the intermediate region 16 and a part of the side surface of the first doped region 14 in the second direction D2 for ensuring that the intermediate region 16 located between the channel region 18 and the first doped region 14 in the third direction D3 is covered by the gate structure GS in the second direction D2. In some embodiments, a part of the side surface of the first doped region 14 may be covered by the first portion GS1 of the gate structure GS in the second direction D2, and a part of the side surface of the intermediate region 16 may be covered by the second portion GS2 of the gate structure GS in the second direction D2, but not limited thereto. The electrical characteristics of the semiconductor device 108 may be improved by the gate structure GS including the first portion GS1 and the second portion GS2 described above and the intermediate region 16 separating the first doped region 14 and the second doped region 24.

Figure 40:
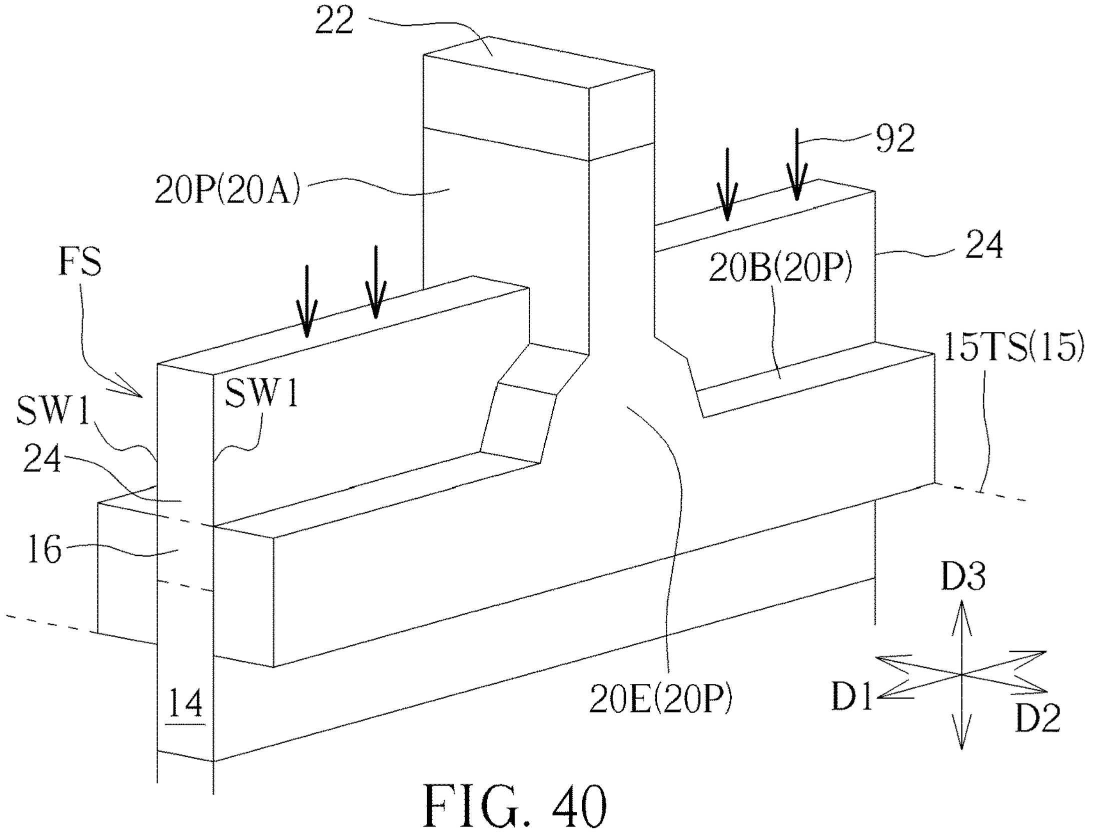
Figure 41:
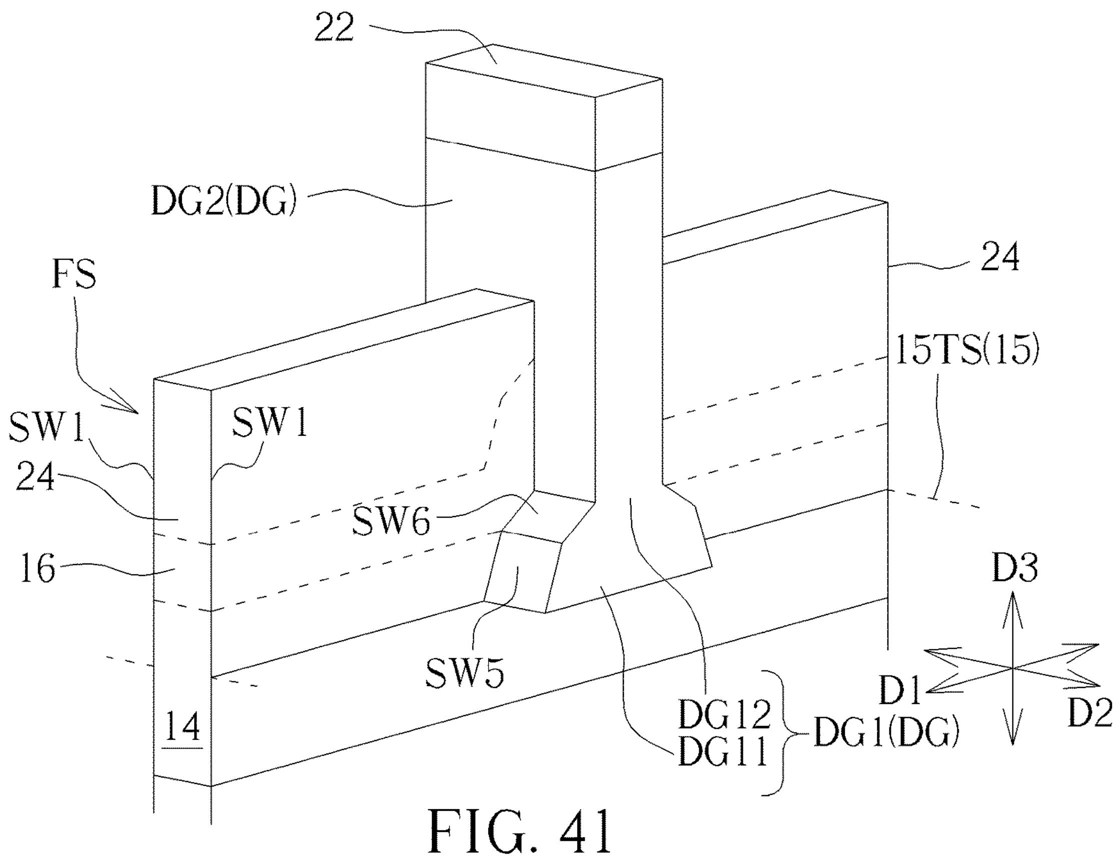

FIG. 40 and FIG. 41 are stereoscopic schematic drawings illustrating a manufacturing method of the semiconductor device 108 according to the eighth embodiment of the present invention, wherein FIG. 41 is a stereoscopic schematic drawing in a step subsequent to FIG. 40, and FIG. 39 may be regarded as a cross-sectional schematic drawing in a step subsequent to FIG. 41. As illustrated in FIG. 40, after the step of forming the isolation structure 15, the top surface 15TS of the isolation structure 15 may be lower than the top surface of the first doped region 14 in the fin-shaped structure FS. The shape of the patterned material layer 20P including the first portion 20A, the second portion 20B, and the fifth portion 20E in this embodiment may be similar to that of the patterned material layer 20P represented in FIG. 34 described above, but the second portion 20B in this embodiment may be relatively thicker for covering the side surface of the intermediate region 16 and a part of the side surface of the first doped region 14 in the second direction D2 during the doping process 92 for forming the second doped region 24. As illustrated in FIG. 40 and FIG. 41, after the step of forming the second doped region 24, an etching process may be performed to the patterned material layer 20P, and the patterned material layer 20P may be etched to be the dummy gate DG including the first portion DG1 and the second portion DG2 by the etching process. As illustrated in FIG. 41 and FIG. 39, the spacer structure 26, the source/drain structure 30, the source/drain region 28, and the dielectric layer 32 may be formed after the step of forming the dummy gate DG, and the dummy gate DG may then be replaced with the gate structure GS by a RMG process for forming the semiconductor device 108.

It is worth noting that the manufacturing method of the semiconductor device 108 is not limited to the approach described above and other suitable approaches may also be applied in the manufacturing method of the semiconductor device 108 according to the present invention.

Figure 42:
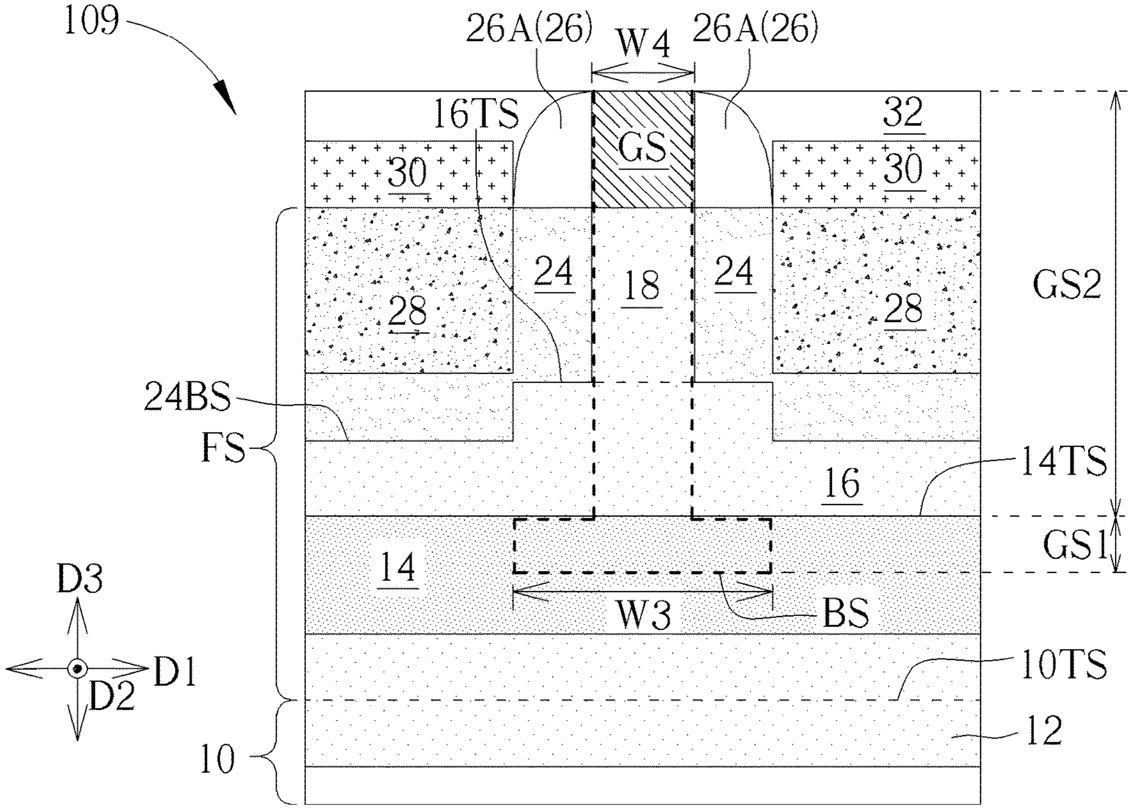
FIG. 42 is a cross-sectional schematic drawing illustrating a semiconductor device according to a ninth embodiment of the present invention.

FIG. 42 is a cross-sectional schematic drawing illustrating a semiconductor device 109 according to a ninth embodiment of the present invention. As illustrated in FIG. 42, in the semiconductor device 109, the bottom surface BS of the gate structure GS may be lower than the top surface 14TS of the first doped region 14 in the third direction D3, and the gate structure GS may cover a part of the side surface of the intermediate region 16 and a part of the side surface of the first doped region 14 in the second direction D2 for ensuring that the intermediate region 16 located between the channel region 18 and the first doped region 14 in the third direction D3 is covered by the gate structure GS in the second direction D2. In some embodiments, a part of the side surface of the first doped region 14 may be covered by the first portion GS1 of the gate structure GS in the second direction D2, and a part of the side surface of the intermediate region 16 may be covered by the second portion GS2 of the gate structure GS in the second direction D2, but not limited thereto. The width W3 of the first portion GS1 of the gate structure GS is greater than the width W4 of the second portion GS2 of the gate structure GS, and the gate width may be sharply increased from the interface between the second portion GS2 and the first portion GS1 to the first portion GS1. The electrical characteristics of the semiconductor device 109 may be improved by the gate structure GS including the first portion GS1 and the second portion GS2 described above and the intermediate region 16 separating the first doped region 14 and the second doped region 24.

Figure 43:
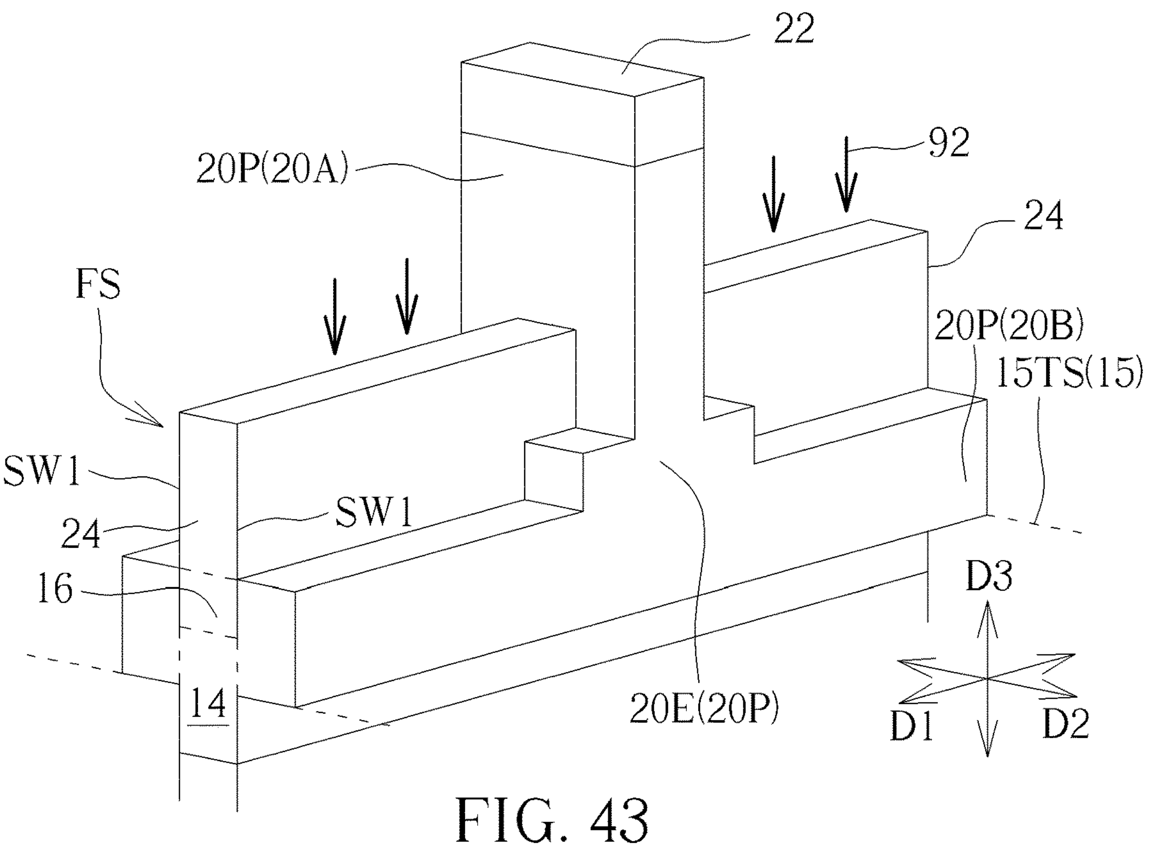
Figure 44:
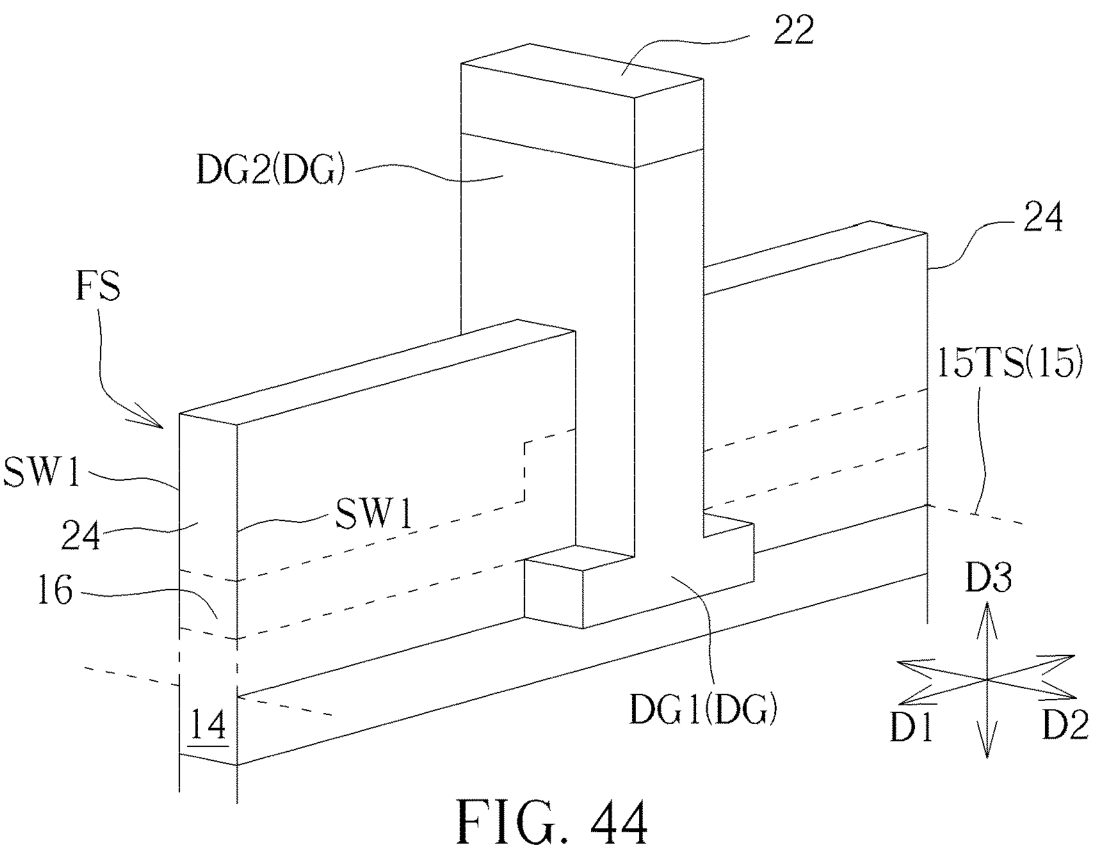

FIG. 43 and FIG. 44 are stereoscopic schematic drawings illustrating a manufacturing method of the semiconductor device 109 according to the ninth embodiment of the present invention, wherein FIG. 44 is a stereoscopic schematic drawing in a step subsequent to FIG. 43, and FIG. 42 may be regarded as a cross-sectional schematic drawing in a step subsequent to FIG. 44. As illustrated in FIG. 43, after the step of forming the isolation structure 15, the top surface 15TS of the isolation structure 15 may be lower than the top surface of the first doped region 14 in the fin-shaped structure FS. The shape of the patterned material layer 20P including the first portion 20A, the second portion 20B, and the fifth portion 20E in this embodiment may be similar to that of the patterned material layer 20P represented in FIG. 37 described above, but the second portion 20B in this embodiment may be relatively thicker for covering the side surface of the intermediate region 16 and a part of the side surface of the first doped region 14 in the second direction D2 during the doping process 92 for forming the second doped region 24. As illustrated in FIG. 43 and FIG. 44, after the step of forming the second doped region 24, an etching process may be performed to the patterned material layer 20P, and the patterned material layer 20P may be etched to be the dummy gate DG including the first portion DG1 and the second portion DG2 by the etching process. As illustrated in FIG. 44 and FIG. 42, the spacer structure 26, the source/drain structure 30, the source/drain region 28, and the dielectric layer 32 may be formed after the step of forming the dummy gate DG, and the dummy gate DG may then be replaced with the gate structure GS by a RMG process for forming the semiconductor device 109.

It is worth noting that the manufacturing method of the semiconductor device 109 is not limited to the approach described above and other suitable approaches may also be applied in the manufacturing method of the semiconductor device 109 according to the present invention.

Figure 45:
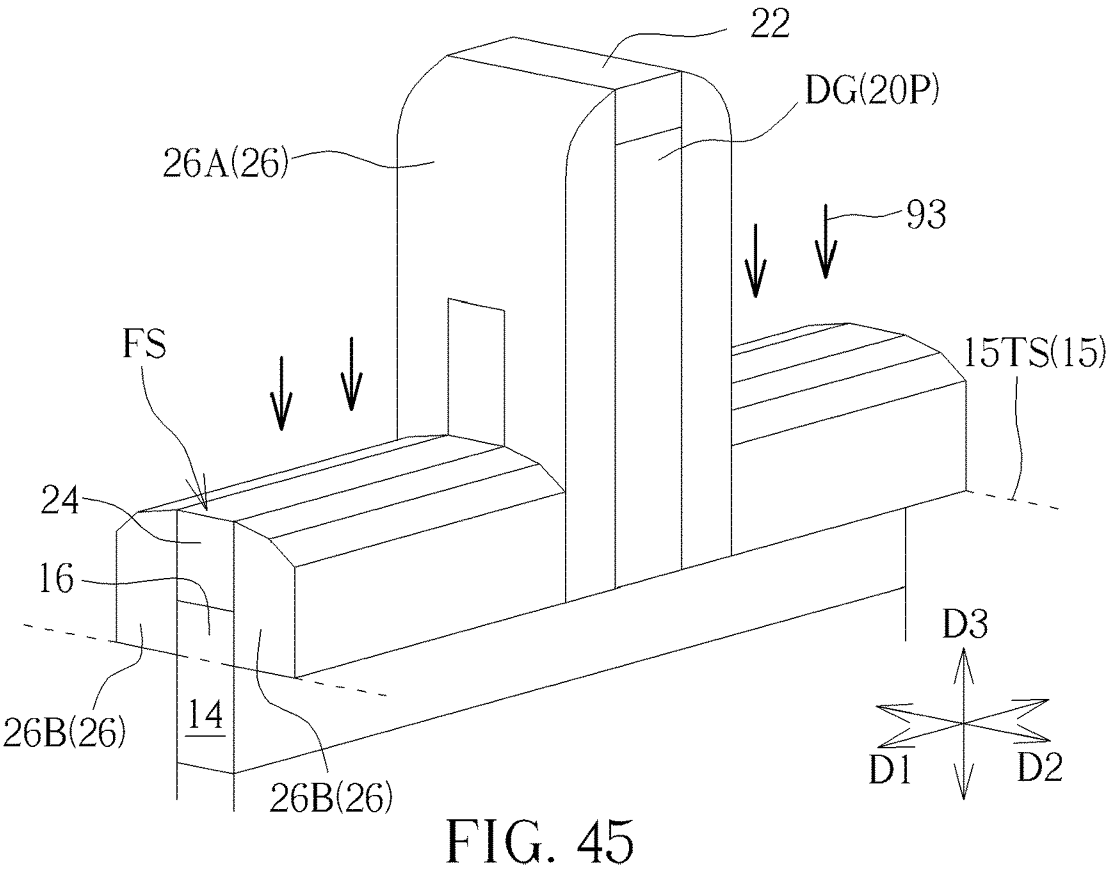
Figure 46:
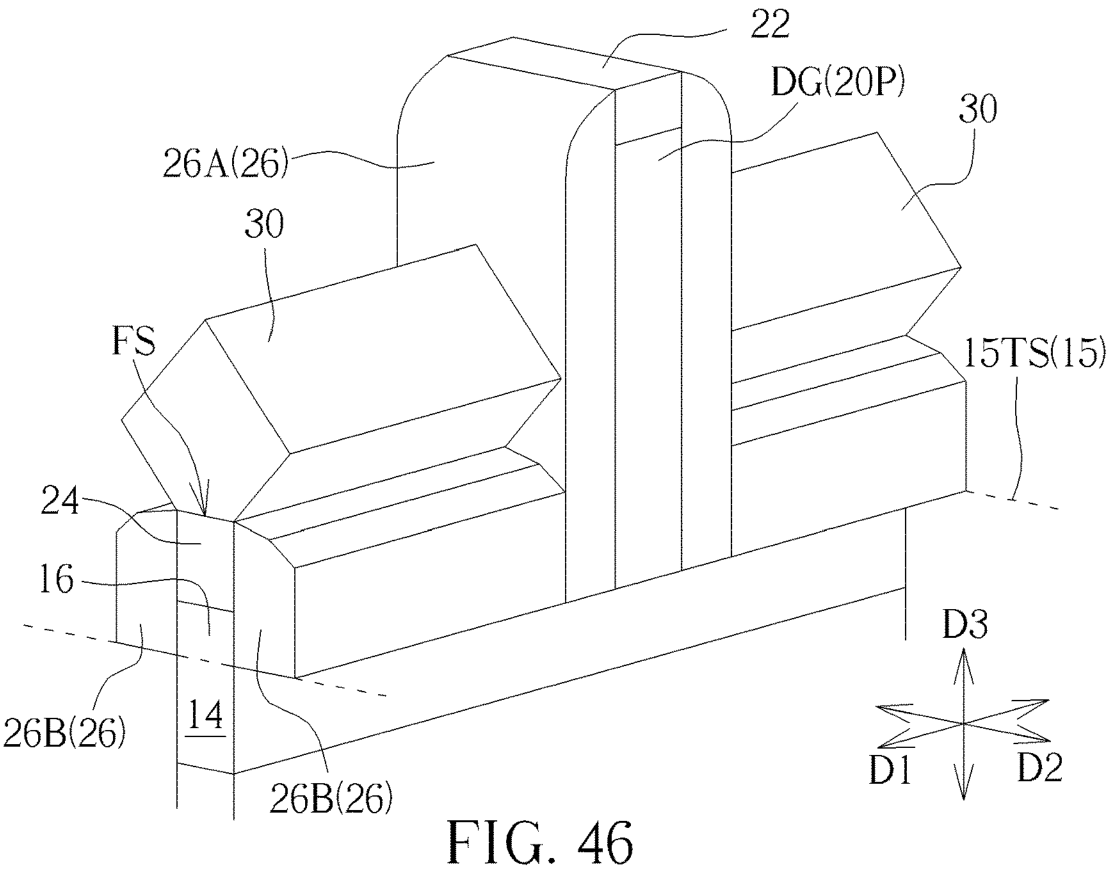

FIG. 45 and FIG. 46 are stereoscopic schematic drawings illustrating a manufacturing method of a semiconductor device according to a tenth embodiment of the present invention, wherein FIG. 46 is a stereoscopic schematic drawing in a step subsequent to FIG. 45, and FIG. 45 may be regarded as a stereoscopic schematic drawing in a step subsequent to FIG. 8. As illustrated in FIG. 8 and FIG. 45, in some embodiments, after the step of etching back the second portion 26B of the spacer structure 26 and exposing an upper portion of the fin-shaped structure FS, the exposed portion of fin-shaped structure FS (such as an upper portion of the second doped region 24) may be removed by an etching process 93. Subsequently, as illustrated in FIGS. 45 and 46, the source/drain structure 30 may be formed on the fin-shaped structure FS by an epitaxial growth process or other suitable approaches. It is worth noting that the method of removing a part of the fin-shaped structure FS before the step of forming the source/drain structure 30 may also be applied in other embodiments of the present invention (such as the embodiments described above). The etching process 93 may include a dry etching process or a wet etching process. In the structure illustrated in FIG. 46, the source/drain structure 30 can push or pull the channel region 18 laterally. So, removing a part of the fin-shaped structure FS before the step of forming the source/drain structure 30 may increase source/drain current of fin-FET, because lateral stress in the channel region 18 may increase. Moreover, in the structure illustrated in FIG. 46, the source/drain structure 30 with heavy impurity concentration is disposed closer to the bottom surface of the second doped region 24 than other embodiments. So, the impurities of the source/drain structure 30 may diffuse downward beyond the bottom surface of the second doped region 24 in the third direction D3. Even in this case, the merits of other embodiments of the present invention are still effective if a portion of the second doped region 24 covered by the first portion 26A of the spacer structure 26 is separated from the first doped region 14.

Figure 47:
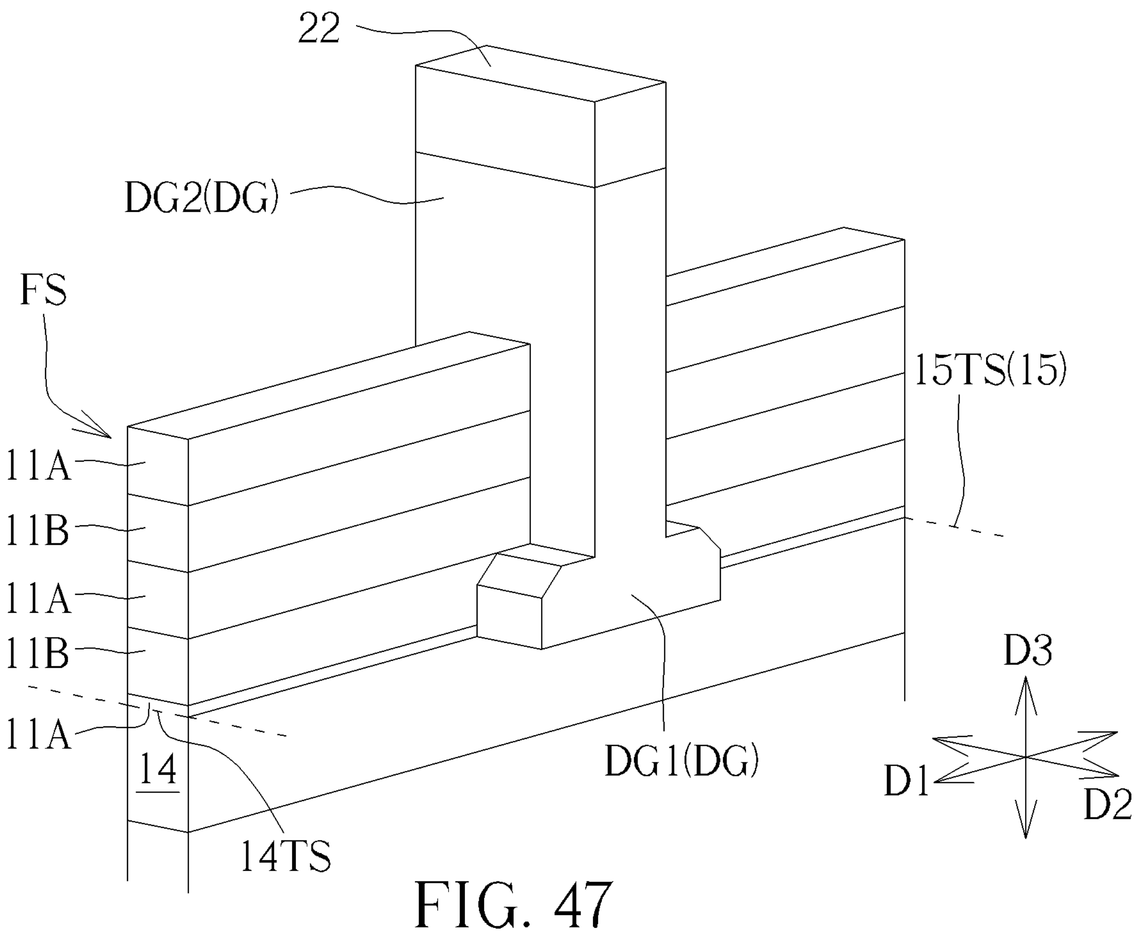
FIG. 47 is a stereoscopic schematic drawing illustrating a manufacturing method of a semiconductor device according to an eleventh embodiment of the present invention.

FIG. 47 is a stereoscopic schematic drawing illustrating a manufacturing method of a semiconductor device according to an eleventh embodiment of the present invention. As illustrated in FIG. 47, in some embodiments, the fin-shaped structure FS may include a plurality of first layers 11A and a plurality of second layers 11B alternately stacked in the third direction D3. The material composition of each of the first layers 11A may be different from the material composition of each of the second layers 11B. For example, the first layer 11A may be a silicon layer, and the second layer 11B may be a silicon germanium layer, but not limited thereto. In some embodiments, the dummy gate DG may be formed straddling the fin-shaped structure FS including the first layers 11A and the second layers 11B alternately stacked, and the second doped region and/or the source/drain region described above may be formed in the first layer 11A and/or the second layer 11B of the fin-shaped structure FS, but not limited thereto. In some embodiments, a portion of the second layers 11B covered by the dummy gate DG may be removed after the step of removing the dummy gate DG and before the step of forming the gate structure described above, and the gate structure may surround a part of each of the first layers 11A for forming a gate-all-around (GAA) transistor, but not limited thereto. It is worth noting that the fin-shaped structure FS including the first layers 11A and the second layers 11B alternately stacked may also be applied in other embodiments of the present invention (such as the embodiments described above). In the gate-all-around transistor (GAA), the short channel effect (SCE) can be suppressed because channels made of the first layers 11A are surrounded by the gate structure. In the structure illustrated in FIG. 47, the top surface 14TS of the first doped region 14 is disposed higher than or coplanar with a top surface 15TS of the isolation structure 15. So, the second doped region 24 may be formed in a top portion of the first doped region 14 and may increase the leakage current and/or the capacitance, if structures explained in embodiments of the present invention are not applied. So, even in the case of the gate-all-around transistor (GAA), the merits of other embodiments of the present invention are still effective.

To summarize the above descriptions, according to the semiconductor device and the manufacturing method thereof in the present invention, the leakage current and/or the capacitance between the first doped region and the second doped region within the fin-shaped structure may be reduced by separating the first doped region from the second doped region, modifying the area of fin-shaped structure covered by the gate structure straddling the fin-shaped structure, and/or enlarging the bottom portion of the gate structure for improving the electrical characteristics of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:

forming a fin-shaped structure on a semiconductor substrate, wherein the fin-shaped structure extends upwards from a top surface of the semiconductor substrate in a vertical direction, and at least a part of a first doped region is located in the fin-shaped structure;

forming a second doped region in the fin-shaped structure, wherein the second doped region is located above the first doped region in the vertical direction, and the second doped region is separated from the first doped region by an intermediate region located in the fin-shaped structure; and forming a gate structure straddling a part of the fin-shaped structure, wherein a bottom surface of the gate structure is lower than or coplanar with a top surface of the first doped region in the vertical direction, and a method of forming the gate structure comprises:

forming a dummy gate straddling the fin-shaped structure; and replacing the dummy gate with the gate structure, wherein a method of forming the dummy gate comprises:

forming a patterned material layer on the semiconductor substrate after the step of forming the fin-shaped structure; and performing an etching process to the patterned material layer, wherein the patterned material layer is etched to be the dummy gate by the etching process, and the patterned material layer comprises:

a first portion disposed straddling the fin-shaped structure; and a second portion covering a part of a sidewall of the fin-shaped structure, wherein the second portion of the patterned material layer is removed by the etching process, and the second doped region is formed after the step of forming the patterned material layer and before the second portion of the patterned material layer is removed.

2. The manufacturing method of the semiconductor device according to claim 1, wherein the dummy gate covers a part of a side surface of the intermediate region in a horizontal direction.

3. The manufacturing method of the semiconductor device according to claim 2, wherein the dummy gate further covers a part of a side surface of the first doped region in the horizontal direction.

4. The manufacturing method of the semiconductor device according to claim 1, wherein the dummy gate comprises:

a first portion; and a second portion disposed on the first portion of the dummy gate, wherein a width of the first portion of the dummy gate is greater than a width of the second portion of the dummy gate.

5. The manufacturing method of the semiconductor device according to claim 4, wherein the first portion of the dummy gate comprises:

a lower part; and an upper part, wherein a slope of a sidewall of the lower part is different from a slope of a sidewall of the upper part.

6. The manufacturing method of the semiconductor device according to claim 1, wherein a conductivity type of the second doped region is complementary to a conductivity type of the first doped region.

7. The manufacturing method of the semiconductor device according to claim 6, wherein a conductivity type of the intermediate region is identical to the conductivity type of the first doped region, and an impurity concentration in the first doped region is higher than an impurity concentration in the intermediate region.

8. The manufacturing method of the semiconductor device according to claim 1, wherein the fin-shaped structure comprises:

a first portion; and a second portion disposed on the first portion of the fin-shaped structure, wherein a width of the first portion of the fin-shaped structure is greater than a width of the second portion of the fin-shaped structure.

9. The manufacturing method of the semiconductor device according to claim 8, wherein the fin-shaped structure further comprises:

a third portion disposed between the first portion of the fin-shaped structure and the second portion of the fin-shaped structure in the vertical direction, wherein a slope of a sidewall of the second portion of the fin-shaped structure is greater than a slope of the sidewall of the third portion of the fin-shaped structure.

10. The manufacturing method of the semiconductor device according to claim 9, wherein the gate structure covers a part of the sidewall of the third portion of the fin-shaped structure in a horizontal direction.

11. A manufacturing method of a semiconductor device, comprising:

forming a fin-shaped structure on a semiconductor substrate, wherein the fin-shaped structure extends upwards from a top surface of the semiconductor substrate in a vertical direction, and at least a part of a first doped region is located in the fin-shaped structure;

forming a second doped region in the fin-shaped structure, wherein the second doped region is located above the first doped region in the vertical direction, and the second doped region is separated from the first doped region by an intermediate region located in the fin-shaped structure; and forming a gate structure straddling a part of the fin-shaped structure, wherein a bottom surface of the gate structure is lower than or coplanar with a top surface of the first doped region in the vertical direction, and a method of forming the gate structure comprises:

forming a dummy gate straddling the fin-shaped structure; and replacing the dummy gate with the gate structure, wherein the dummy gate comprises:

a first portion; and a second portion disposed on the first portion, wherein a width of the first portion of the dummy gate is greater than a width of the second portion of the dummy gate, and the first portion of the dummy gate comprises:

a lower part; and an upper part, wherein a slope of a sidewall of the lower part is different from a slope of a sidewall of the upper part.

12. The manufacturing method of the semiconductor device according to claim 11, wherein a method of forming the dummy gate comprises:

forming a patterned material layer on the semiconductor substrate after the step of forming the fin-shaped structure; and performing an etching process to the patterned material layer, wherein the patterned material layer is etched to be the dummy gate by the etching process.

13. The manufacturing method of the semiconductor device according to claim 12, wherein the patterned material layer comprises:

a first portion disposed straddling the fin-shaped structure; and a second portion covering a part of a sidewall of the fin-shaped structure, wherein the second portion of the patterned material layer is removed by the etching process, and the second doped region is formed after the step of forming the patterned material layer and before the second portion of the patterned material layer is removed.

14. The manufacturing method of the semiconductor device according to claim 11, wherein the dummy gate covers a part of a side surface of the intermediate region in a horizontal direction.

15. The manufacturing method of the semiconductor device according to claim 14, wherein the dummy gate further covers a part of a side surface of the first doped region in the horizontal direction.

16. The manufacturing method of the semiconductor device according to claim 11, wherein a conductivity type of the second doped region is complementary to a conductivity type of the first doped region.

17. The manufacturing method of the semiconductor device according to claim 16, wherein a conductivity type of the intermediate region is identical to the conductivity type of the first doped region, and an impurity concentration in the first doped region is higher than an impurity concentration in the intermediate region.

18. The manufacturing method of the semiconductor device according to claim 11, wherein the slope of the sidewall of the lower part is greater than the slope of the sidewall of the upper part.

19. The manufacturing method of the semiconductor device according to claim 11, wherein a topmost surface of the intermediate region is higher than a bottommost surface of the second doped region in the vertical direction.

20. The manufacturing method of the semiconductor device according to claim 11, wherein the first portion of the dummy gate is lower than a top surface of the intermediate region in the vertical direction.

* * * * *